(12) United States Patent  
Yamamoto et al.

(10) Patent No.: US 6,800,720 B2
(45) Date of Patent: Oct. 5, 2004

(54) HYDROGENATED RING-OPENING METATHESIS COPOLYMER AND PROCESS FOR PRODUCING THE SAME

(75) Inventors: Yoshihiro Yamamoto, Chiba (JP); Tadahiro Sunaga, Chiba (JP); Tetsuya Hamada, Chiba (JP); Keiichi Ikeda, Chiba (JP); Ritsuko Shibahara, Chiba (JP); Hirofumi Io, Chiba (JP); Takashi Ochiai, Chiba (JP)

(73) Assignee: Mitsui Chemicals, Inc., Tokyo (JP)

( * ) Notice: Subject to any disclaimer, the term of this patent is extended or adjusted under 35 U.S.C. 154(b) by 343 days.

(21) Appl. No.: 10/009,565

(22) PCT Filed: Apr. 12, 2001

(86) PCT No.: PCT/JP01/03139

§ 371 (c)(1), (2), (4) Date: Mar. 28, 2002

(87) PCT Pub. No.: WO01/79324

PCT Pub. Date: Oct. 25, 2001

(65) Prior Publication Data

US 2002/0165328 A1 Nov. 7, 2002

(30) Foreign Application Priority Data

Apr. 13, 2000 (JP) .................................... 2000-111646

(51) Int. Cl.$^7$ ............................................. C08G 65/02
(52) U.S. Cl. .................. 528/403; 528/409; 528/410; 528/412; 528/415; 528/419; 528/485; 528/487; 525/7.1
(58) Field of Search .................. 528/403, 409, 528/410, 412, 415, 419, 485, 487

(56) References Cited

FOREIGN PATENT DOCUMENTS

| JP | 11-171982 | 6/1999 |
| JP | 11-327144 | 11/1999 |

Primary Examiner—Samuel A. Acquah
(74) Attorney, Agent, or Firm—Burns, Doane, Swecker & Mathis, LLP

(57) ABSTRACT

A hydrogenated ring-opening metathesis polymer which contains at least a structural unit [B] of the following general formula [3] and/or a structural unit [C] of the following general formula [4]:

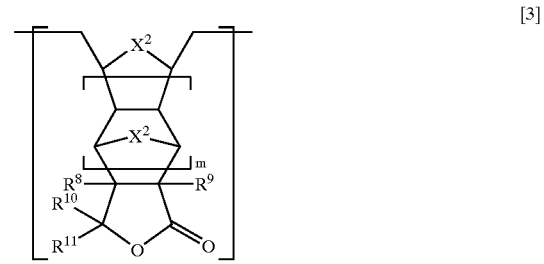

[3]

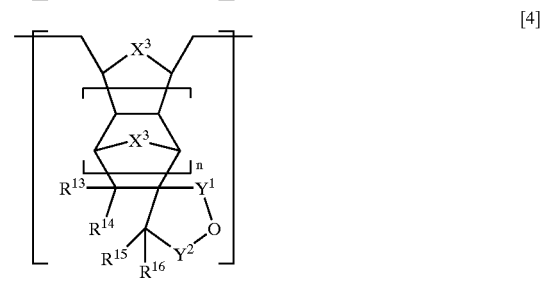

[4]

wherein, $R^8$ to $R^{11}$ and $R^{13}$ to $R^{16}$ each independently represent a hydrogen atom or a linear, branched or cyclic alkyl group having 1 to 10 carbon atoms, and $X^2$s and $X^3$s are the same or different and represent —O— or —$CR^{12}_2$— wherein, $R^{12}$ represents a hydrogen atom or a linear or branched alkyl group having 1 to 10 carbon atoms). One of $Y^1$ and $Y^2$ represents —(C=O)— and the other of $Y^1$ and $Y^2$ represents —$CR^{18}_2$— wherein, $R^{18}$ represents a hydrogen atom or a linear or branched alkyl group having 1 to 10 carbon atoms and m and n represent an integer of 0 or 1 to 3.

25 Claims, 1 Drawing Sheet

HYDROGENATED RING-OPENING METATHESIS COPOLYMER AND PROCESS FOR PRODUCING THE SAME

TECHNICAL FIELD

The present invention relates to a novel hydrogenated ring-opening metathesis polymer, more particularly, relates to a hydrogenated ring-opening metathesis polymer suitable for a base polymer of a photoresist used in fine working of a semiconductor using ultraviolet ray and far ultraviolet ray (including excimer laser and the like), excellent in heat resistance, thermal decomposition resistance, light transmittance and the like, and a method of producing the polymer hydrogen-added material.

BACKGROUND ART

With the recent increase of integration level in integrated circuits on semiconductor devices, and large-scale integrated circuits (LSI) and very-large-scale integrated circuits (VLSI) have been put to practical use, and additionally, the minimum lithographic pattern in an integrated circuit would be reaching in submicron feature, in future there is a tendency of further microlithographic. Formation of a microlithographic pattern essentially requires use of a lithographic technology in which a treated substrate on which a thin film is formed is coated with a resist material, selective exposure is effected to form a latent image of a desired pattern, then, development is conducted to form a resist pattern which is used as a mask in dry etching, then, the resist material is removed to obtain a desired pattern.

As the exposure light source used in this lithographic technology, ultraviolet lights such as g ray (wavelength: 436 nm) and i ray (wavelength: 365 nm) have been utilized, with the progress of the fine lithographic pattern, and exposure light having a shorter wavelength such as far ultraviolet ray, vacuum ultraviolet ray, electron beam (EB), X ray and the like have become popular to use as a light source. Particularly recently, excimer lasers (KrF laser having a wavelength of 248 nm, ArF laser having a wavelength of 193 nm) have received attention as an exposure light source, and are expected to be effective in formation of a fine lithographic pattern.

As polymers or copolymers used in a resist material forming a sub-micron pattern using exposure light in a region of vacuum ultraviolet ray manifesting shorter wavelengths, there have been suggested a lot of polymers and copolymers such as, for example, polymers or copolymers of a substituted acrylates or acrylates having an acid cleavable protecting group and an adamantane skeleton at an ester portion (see JP-A No. 4-39665), polymers or copolymers of a substituted acrylates or acrylates having an acid cleavable protecting group and a norbornane skeleton at an ester portion (see JP-A No. 5-257281), polymers or copolymers of cyclohexyl maleimide (see JP-A No. 5-257285), polymer compounds containing in the main chain a cellulose skeleton which is cleaved by the action of an acid (see JP-A No. 6-342212), polyvinyl alcohol or its derivatives (see JP-A No. 7-333850), and the like.

However, there is no polymer or copolymer yet which satisfies all of various properties necessary for use as a resist material such as dry etching resistance, transparency for far ultraviolet ray, solubility in resist solvent, wettability to a developer, adhesion to a substrate of silicon and the like, solubility in a releasing agent, and the like, and can be synthesized easily, requiring further developments.

On the other hand, cyclic polymers as found in photoresist compositions comprising a polymer compound having a cyclic skeleton which contains an alicyclic hydrocarbon as the main chain and has a pendant acid cleavable group (WO97/33198, JP-A Nos. 09-230595, 09-244247, 10-254139) have problems such as poor solubility in a resist solvent at high concentration, poor wettability to a developer, poor adhesion to a silicon substrate and the like, though these cyclic polymers are excellent in dry etching resistance and excellent in transparency to far ultraviolet ray.

DISCLOSURE OF THE INVENTION

An object of the present invention is to provide a hydrogenated ring-opening metathesis polymer which satisfies above-mentioned various properties necessary for use as a base polymer for a resist material, more particularly, all of various properties necessary for use as a base polymer for a resist material in a positive photoresist composition which is excellent in light transparency and the like, has high sensitivity and high resolution and has high affinity to an alkali developer, and provides an excellent pattern, to be used for fine working of a semiconductor using ultraviolet ray and far ultraviolet ray (including excimer laser and the like), and which further have a narrower molecular weight distribution, and to provide a method of producing such a polymer hydrogen-added material.

The present inventors have studied variously for solving the above-mentioned problems and intensively investigated a possibility of use of a hydrogenated ring-opening metathesis polymer of a cyclic olefin-based monomer as a base polymer for a resist material having excellent optical property, electric property, rigidity, heat resistance, adhesion to a substrate, and weather resistance, and resultantly found that a novel hydrogenated ring-opening metathesis polymer having a specific structural unit, namely, a structural unit which has an alicyclic compound as the main chain and contains an oxygen atom in a part of the cyclic structure thereof satisfies these various abilities as a resist material, leading to completion of the invention.

Namely, the present invention provides a hydrogenated ring-opening metathesis polymer which contains, if necessary, a structural unit [A] of the following general formula [1]:

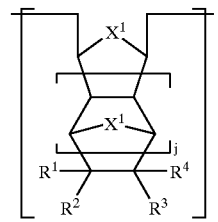

[1]

[wherein, at least one of $R^1$ to $R^4$ represents a functional group having a tertiary ester group of a cyclic alkyl of the following general formula [2]:

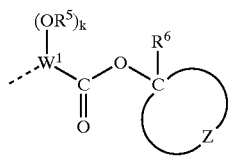

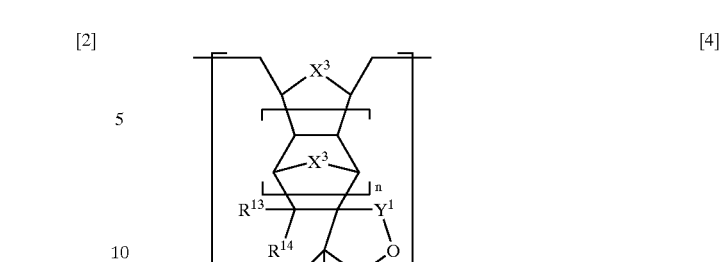

(wherein, the chain fine represents a connecting means. $R^5$ represents a hydrogen atom, a linear, branched or cyclic alkyl group having 1 to 10 carbon atoms, a linear, branched or cyclic alkoxylalkyl group having 2 to 10 carbon atoms, or a linear, branched or cyclic acyl group having 1 to 10 carbon atoms. $R^6$ represents a linear, branched or cyclic alkyl group having 1 to 10 carbon atoms. $W^1$ represents a single bond or a (k+2)-valent hydrocarbon group having 1 to 10 carbon atoms. Z represents a divalent hydrocarbon group having 2 to 15 carbon atoms, and forums a single ring or a cross-linked ring together with carbon atoms to be bonded. k represents 0 or 1.) and the remaining groups of $R^1$ to $R^4$ are selected each independently from a hydrogen atom, linear, branched or cyclic alkyl groups having 1 to 20 carbon atoms, halogens, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 6 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, end $X^1$s may be the same or different and represent —O— or —$CR^7{}_2$— (wherein, $R^7$ represents a hydrogen atom ore linear or branched alkyl group having 1 to 10 carbon atoms.). j represents an integer of 0 or 1 to 3.], and contains at least a structural unit [B] of the following general formula [3]:

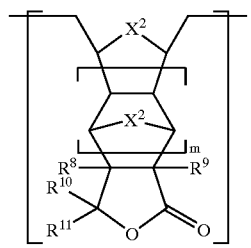

[wherein, $R^8$ to $R^{11}$ each independently represent a hydrogen atom or a linear, branched or cyclic alkyl group having 1 to 10 carbon atoms, and $X^2$s may be the same or different and represent —O— or —$CR^{12}{}_2$— (wherein, $R^{12}$ represents a hydrogen atom or a linear or branched alkyl group having 1 to 10 carbon atoms.). m represents an integer of 0 or 1 to 3.], and/or a structural unit [C] of the following general formula [4]:

[wherein, $R^{13}$ to $R^{16}$ each independently represent a hydrogen atom or a linear, branched or cyclic alkyl group having 1 to 10 carbon atoms, and $X^3$s may be the same or different and represent —O— or —$CR^{17}{}_2$— (wherein, $R^{17}$ represents a hydrogen atom or a linear or branched alkyl group having 1 to 10 carbon atoms.). One of $Y^1$ and $Y^2$ represents —(C=O)— and the other of $Y^1$ and $Y^2$ represents —$CR^{18}{}_2$— (wherein, $R^{18}$ represents a hydrogen atom or a linear or branched alkyl group having 1 to 10 carbon atoms.). n represents an integer of 0 or 1 to 3.], wherein at least one of $X^1$ in the structural unit [A] of the general formula [1], $X^2$ in the structural unit [B] of the general formula [3] and $X^3$ in the structural unit [C] of the general formula [4] represents —O—, and the molar ratio of [A]/([B] and [C]) is 0/100 to 99/1, and the ratio of the weight-average molecular weight Mw to the number-average molecular weight Mn (Mw/Mn) is 1.0 to 2.0.

Further, the present invention provides a method of producing a hydrogenated ring-opening metathesis polymer according to claim 1, comprising using, if necessary, a cyclic olefin monomer of the following general formula [9]:

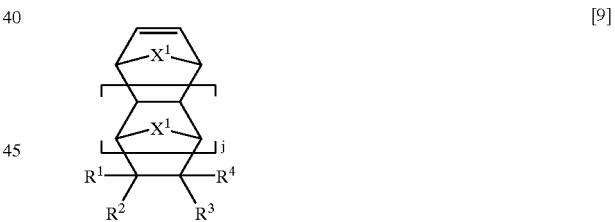

(wherein, $R^1$ to $R^4$, $X^1$ and j are as defined above.) and, at least a cyclic olefin monomer of the following general formula [10]:

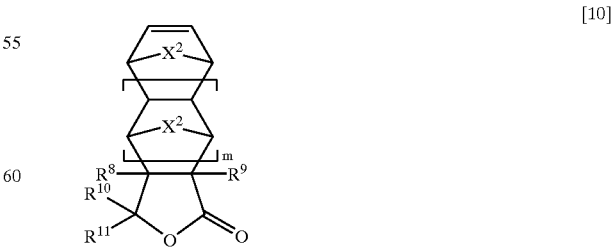

(wherein, $R^8$ to $R^{11}$, $X^2$ and m are as defined above.) and/or a cyclic olefin monomer of the following general formula [11]:

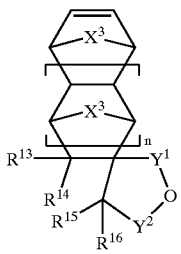

[11]

(wherein, $R^{13}$ to $R^{16}$, $X^3$, $Y^1$, $Y^2$ and n are as defined above.), wherein at least one of $X^1$ in the general formula [9], $X^2$ in the general formula [10] and $X^3$ in the general formula [11] represents —O—, and polymerizing these monomers with a ring-opening metathesis catalyst, and hydrogenating the resulted polymer in the presence of a hydrogenation catalyst.

BEST MODES FOR CARRYING OUT THE INVENTION

Figure 1:
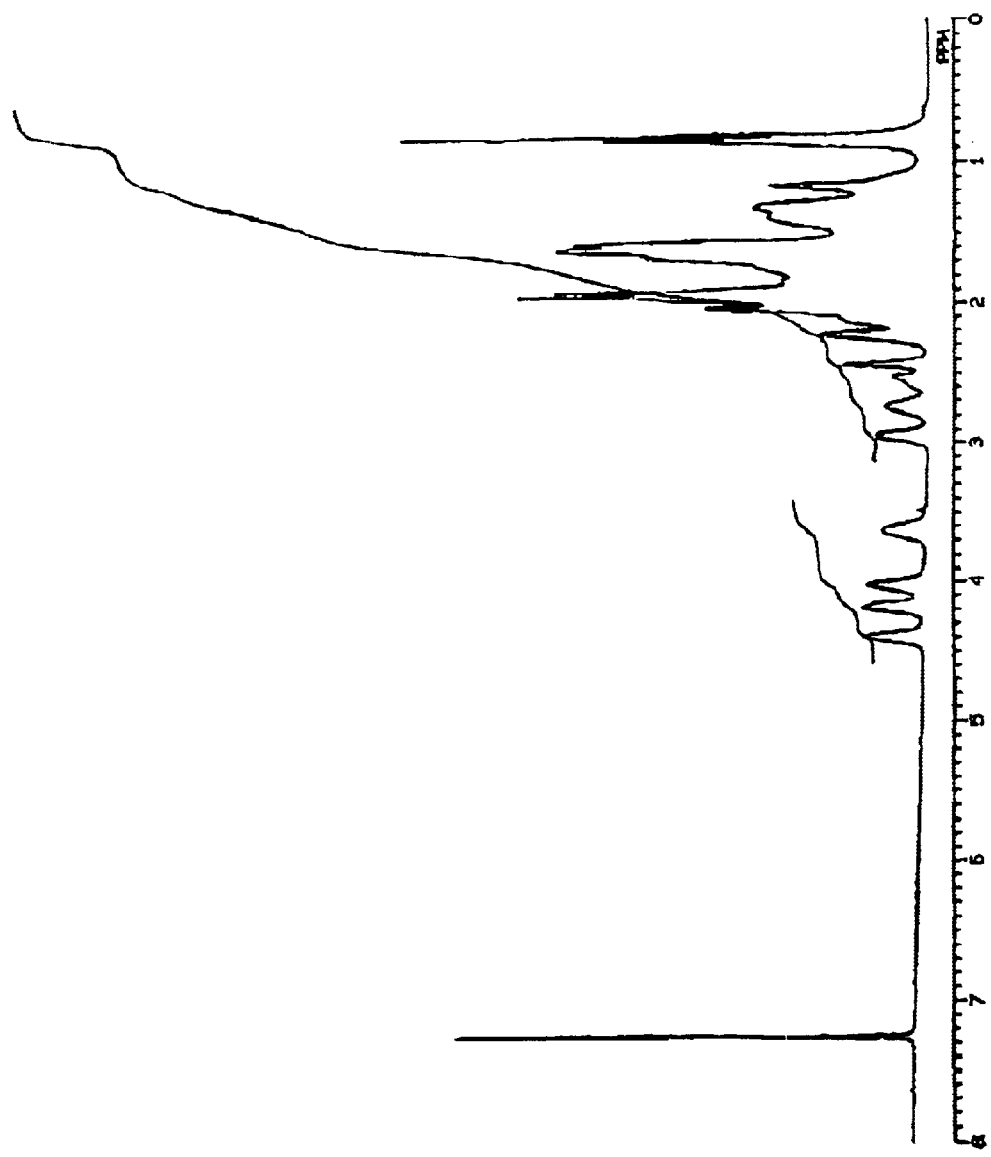
FIG. 1 shows a 1H-NMR spectrum (270 MHz, solvent is deuterated chloroform) of a hydrogenated ring-opening metathesis polymer obtained in Example 1.

In the general formula [1] in the present invention, at least one of $R^1$ to $R^4$ represents a functional group having a tertiary ester group of a cyclic alkyl of the following general formula [2]:

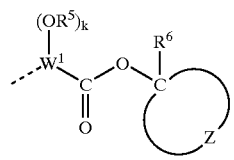

[2]

(wherein, the chain line represents a connecting means. $R^5$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms. $R^6$ represents a linear, branched or cyclic alkyl group having 1 to 10 carbon atoms. $W^1$ represents a single bond or a (k+2)-valent hydrocarbon group having 1 to 10 carbon atoms. Z represents a divalent hydrocarbon group having 2 to 15 carbon atoms, and forms a single ring or a cross-linked ring together with carbon atoms to be bonded. k represents 0 or 1.)

Regarding $R^5$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, 1-ethylcyclopentyl, 1-ethylcyclohexyl and the like, examples of the linear, branched or cyclic alkoxyalkyl group having 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like, and examples of the linear, branched or cyclic acyl group having 1 to 10 carbon atoms include formyl, acetyl, pivaloyl, cyclohexylcarbonyl and the like. Among these groups $R^5$, linear or branched alkyl groups having 1 to 6 carbon atoms, linear, branched or cyclic alkoxyalkyl groups having 2 to 7 carbon atoms and linear or branched acyl groups having 2 to 7 carbon atoms are preferable, and particularly, a hydrogen atom, methyl, ethyl, methoxymethyl, 1-ethoxyethyl, tetrahydrofuran-2-yl and acetyl are preferable.

Regarding $R^6$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, cyclooctyl, norbornyl, 1-methylcyclopentyl, 1-ethylcyclopentyl, 1-methylcyclohexyl, 1-ethylcyclohexyl, 1-methylnorbornyl, 1-ethylnorbornyl and the like, and among them, methyl, ethyl, propyl, isopropyl, n-butyl, isobutyl, tert-butyl, cyclopentyl, cyclohexyl, norbornyl, 1-ethylcyclopentyl and 1-ethylcyclohexyl are preferable.

Regarding $W^1$, the (k+2)-valent hydrocarbon group having 1 to 10 carbon atoms is a linear, branched or cyclic divalent hydrocarbon group having 1 to 10 carbon atoms when k represents 0, and examples thereof include methylene, di-methylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, 1,4-cyclohexylene and the like. Among them, methylene, ethylidene, ethylene, 1-methylethylene, 2-methylethylene, trimethylene and 2-methyltrimethylene are preferable. When k is 1, those having a connecting means formed by removing one hydrogen atom at any position on the hydrocarbon group as described above when k represents 0, are listed. Most preferably, $W^1$ represents a single bond.

Z represents a divalent hydrocarbon group having 2 to 15 carbon atoms, and forms a single ring or a cross-linked ring together with carbon atoms to be bonded. For example, 1-alkylcycloalkyl groups of the following general formula [13]:

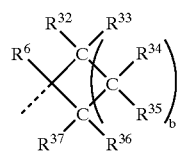

[13]

(where, the chain line represents a connecting means. $R^6$ is as define above. $R^{32}$ to $R^{37}$ each independently represents a hydrogen atom, or a linear, branched or cyclic alkyl group having 1 to 10 carbon atoms. b represents an integer of 0 or 1 to 6, and when b represents 2 to 6, a plurality of $R^{34}$ and $R^{35}$ may the same or different, respectively.), 2-alkylnorbornyl groups of the following general formula [14]:

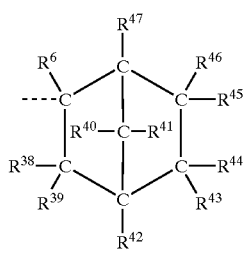

[14]

(wherein, the chain line represents a connecting means. $R^6$ is am define above. $R^{36}$ to $R^{47}$ each independently represents a hydrogen atom, or a linear, branched or cyclic alkyl group having 1 to 10 carbon atoms.), and 2-alkyl-2-adamantyl groups such as 2-methyl-2-adamantyl, 2-ethyl-2-adamantyl and the like, are listed. Specific examples of the general formula [13] include 1-methylcyclopropyl, 1-methylcyclobutyl 1-ethylcyclobutyl, 1-methylcyclopentyl, 1-ethylcyclopentyl, 1-n-propylcyclopentyl, 1-iso-propylcyclopentyl, 1-tert-butylcyclopentyl, 1-cyolopentyl-cyclopentyl, 1-cyclohexylcyclopentyl, 1-norbornylcyclo-pentyl, 1-methylcyclohexyl, 1-ethylcyclohexyl, 1-methylcycloheptyl, 1-ethylcycloheptyl, 1-methylcyclooctyl, 1-methylcyclononyl and the like, and among them, 1-alkykyclopentyls of the chemical formula [15]:

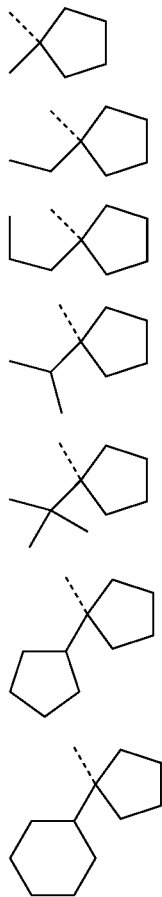

[15-1]

[15-2]

[15-3]

[15-4]

[15-5]

[15-6]

[15-7]

-continued

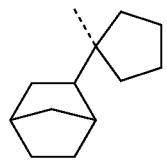

[15-8]

such as 1-methylcyclopentyl, 1-ethylcyclopentyl, 1-n-propylcyclopentyl, 1-iso-propylcyclopentyl, 1-tert-butylcyclopentyl, 1-cyclopentylcyclopentyl, 1-cyclohexylcyclopentyl, 1-norbornylcyclopentyl and the like are preferable, and 1-methylcyclopentyl [15-1] and 1-ethylcyclopentyl [15-2] are more preferable. As the specific example of the general formula [14], 2-alkylnorbornyl groups of the chemical formula [16]:

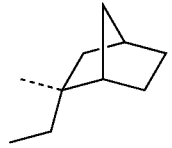

[16-1]

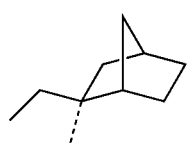

[16-2]

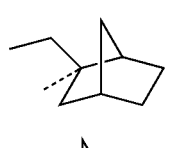

[16-3]

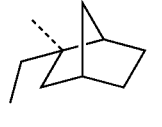

[16-4]

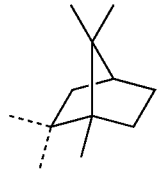

[16-5]

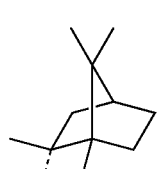

[16-6]

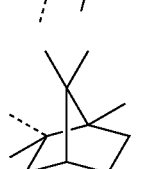

[16-7]

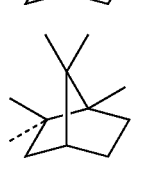

[16-8]

-continued

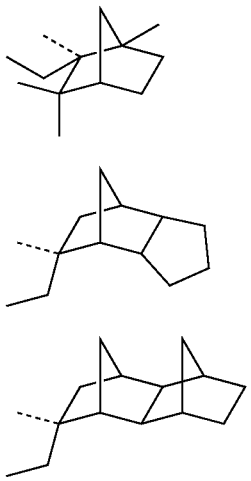

[16-9]

[16-10]

[16-11]

are listed, and among them, groups [16-1], [16-2], [16-3] and [16-4] are preferable.

Regarding the other groups of $R^1$ to $R^4$, a hydrogen atom, linear, branched or cyclic alkyl groups having 1 to 20 carbon atoms such as methyl, ethyl, propyl, isopropyl, n-butyl, tert-butyl, cyclohexyl, menthyl and the like, halogens such as a chlorine atom, bromine atom, iodine atom, fluorine atom and the like, linear, branched or cyclic halogenated alkyl groups having 1 to 20 carbon atoms such as fluoromethyl, chloromethyl, bromomethyl, difluoromethyl, dichloromethyl, dibromomethyl, trifluoromethyl, trichloromethyl, tribromomethyl and the like, linear, branched or cyclic alkoxy groups having 1 to 12 carbon atoms such as methoxy, ethoxy, isopropoxy, n-butoxy, tert-butoxy, menthoxy and the like, linear, branched or cyclic alkoxyalkyl groups having 2 to 20 carbon atoms such as methoxymethyl, methoxyethyl, tert-butoxymethyl, tert-butoxyethyl, menthoxymenthol and the like, or containing alkoxy saccharides such as methylglucose and the like, linear, branched or cyclic alkylcarbonyloxy groups having 2 to 20 carbon atoms such as acetoxy and the like, arylcarbonyloxy groups having 6 to 20 carbon atoms such as naphthoyloxy and the like, alkylsulfonyloxy groups having 1 to 20 carbon atoms such as mesyloxy and the like, arylsulfonyloxy groups having 6 to 20 carbon atoms such as tosyloxy and the like, linear, branched or cyclic alkoxycarbonyl groups having 2 to 20 carbon atoms such as methoxycarbonyl, ethoxycarbonyl, n-propoxycarbonyl, isopropoxycarbonyl, n-butoxycarbonyl, tert-butoxycarbonyl, cyclohexyloxycarbonyl and the like, linear, branched or cyclic alkoxycarbonylalkyl groups having 3 to 20 carbon atoms such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl and the like, are each independently listed as specific examples thereof. Among them, a hydrogen atom, linear, branched or cyclic alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkoxycarbonyl groups having 2 to 20 carbon atoms and linear, branched or cyclic alkoxycarbonylalkyl groups having 3 to 20 carbon atoms are preferable, and a hydrogen atom, linear or branched alkyl groups having 1 to 10 carbon atoms, linear or branched alkoxycarbonyl groups having 2 to 10 carbon atoms and linear or branched alkoxycarbonylalkyl groups having 3 to 10 carbon are more preferable.

$X^1$ represents —O— or —$CR^7_2$— (wherein, $R^7$ represents a hydrogen atom or a linear or branched alkyl group having 1 to 10 carbon atoms.), and when j represents 1 to 3, $X^1$s may be the same or different. Specific examples of $R^7$ include a hydrogen atom, and linear or branched alkyl groups having 1 to 10 carbon atoms such as methyl, ethyl, n-propyl, isopropyl, n-butyl, tert-butyl and the like. $X^1$ represents preferably —O— or —$CH_2$—, and more preferably all of $X^1$s are either —O— or —$CH_2$—. j represents preferably 0 or 1.

Namely, as the specific examples of the general formula [1], structural units [A] of the following chemical formula [17]:

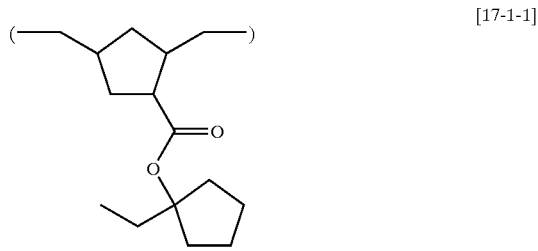

[17-1-1]

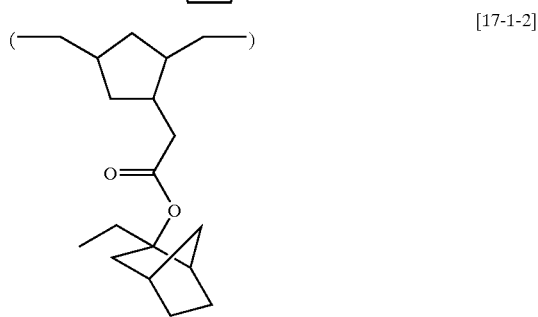

[17-1-2]

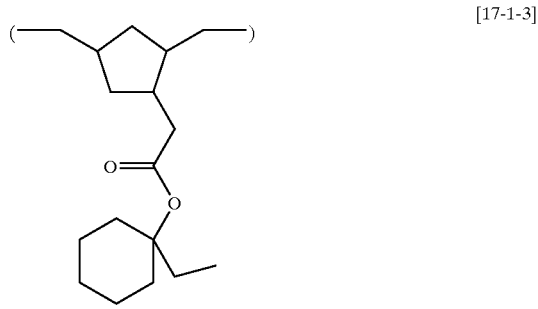

[17-1-3]

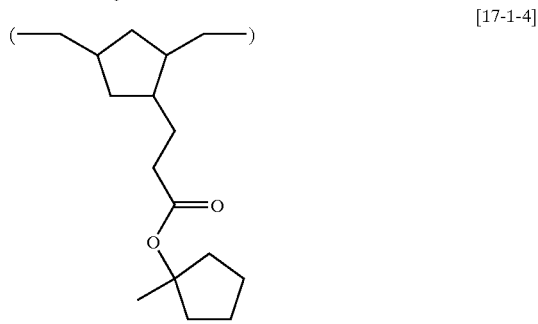

[17-1-4]

[17-1-5]
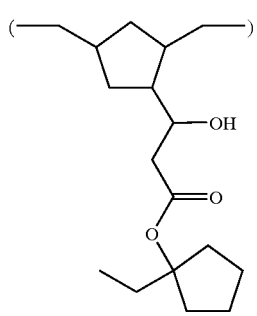
[17-1-6]
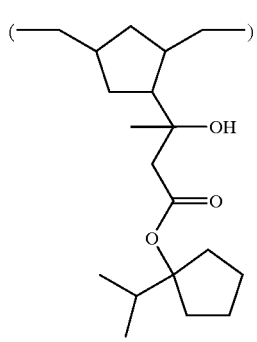
[17-1-7]
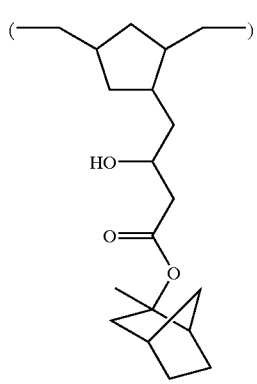
[17-1-8]
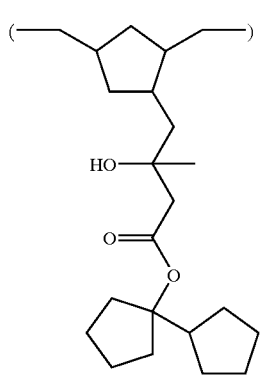
[17-1-9]
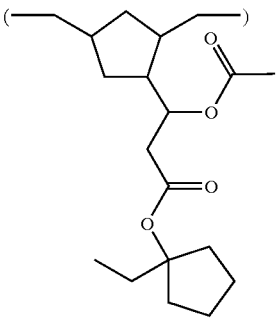
[17-1-10]
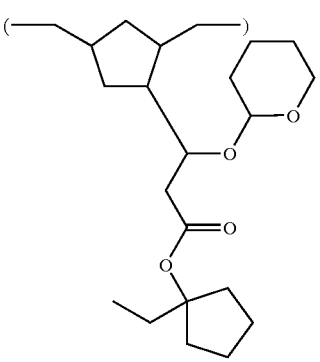
[17-1-11]
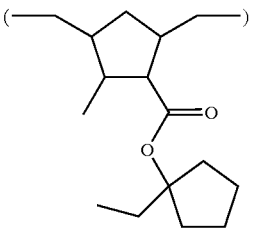
[17-1-12]
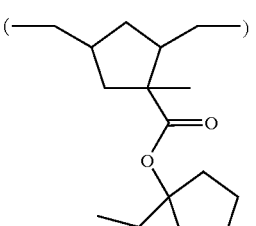
[17-1-13]
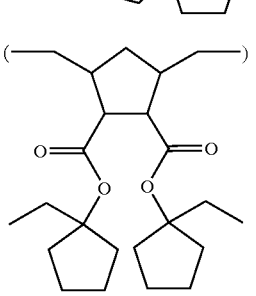

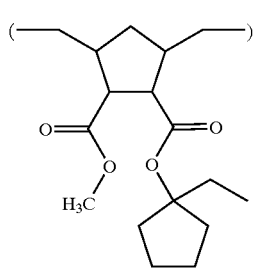
[17-1-14]
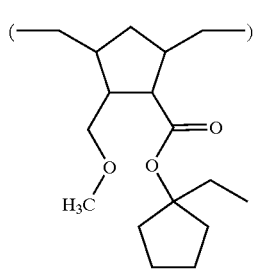
[17-1-15]
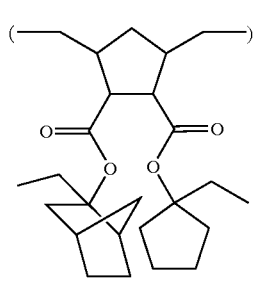
[17-1-16]
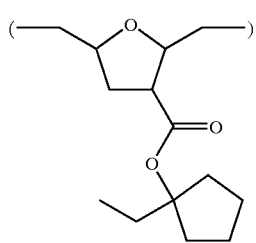
[17-2-1]
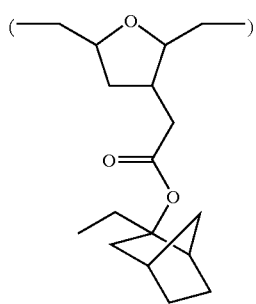
[17-2-2]
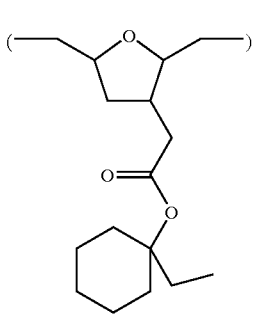
[17-2-3]
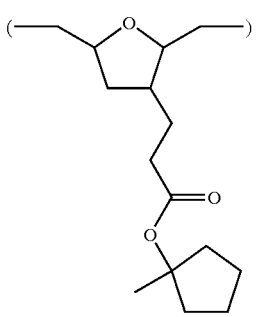
[17-2-4]
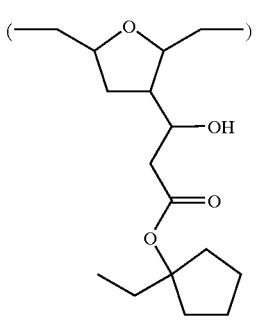
[17-2-5]
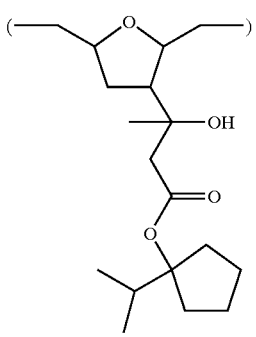
[17-2-6]
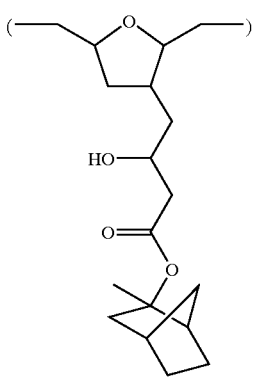
[17-2-7]

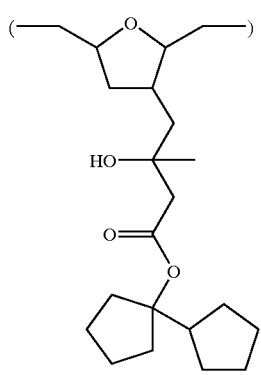
[17-2-8]
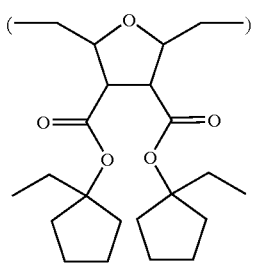
[17-2-13]
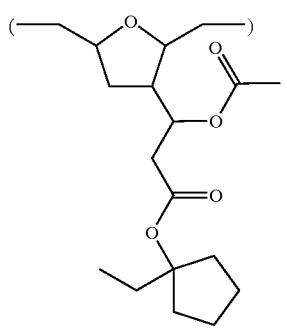
[17-2-9]
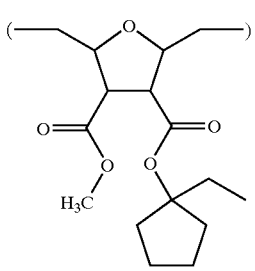
[17-2-14]
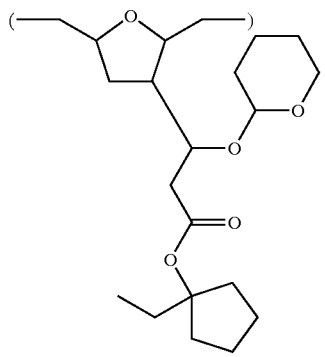
[17-2-10]
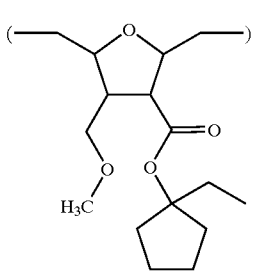
[17-2-15]
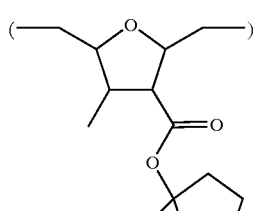
[17-2-11]
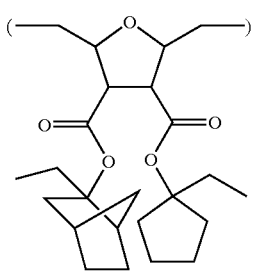
[17-2-16]
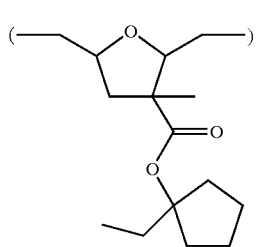
[17-2-12]
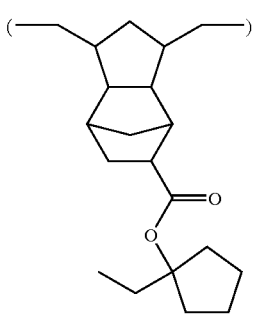
[17-3-1]

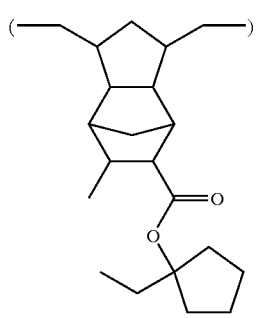 [17-3-2]
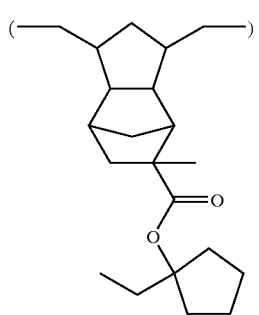 [17-3-3]
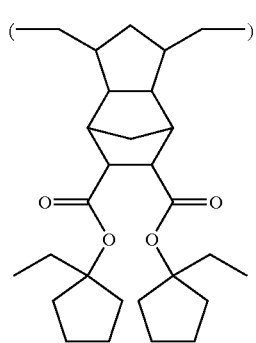 [17-3-4]
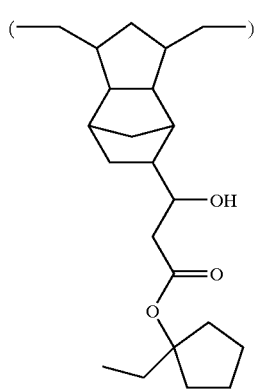 [17-3-5]
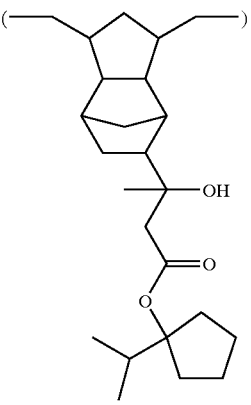 [17-3-6]
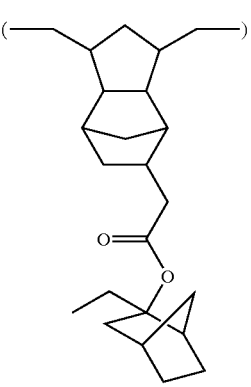 [17-3-7]
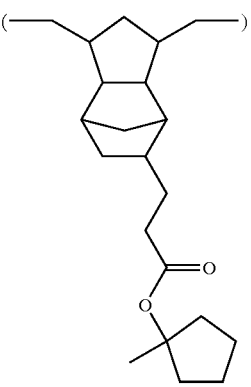 [17-3-8]
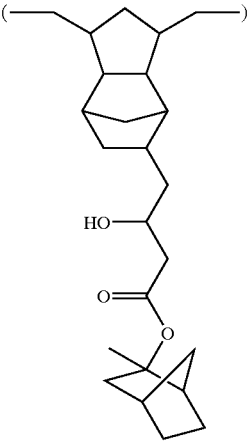 [17-3-9]

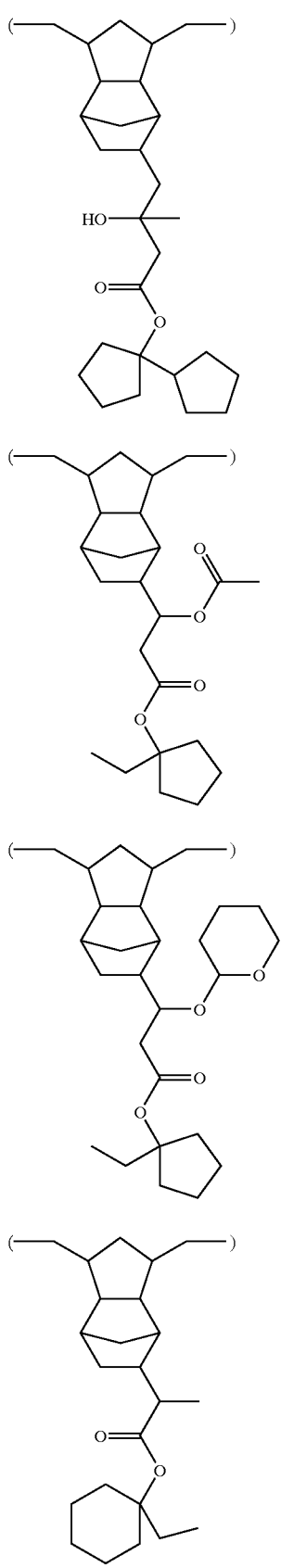
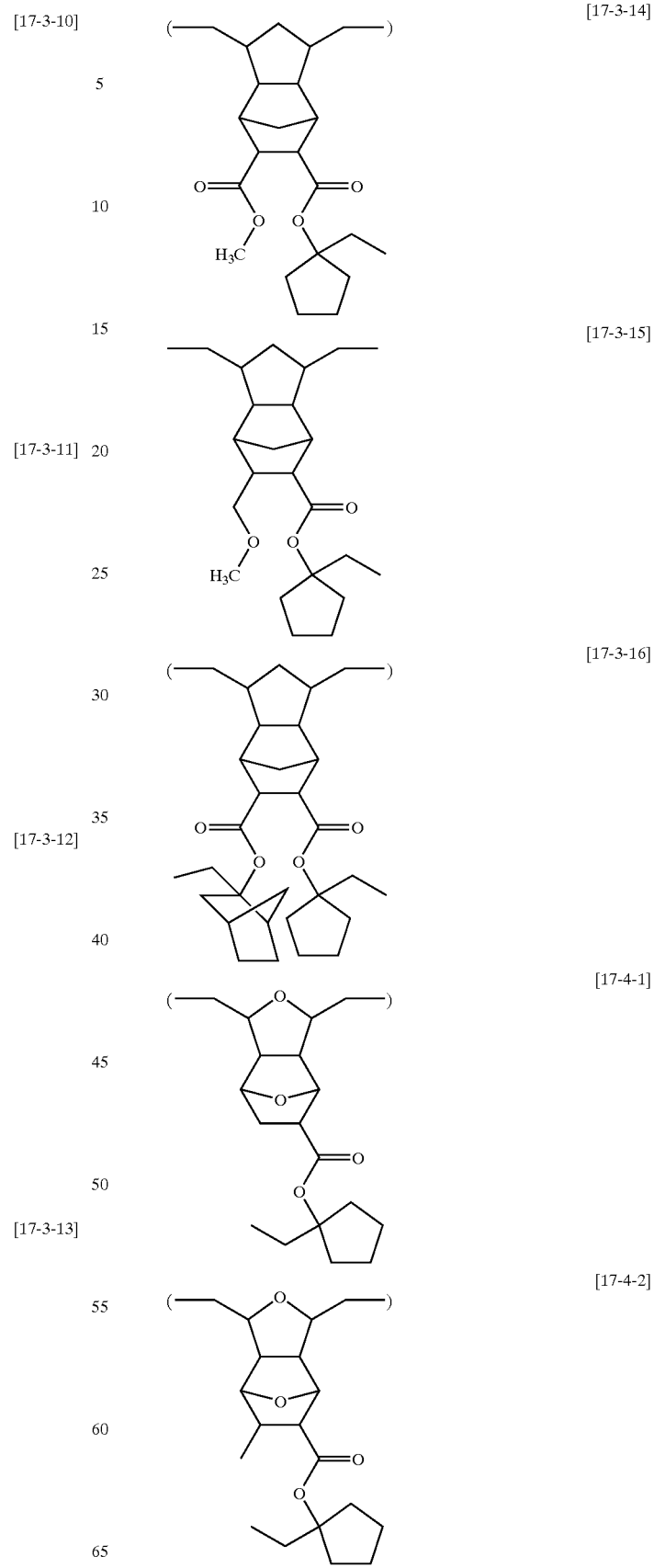

[17-4-3]
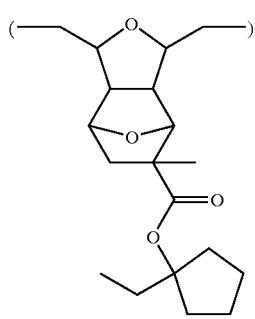
[17-4-4]
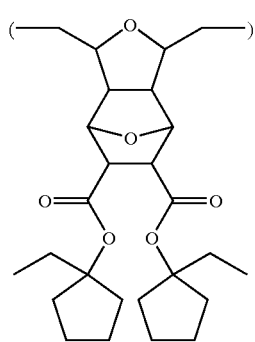
[17-4-5]
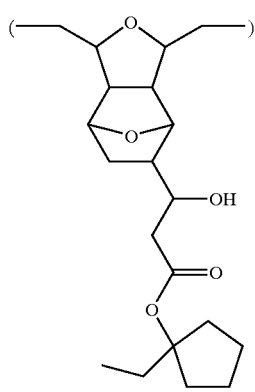
[17-4-6]
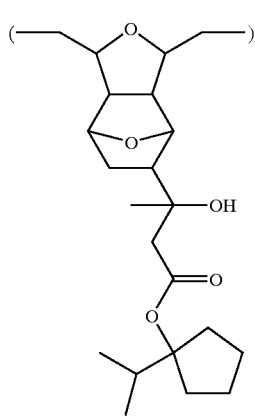
[17-4-7]
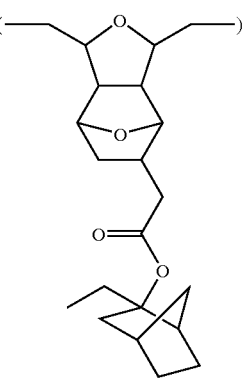
[17-4-8]
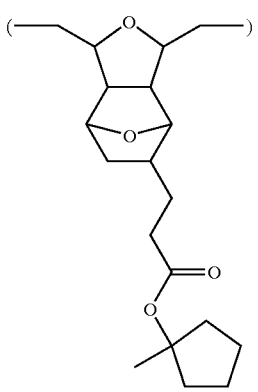
[17-4-9]
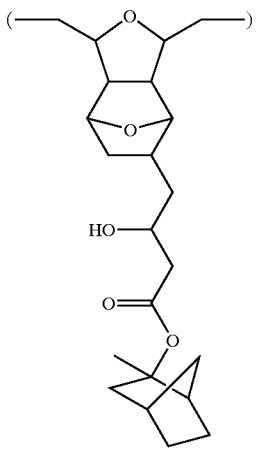
[17-4-10]
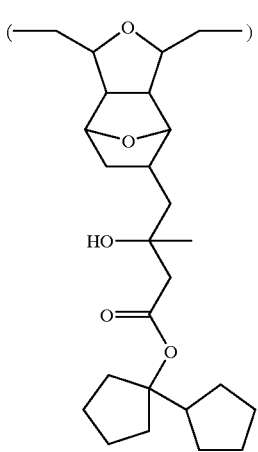

[17-4-11]
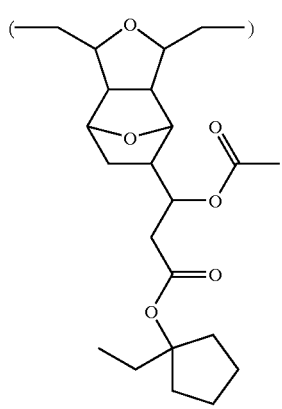

[17-4-12]
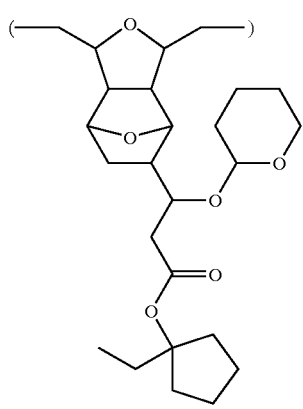

[17-4-13]
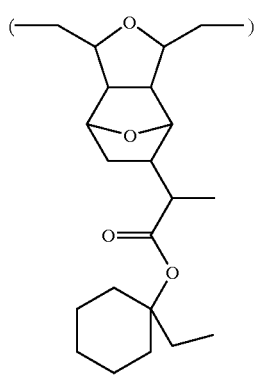

[17-4-14]
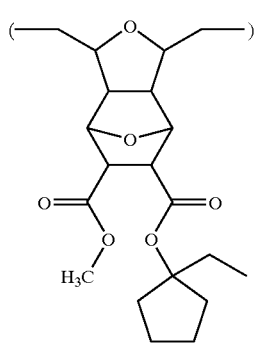

[17-4-15]
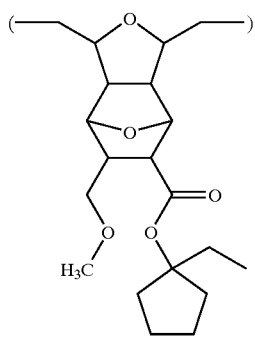

[17-4-16]
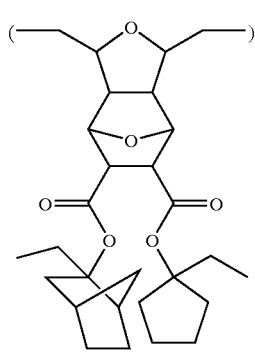

are listed.

In the general formula [3], specific examples of $R^8$ to $R^{11}$ each independently include a hydrogen atom, and linear, branched or cyclic alkyl groups having 1 to 10 carbon atoms such as methyl, ethyl, n-propyl, isopropyl, n-butyl, tert-butyl, cyclohexyl, menthyl and the like. $X^2$ represents —O— or —CR$^{12}_2$— (wherein, $R^{12}$ represents a hydrogen atom or a linear or branched alkyl group having 1 to 10 carbon atoms.), and when m represents 1 to 3, $X^2$s may be the same or different. Specific examples of $R^{12}$ include a hydrogen atom, and linear or branched alkyl groups having 1 to 10 carbon atoms such as methyl, ethyl, n-propyl, isopropyl, n-butyl, tert-butyl and the like. $X^2$ represents preferably —O— or —CH$_2$—, and more preferably, all of $X^2$s are either —O— or —CH$_2$—. m represents preferably 0 or 1.

Namely, as the specific examples of the general formula [3], structural units [B] of the following chemical formula [18]:

[18-1]
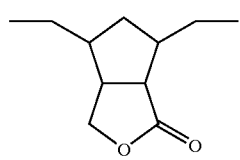

[18-2]
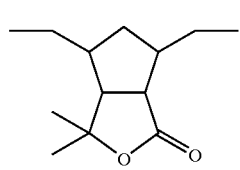

[18-3]
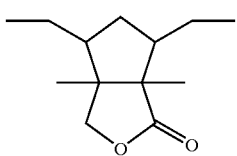
[18-4]
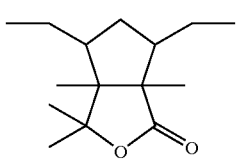
[18-5]
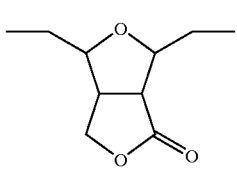
[18-6]
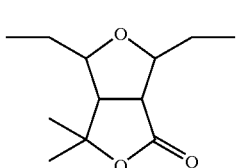
[18-7]
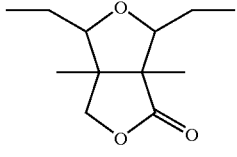
[18-8]
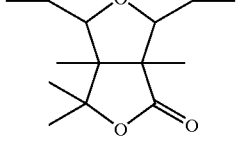
[18-9]
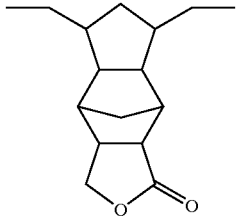
[18-10]
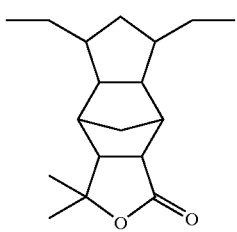
[18-11]
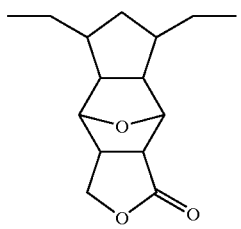
[18-12]
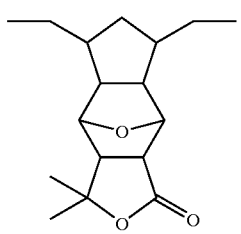
[18-13]
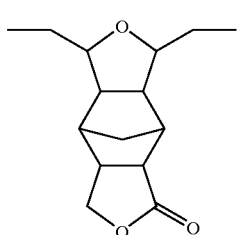
[18-14]
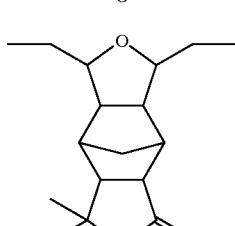
[18-15]
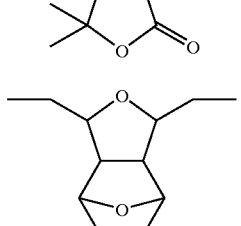
[18-16]
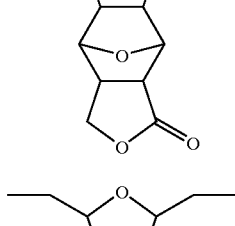
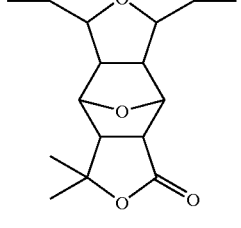
are listed.
In the general formula [4], specific examples of $R^{13}$ to $R^{16}$ each independently include a hydrogen atom, and linear, branched or cyclic alkyl groups having 1 to 10 carbon atoms such as methyl, ethyl, n-propyl, isopropyl, n-butyl, tert-butyl, cyclohexyl, menthyl and the like. $X^3$ represents —O— or —$CR^{17}_2$— (wherein, $R^{17}$ represents a hydrogen atom or a linear or branched alkyl group having 1 to 10 carbon atoms.), and when m represents 1 to 3, $X^3$s may be the same or different. Specific examples of $R^{17}$ include a hydrogen atom, and linear or branched alkyl groups having 1 to 10 carbon atoms such as methyl, ethyl, n-propyl, isopropyl, n-butyl, tert-butyl and the like. $X^3$ represents preferably —O— or —$CH_2$—, and more preferably, all of $X^3$s are either —O— or —$CH_2$—. One of $Y^1$ and $Y^2$ represents —(C=O)— and the other of $Y^1$ and $Y^2$ represents —$CR^{18}_2$— (wherein, $R^{18}$ represents a hydrogen atom or a linear or branched alkyl group having 1 to 10 carbon atoms.). Specific examples of $R^{18}$ include a hydrogen atom, and linear or branched alkyl groups having 1 to 10 carbon atoms such as methyl, ethyl, n-propyl, isopropyl, n-butyl, tert-butyl and the like. One of $Y^1$ and $Y^2$ preferably represents —(C=O)— and the other of $Y^1$ and $Y^2$ represents —$CH_2$—. n represents preferably an integer of 0 or 1.

Namely, as the specific examples of the general formula [4], structural units [C] of the following chemical formula [19]:

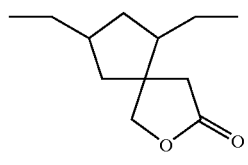

[19-1]

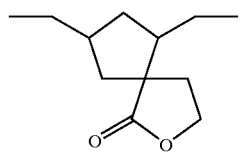

[19-2]

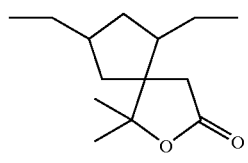

[19-3]

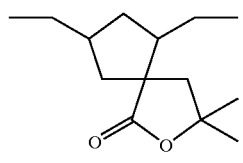

[19-4]

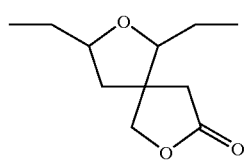

[19-5]

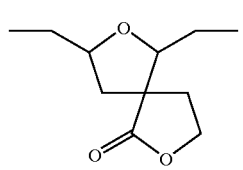

[19-6]

-continued

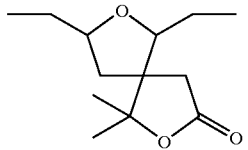

[19-7]

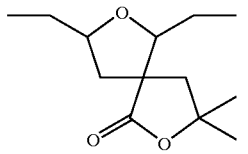

[19-8]

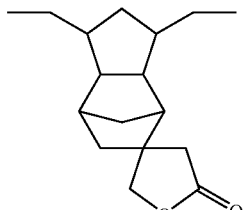

[19-9]

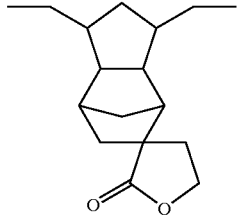

[19-10]

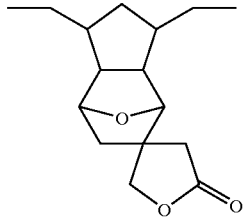

[19-11]

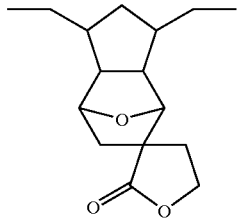

[19-12]

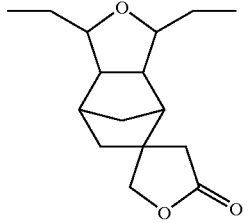

[19-13]

-continued

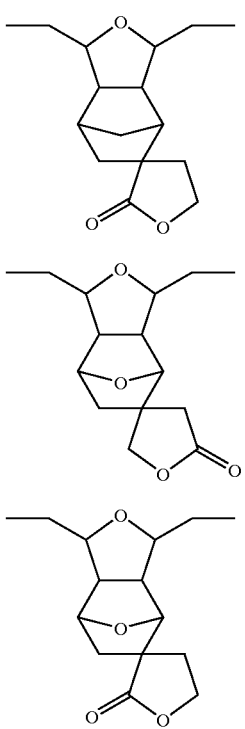

[19-14]

[19-15]

[19-16]

are listed.

The hydrogenated ring-opening metathesis polymer of the present invention is a hydrogenated ring-opening metathesis polymer in which at least one of $X^1$ in the structural unit [A] of the general formula [1], $X^2$ in the structural unit [B] of the general formula [3] and $X^3$ in the structural unit [C] of the general formula [4] represents —O—, and by such presence of an oxygen atom in the main chain, alicyclic compound, adhesion to and wet tension in development with an alkali aqueous solution on a treating substrate such as a silicon substrate are improved, and solubility in polar organic solvents such as ketones, alcohols and the like used in a process of applying a resist agent onto a silicon wafer is further improved, and affinity to water is also improved and developing property with a releasing agent (or developer) such as an alkali aqueous solution and the like after exposure is also improved. Preferable is a hydrogenated ring-opening metathesis polymer in which at least one of $X^1$ in the structural unit [A] of the general formula [1], $X^2$ in the structural unit [B] of the general formula [3] and $X^3$ in the structural unit [C] of the general formula [4] represents —O— and the others represent —CH$_2$—. The molar amount of a —O— unit based on the total of unit molar amounts of $X^1$, $X^2$ and $X^3$ is 0.01 to 0.99, preferably 0.02 to 0.95, more preferably 0.05 to 0.80, most preferably 0.10 to 0.70.

In the present invention, the molar ratio of the structural unit [A] of the general formula [1] to the structural unit [B] of the general formula [3] and/or the structural unit [C] of the general formula [4] ([A]/([B] and [C])) is 0/100 to 99/1, preferably 20/80 to 99/1. It is essential that at least the structural unit [B] and/or [C] is present at certain amount. Here, the structural unit [A] contains a tertiary ester group of a cyclic alkyl of the general formula [2], namely a group which is decomposed with the action of an acid generated from a sensitizer in exposure, to produce a carboxylic acid, and the unit [A] is necessary for making a resist pattern by developing with an alkali aqueous solution after exposure.

Further, the structural unit [B] and/or [C] is necessary for manifesting adhesion with a treating substrate such as a silicon substrate. When the molar ratio [A]/([B] and [C]) is less than 20/80, development may be insufficient. When over 99/1, adhesion with a treating substrate is not manifested. More preferably, the molar ratio [A]/([B] and [C]) is 20/80 to 95/5, particularly preferably 25/75 to 90/10, most preferably 30/70 to 85/15. The molar ratio of these structural units within this range is suitable for preparing a resist composition, and is extremely important for a resist material which is dissolved in a polar solvent such as 2-heptanone and the like, for example, together with a sensitizer having high polarity, and applied on a treating substrate such as a silicon substrate. Namely, a uniform and smooth coating film can be formed by enhancing solubility or dissolution speed in a polar solvent with the aid of a hydrogenated ring-opening metathesis polymer, in preparing a resist composition.

In the hydrogenated ring-opening metathesis polymer of the present invention, at least one of the structural units [B] and [C] is necessary, and ternary copolymer constituted of the structural units [B] and [C] in addition to the structural unit [A] may be permissible, and preferable is a binary copolymer constituted only one of the structural units [B] and [C] in addition to the structural unit [A].

In the hydrogenated ring-opening metathesis polymer of the present invention, the ratio of the weight-average molecular weight Mw to the number-average molecular weight Mn (Mw/Mn) is restricted within a narrow molecular weight distribution from 1.0 to 2.0. The molecular weight distribution significantly affects the resolution when used as a resist material, and a pattern of higher resolution can be obtained when the molecular weight distribution is narrower. The molecular weight distribution is preferably from 1.0 to 1.8, more preferably from 1.0 to 1.6. The hydrogenated ring-opening metathesis polymer of the present invention usually has a number-average molecular weight Mn from 500 to 200,000, preferably from 1,000 to 100,000, more preferably from 3,000 to 50,000. The number-average molecular weight and the weight-average molecular weight described in the instant specification were measured by gel permeation chromatography (GPC) in terms of polystyrene.

Further, these hydrogenated ring-opening metathesis polymers may be composed of each one structural unit of [A], [B] and/or [C], or two or more structural units of any of or all of [A], [B] and/or [C]. There are exemplified hydrogenated ring-opening metathesis polymers in which the structural unit [A] is composed of structural units [A-1] and [A-2] of the following general formulae [1-1] and [1-2], respectively,

[1-1]

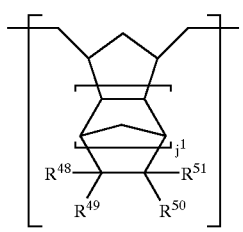

(wherein, at least one of $R^{48}$ to $R^{51}$ represents a functional group having a tertiary ester group of a cyclic alkyl of the general formula [2], and the remaining groups of $R^{48}$ to $R^{51}$ are selected each independently from a hydrogen atom, linear, branched or cyclic alkyl groups having 1 to 20 carbon atoms, halogens, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 6 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, and j represents an integer of 0 or 1 to 3.)

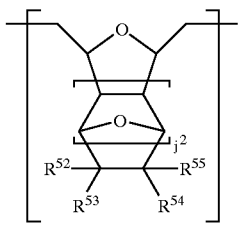

[1-2]

(wherein, at least one of $R^{52}$ to $R^{55}$ represents a functional group having a tertiary ester group of a cyclic alkyl of the general formula [2], and the remaining groups of $R^{52}$ to $R^{55}$ are selected each independently from a hydrogen atom, linear, branched or cyclic alkyl groups having 1 to 20 carbon atoms, halogens, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 6 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, and $j^2$ represents an integer of 0 or 1 to 3.), the structural unit [B] is composed of structural units [B-1] and [B-2] of the following general formulae [3-1] and [3-2], respectively,

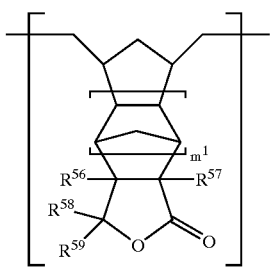

[3-1]

(wherein, $R^{56}$ to $R^{59}$ each independently represent a hydrogen atom or a linear, branched or cyclic alkyl group having 1 to 10 carbon atoms, and m represents an integer of 0 or 1 to 3.)

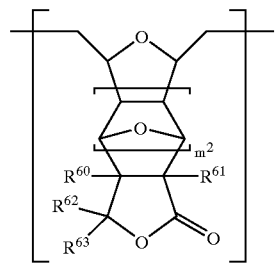

[3-2]

(wherein, $R^{60}$ to $R^{63}$ each independently represent a hydrogen atom or a linear, branched or cyclic alkyl group having 1 to 10 carbon atoms, and $m^2$ represents an integer of 0 or 1 to 3.), and/or, the structural unit [C] is composed of structural units [C-1] and [C-2] of the following general formulae [4-1] and [4-2], respectively,

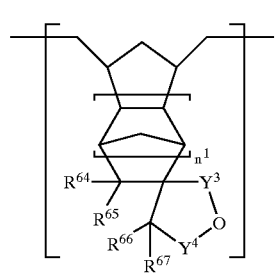

[4-1]

(wherein, $R^{64}$ to $R^{67}$ each independently represent a hydrogen atom or a linear, branched or cyclic alkyl group having 1 to 10 carbon atoms, one of $Y^3$ and $Y^4$ represents —(C=O)— and the other of $Y^3$ and $Y^4$ represents —CH$_2$—, and $n^1$ represents an integer of 0 or 1 to 3.)

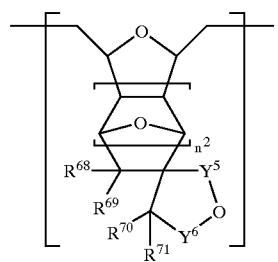

[4-2]

(wherein, $R^{68}$ to $R^{71}$ each independently represent a hydrogen atom or a linear, branched or cyclic alkyl group having 1 to 10 carbon atoms, one of $Y^5$ and $Y^6$ represents —(C=O)— and the other of $Y^5$ and $Y^6$ represents —CH$_2$—, and n represents an integer of 0 or 1 to 3.).

It is preferable that the hydrogenated ring-opening metathesis copolymer of the present invention has a structural unit [D] of the general formula [5] further as a structural unit in addition to the structural units [A] and [B] and/or [B], for further improving adhesion to a substrate and affinity to a developer.

In the general formula [5] in the present invention, at least one of $R^{19}$ to $R^{22}$ represents a functional group having a carboxyl group of the general formula [6] (wherein, the chain line represents a connecting means. $R^{23}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms. $W^2$ represents a single bond or a (k+2)-valent hydrocarbon group having 1 to 10 carbon atoms. q represents 0 or 1.)

Regarding $R^{23}$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, 1-ethylcyclopentyl, 1-ethylcyclohexyl and the like, examples of the linear, branched or cyclic alkoxyalkyl group having 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like, and examples of the linear, branched or cyclic acyl group having 1 to 10 carbon atoms include formyl, acetyl, pivaloyl, cyclohexylcarbonyl and the like. Among these groups $R^{23}$, linear or-branched alkyl groups having 1 to 6 carbon atoms, linear, branched or cyclic alkoxyalkyl groups having 2 to 7 carbon atoms and linear or branched acyl groups having 2 to 7 carbon atoms are preferable, and particularly, a hydrogen atom, methyl, ethyl, methoxymethyl, 1-ethoxyethyl, tetrahydrofuran-2-yl and acetyl are preferable.

Regarding $W^2$, the (q+2)-valent hydrocarbon group having 1 to 10 carbon atoms is a linear, brenched or cyclic divalent hydrocarbon group having 1 to 10 carbon atoms when q represents 0, and examples thereof include methylene, dimethylmethylene, ethylidene, propylidene, butylidene, ethylene, 1-methylethylene, 2-methylethylene, 1-ethylethylene, 2-alkylethylene, 1,1-dlmethylethylenel 1,2-dimethytethylene, 2,2-dimethylethylene, 1-ethyl-2-methylethylene, trimethylene, 1-methyltrimethylene, 2-methyltrimethylene, 3-methyltrimethylene, tetramethylene, pentamethylenel 1,1-cyclopentylene, 1,2-cyclopentylene, 1,3-cyalopentylene, 1,1-cyclohexylene, 1,2-cyclohexylene, 1,3-cyclohexylene, 1,4-cyclohexylene and the like. Among them, methylene, ethylidene, ethylene, 1-methylethylen, 2-methylethylene, trimethylene and 2-methyltrimethylene are preferable. When q is 1, those having a connecting means formed by removing one hydrogen atom at any position on the hydrocarbon group as described above when q represents 0, are listed. Most preferably, $W^2$ represents a single bond.

Regarding the other groups of $R^{19}$ to $R^{22}$, a hydrogen atom, linear, branched or cyclic alkyl groups having 1 to 20 carbon atoms such as methyl, ethyl, propyl, isopropyl, n-butyl, tert-butyl, cyclohexyl, menthyl and the like, halogens such as a chlorine atom, bromine atom, iodine atom, fluorine atom and the like, linear, branched or cyclic halogenated alkyl groups having 1 to 20 carbon atoms such as fluoromethyl, chloromethyl, bromomethyl, difluoromethyl, dichloromethyl, dibromomethyl, trifluoromethyl, trichloromethyl, tribromomethyl and the like, linear, branched or cyclic alkoxy groups having 1 to 12 carbon atoms such as methoxy, ethoxy, isopropoxy, n-butoxy, tert-butoxy, menthoxy and the like, linear, branched or cyclic alkoxyalkyl groups having 2 to 20 carbon atoms such as methoxymethyl, methoxyethyl, tert-butoxymethyl, tert-butoxyethyl, menthoxymenthol and the like, or containing alkoxy saccharides such as methylglucose and the like, linear, branched or cyclic alkylcarbonyloxy groups having 2 to 20 carbon atoms such as acetoxy and the like, arylcarbonyloxy groups having 6 to 20 carbon atoms such as naphthoyloxy and the like, alkylsulfonyloxy groups having 1 to 20 carbon atoms such as mesyloxy and the like, arylsulfonyloxy groups having 6 to 20 carbon atoms such as tosyloxy and the like, linear, branched or cyclic alkoxycarbonyl groups having 2 to 20 carbon atoms such as methoxycarbonyl, ethoxycarbonyl, n-propoxycarbonyl, isopropoxycarbonyl, n-butoxycarbonyl, tert-butoxycarbonyl, cyclohexyloxycarbonyl and the like, linear, branched or cyclic alkoxycarbonylalkyl groups having 3 to 20 carbon atoms such as methoxycarbonylmethyl, 2-(methoxycarbonyl )ethyl, 1-(methoxycarbonyl ) ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl and the like, are each independently listed as specific examples thereof. Among them, a hydrogen atom, linear, branched or cyclic alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkoxycarbonyl groups having 2 to 20 carbon atoms and linear, branched or cyclic alkoxycarbonylalkyl groups having 3 to 20 carbon atoms are preferable, and a hydrogen atom, linear or branched alkyl groups having 1 to 10 carbon atoms, linear or branched alkoxycarbonyl groups having 2 to 10 carbon atoms and linear or branched alkoxycarbonylalkyl groups having 3 to 10 carbon are more preferable.

$X^4$ represents —O— or —$CR^{23}_2$— (wherein, $R^{23}$ represents a hydrogen atom or a linear or branched alkyl group having 1 to 10 carbon atoms.), and when p represents 1 to 3, $X^4$ s may be the same or different. Specific examples of $R^{23}$ include a hydrogen atom, and linear or branched alkyl groups having 1 to 10 carbon atoms such as methyl, ethyl, n-propyl, isopropyl, n-butyl, tert-butyl and the like. $X^4$ represents preferably —O— or —$CH_2$—, and more preferably, all of $X^4$s are either —O— or —$CH_2$—. p represents preferably 0 or 1.

Namely, as the specific examples of the general formula [5], structural units [D] of the following chemical formula [20]:

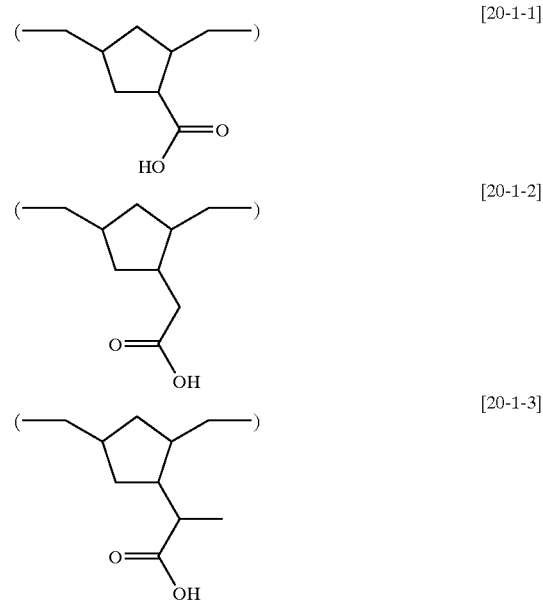

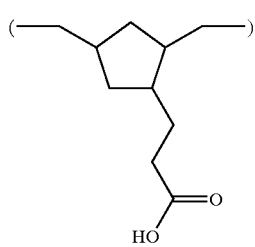 [20-1-4]
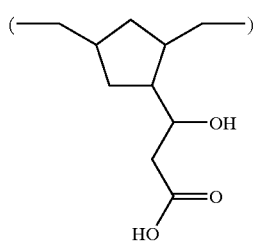 [20-1-5]
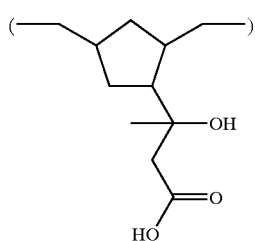 [20-1-6]
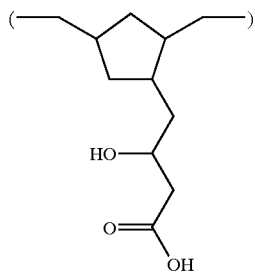 [20-1-7]
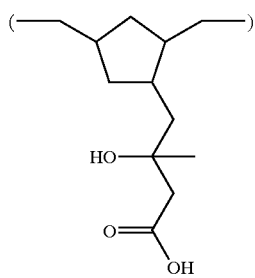 [20-1-8]
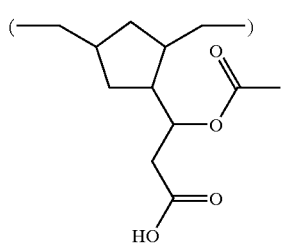 [20-1-9]
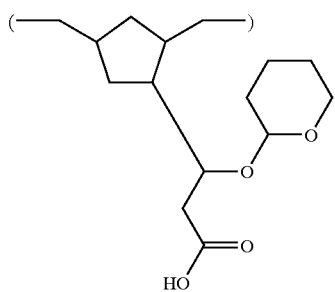 [20-1-10]
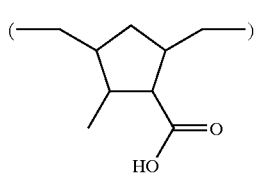 [20-1-11]
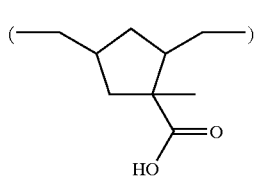 [20-1-12]
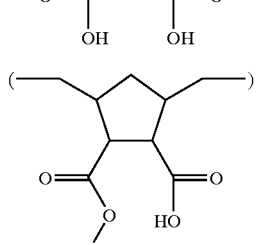 [20-1-13]
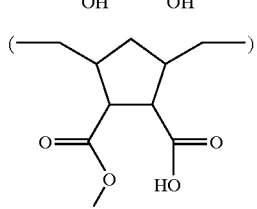 [20-1-14]
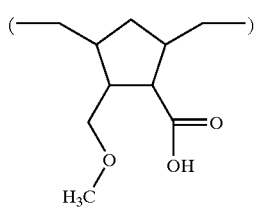 [20-1-15]
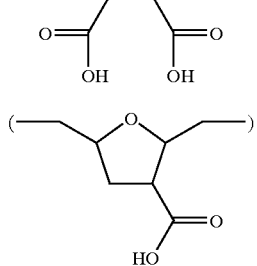 [20-1-16]
[20-2-1]

[20-2-2] 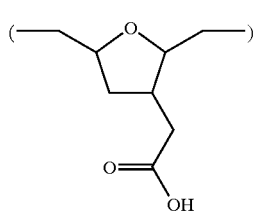
[20-2-3] 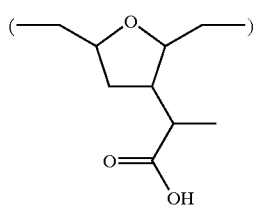
[20-2-4] 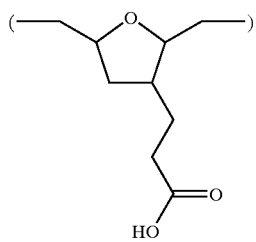
[20-2-5] 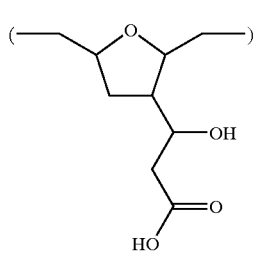
[20-2-6] 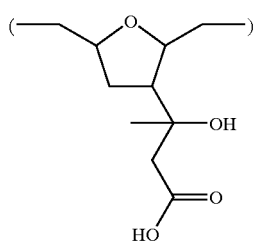
[20-2-7] 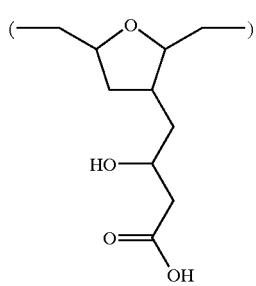
[20-2-8] 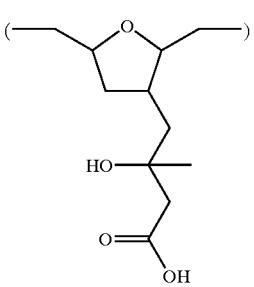
[20-2-9] 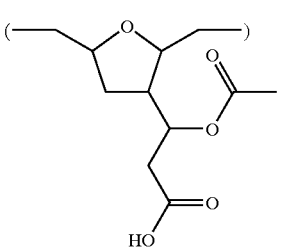
[20-2-10] 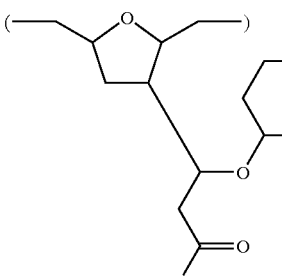
[20-2-11] 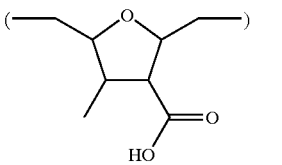
[20-2-12] 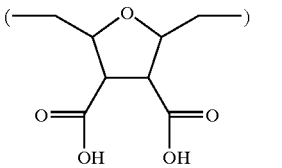
[20-2-13] 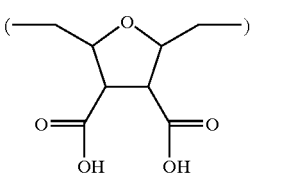
[20-2-14] 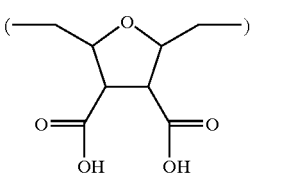

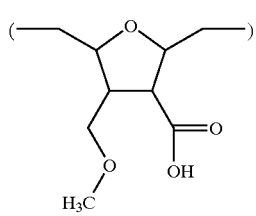 [20-2-15]
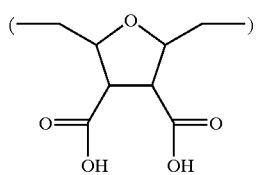 [20-2-16]
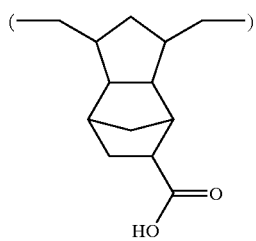 [20-3-1]
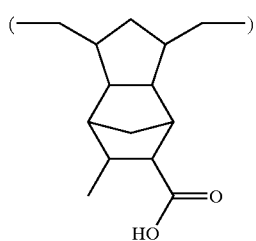 [20-3-2]
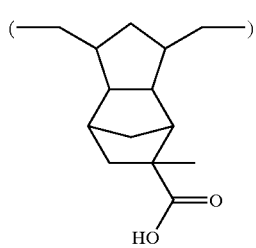 [20-3-3]
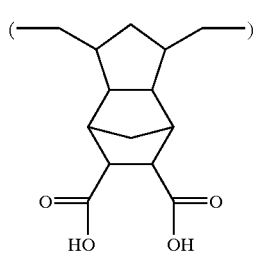 [20-3-4]
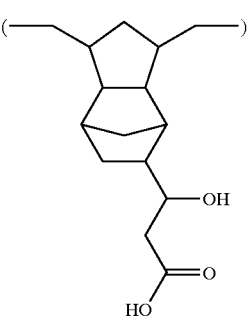 [20-3-5]
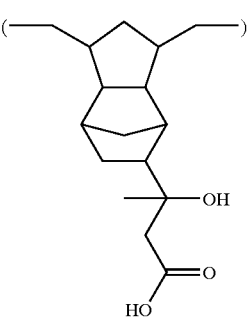 [20-3-6]
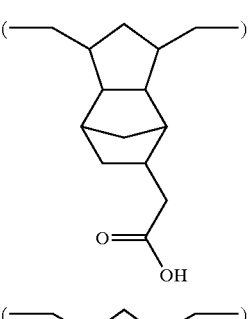 [20-3-7]
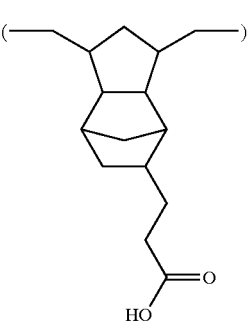 [20-3-8]
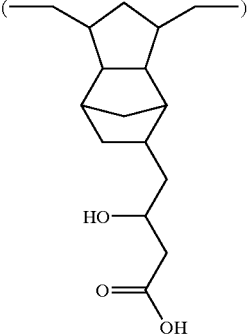 [20-3-9]

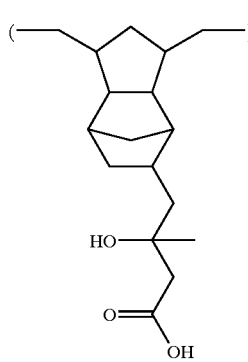
[20-3-10]
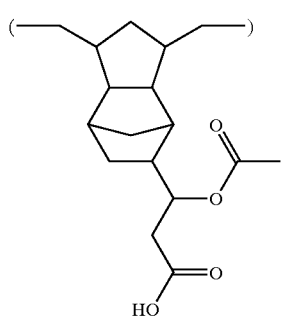
[20-3-11]
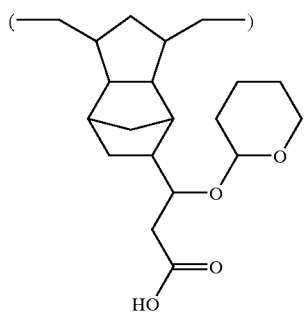
[20-3-12]
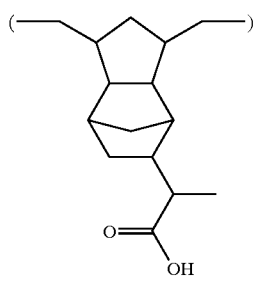
[20-3-13]
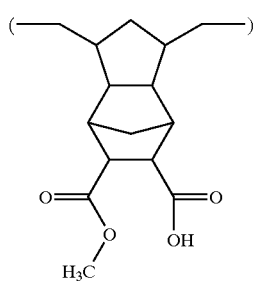
[20-3-14]
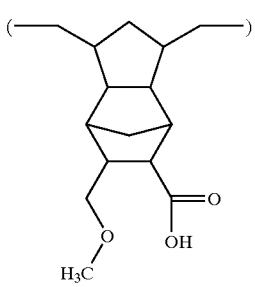
[20-3-15]
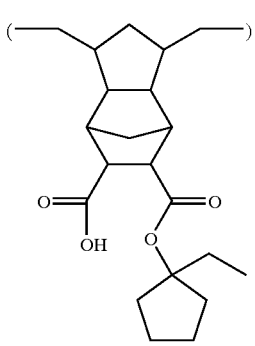
[20-3-16]
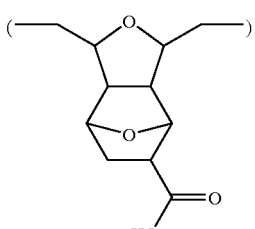
[20-4-1]
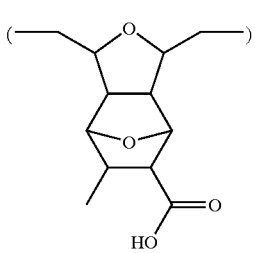
[20-4-2]
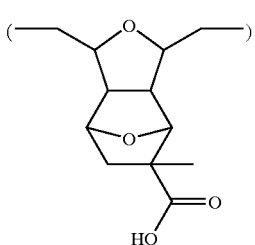
[20-4-3]
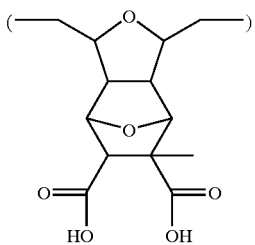
[20-4-4]

[20-4-5]
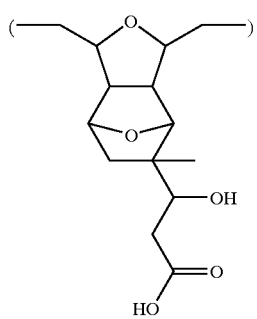
[20-4-6]
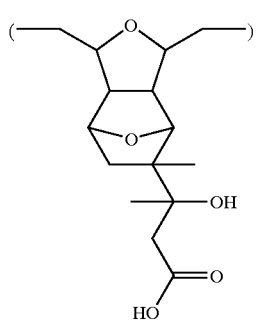
[20-4-7]
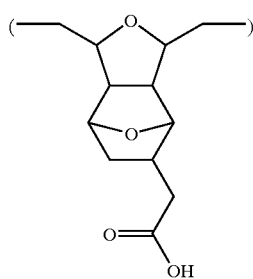
[20-4-8]
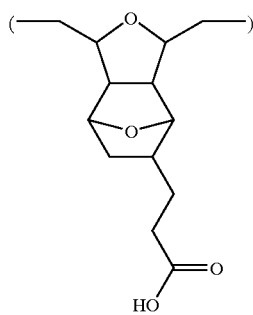
[20-4-9]
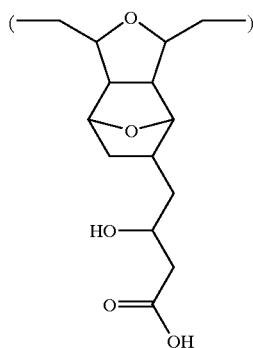
[20-4-10]
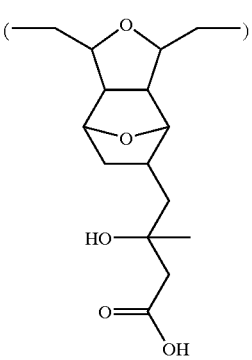
[20-4-11]
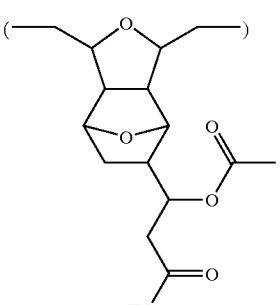
[20-4-12]
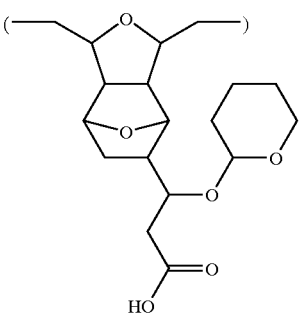
[20-4-13]
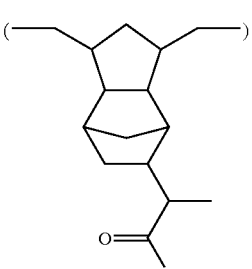
[20-4-14]
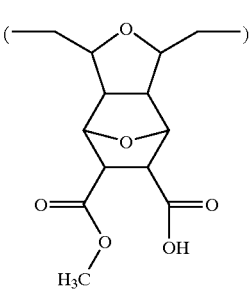

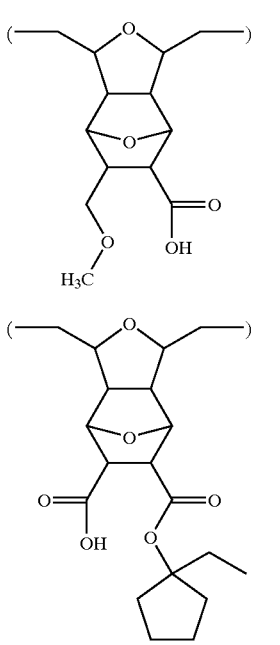

are listed.

In preferable embodiments of the present invention, the molar ratio of the structural unit [A] of the general formula [1], the structural unit [B] of the general formula [3] and the structural unit [C] of the general formula [4] to the structural unit [D] of the general formula [5] ([A]+[B]+[C])/[D] is from 100/0 to 20/80, and it is preferable that the structural unit [D] is present in certain amount in addition to the structural units [A], [B] and [C]. Here, the structural unit [D] enhances extremely adhesion to a treating substrate such as a silicon substrate, and further improve affinity to a developer. The molar ratio ([A]+[B]+[C])/[D] is preferably from 98/2 to 50/50, further preferably from 97/3 to 60/40, most preferably from 95/5 to 70/30.

The hydrogenated ring-opening metathesis copolymer of the present invention has a structural unit [E] of the general formula [7] further as a structural unit in addition to the structural units [A] and [B] and/or [B], preferably further in addition to [D].

In the general formula [7], at least one of $R^{25}$ to $R^{28}$ represents a functional group having a carboxylate group of the general formula [8] (wherein, the chain line represents a connecting means. $R^{28}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms. $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms. $W^3$ represents a single bond or a (s+2)-valent hydrocarbon group having 1 to 10 carbon atoms, s represents 0 or 1.)

Regarding $R^{29}$, examples of the linear, branched or cyclic alkyl group having 1 to 10 carbon atoms include methyl, ethyl, propyl, isopropyl, n-butyl, isobutyl, tert-butyl, cyclopentyl, cyclohexyl, 1-ethylcyclopentyl, 1-ethylcyclohexyl and the like, examples of the linear, branched or cyclic alkoxyalkyl group having 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like, and examples of the linear, branched or cyclic acyl group having 1 to 10 carbon atoms include formyl, acetyl, pivaloyl, cyclohexylcarbonyl and the like. Of these groups $R^{29}$ linear or branched alkyl groups having 1 to 6 carbon atoms, linear, branched or cyclic alkoxyalkyl groups having 2 to 7 carbon atoms and linear or branched acyl groups having 2 to 7 carbon atoms are preferable, and particularly, a hydrogen atom, methyl, ethyl, methoxymethyl, 1-ethoxyethyl, tetrahydrofuran-2-yl and acetyl are preferable.

Regarding $R^{30}$, examples of the linear, branched or cyclic alkyl group having 1 to 10 carbon atoms include methyl, ethyl, propyl, isopropyl, n-butyl, isobutyl, tert-butyl and the like, examples of the linear, branched or cyclic alkoxyalkyl group having 2 to 10 carbon atoms include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, tetrahydropyran-2-yl and the like, and examples of the linear, branched or cyclic halogenated alkyl group having 1 to 20 carbon atoms include fluoromethyl, chloromethyl, bromomethyl, difluoromethyl, dichloromethyl, dibromomethyl, trifluoromethyl, trichloromethyl, tribromomethyl and the like. Of these groups $R^{30}$, linear or branched alkyl groups having 1 to 10 carbon atoms are preferable, and particularly, methyl, ethyl, propyl, isopropyl, n-butyl, isobutyl and tert-butyl are preferable.

Regarding $W^3$, the (s+2)-valent hydrocarbon group having 1 to 10 carbon atoms is a linear, branched or cyclic divalent hydrocarbon group having 1 to 10 carbon atoms when s represents 0, and examples thereof include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, 1,4-cyclohexylene and the like. Among them, methylene, ethylidene, ethylene, 1-methylethylene, 2-methylethylene, trimethylene and 2-methyltrimethylene are preferable. When s is 1, those having a connecting means formed by removing one hydrogen atom at any position on the hydrocarbon group as described above when s represents 0, are listed. Most preferably, $W^3$ represents a single bond.

Regarding the other groups of $R^{25}$ to $R^{28}$, a hydrogen atom, linear, branched or cyclic alkyl groups having 1 to 20 carbon atoms such as methyl, ethyl, propyl, isopropyl, n-butyl, tert-butyl, cyclohexyl, menthyl and the like, halogens such as a chlorine atom, bromine atom, iodine atom, fluorine atom and the like, linear, branched or cyclic halogenated alkyl groups having 1 to 20 carbon atoms such as fluoromethyl, chloromethyl, bromomethyl, difluoromethyl, dichloromethyl, dibromomethyl, trifluoromethyl, trichloromethyl, tribromomethyl and the like, linear, branched or cyclic alkoxy groups having 1 to 12 carbon atoms such as methoxy, ethoxy, isopropoxy, n-butoxy, tert-butoxy, menthoxy and the like, linear, branched or cyclic alkoxyalkyl groups having 2 to 20 carbon atoms such as methoxymethyl, methoxyethyl, tert-butoxymethyl, tert-butoxyethyl, menthoxymenthol and the like, or containing alkoxy saccharides such as methylglucose and the like, linear, branched or cyclic alkylcarbonyloxy groups having 2 to 20 carbon atoms such as acetoxy and the like, arylcarbonyloxy groups having 6 to 20 carbon atoms such as naphthoyloxy and the like, alkylsulfonyloxy groups having 1 to 20 carbon atoms such as mesyloxy and the like, arylsulfonyloxy groups having 6 to 20 carbon atoms such as tosyloxy and the like, linear, branched or cyclic alkoxycarbonyl groups having 2 to 20 carbon atoms such as methoxycarbonyl, ethoxycarbonyl n-propoxycarbonyl, isopropoxycarbonyl, n-butoxycarbonyl, tert-butoxycarbonyl, cyclohexyloxycarbonyl and the like, linear, branched or cyclic alkoxycarbonylalkyl groups having 3 to 20 carbon atoms such as methoxycarbonylmethyl, 2-(methoxycarbonyl)ethyl, 1-(methoxycarbonyl)ethyl ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl, cyclohexyloxycarbonylmethyl and the like, are each independently listed as specific examples thereof. Among them, a hydrogen atom, linear, branched or cyclic alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkoxycarbonyl groups having 2 to 20 carbon atoms and linear, branched or cyclic alkoxycarbonylalkyl groups having 3 to 20 carbon atoms are preferable, and a hydrogen atom, linear or branched alkyl groups having 1 to 10 carbon atoms, linear or branched alkoxycarbonyl groups having 2 to 10 carbon atoms and linear or branched alkoxycarbonylalkyl groups having 3 to 10 carbon are more preferable.

$X^5$ represents —O— or —$CR^{31}_2$— (wherein, $R^{31}$ represents a hydrogen atom or a linear or branched alkyl group having 1 to 10 carbon atoms.), and when r represents 1 to 3, $X^5$s may be the same or different. Specific examples of $R^{31}$ include a hydrogen atom, and linear or branched alkyl groups having 1 to 10 carbon atoms such as methyl, ethyl, n-propyl, isopropyl, n-butyl, tert-butyl and the like. $X^5$ represents preferably —O— or —$CH_2$—, and more preferably, all of $X^5$s are either —O—or —$CH_2$—. r represents preferably 0 or 1.

Namely, as the specific examples of the general formula [7], structural units [E] of the following chemical formula [21]:

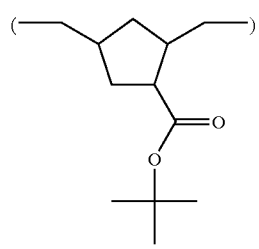

[21-1-1]

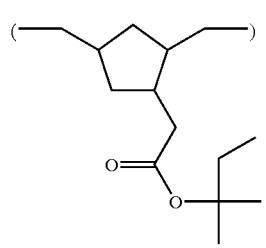

[21-1-2]

-continued

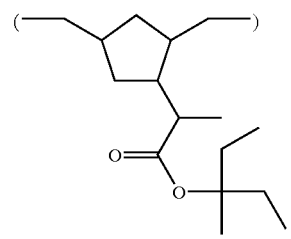

[21-1-3]

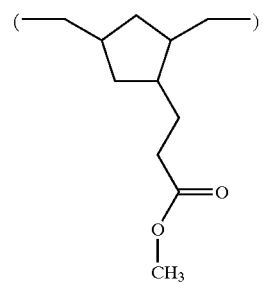

[21-1-4]

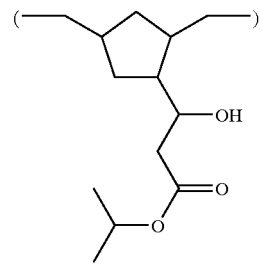

[21-1-5]

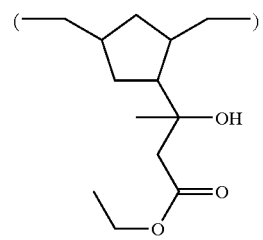

[21-1-6]

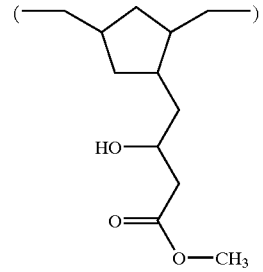

[21-1-7]

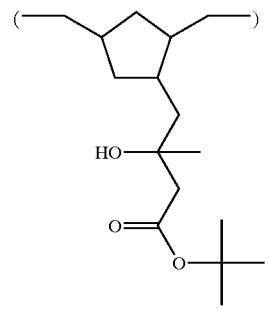

[21-1-8]

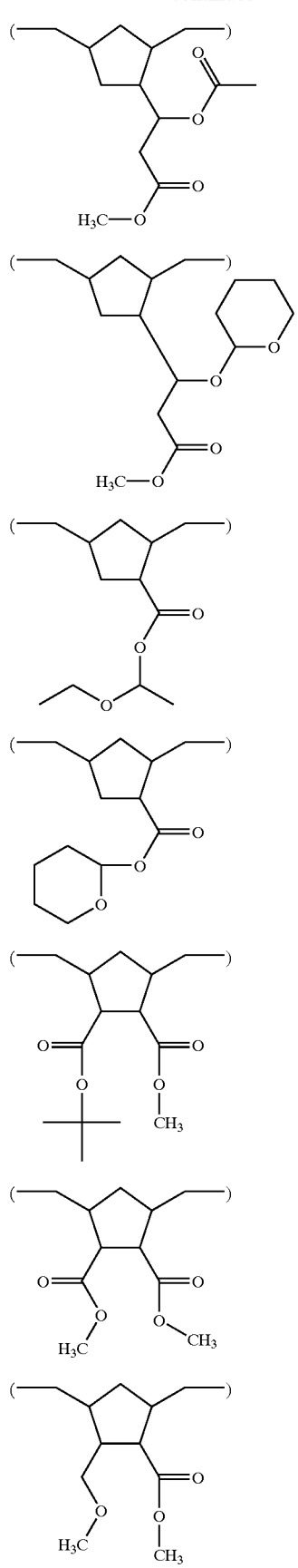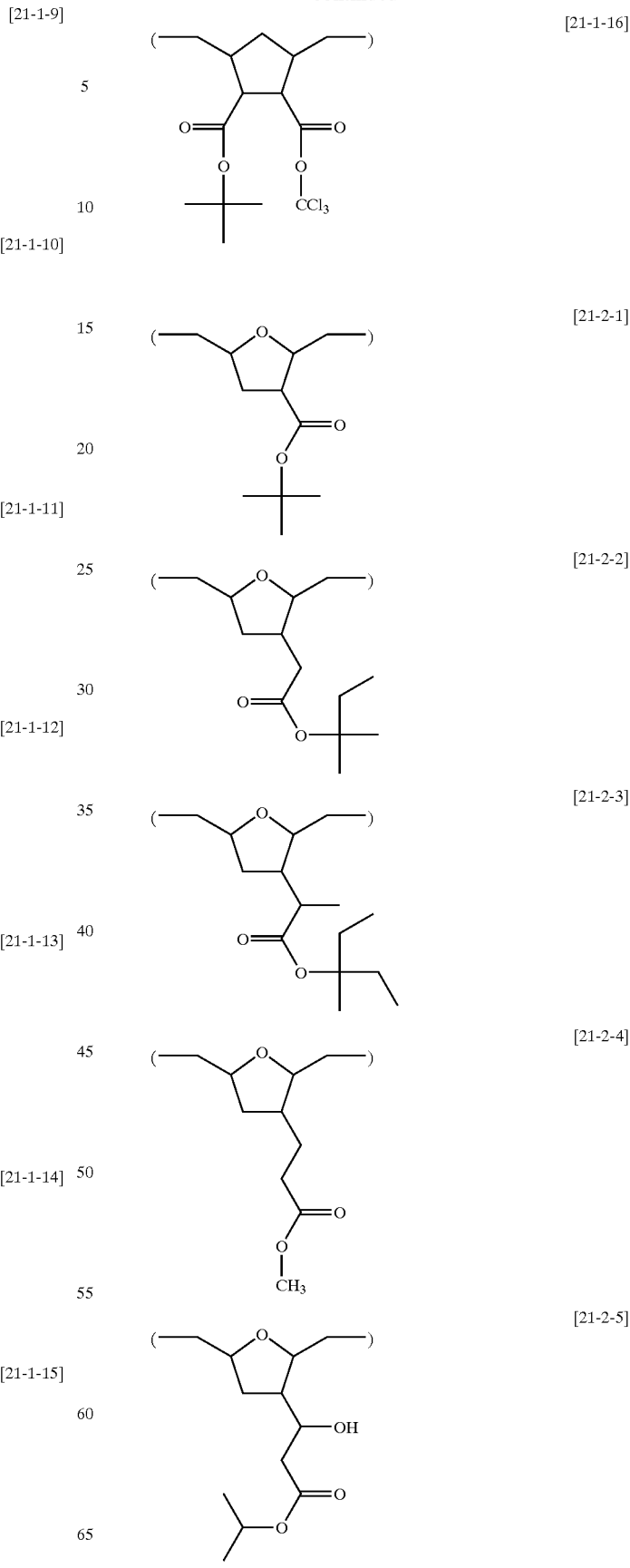

[21-2-6]
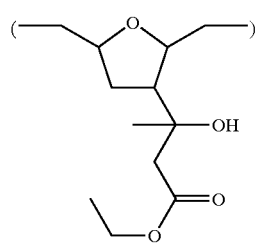
[21-2-7]
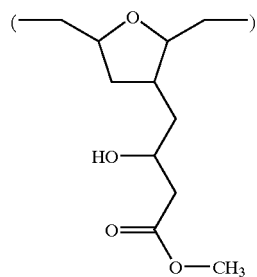
[21-2-8]
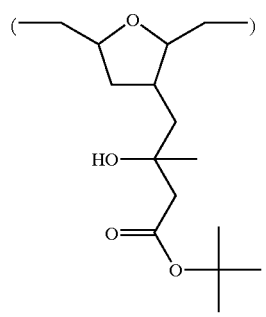
[21-2-9]
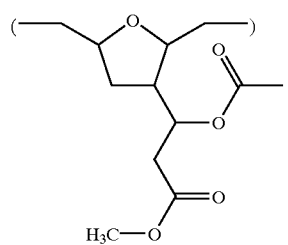
[21-2-10]
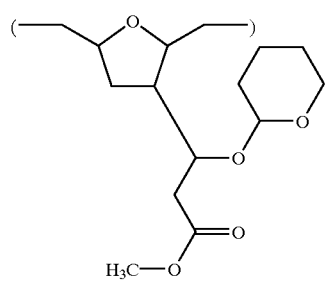
[21-2-11]
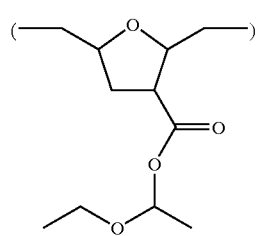
[21-2-12]
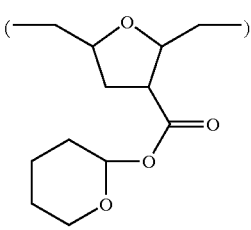
[21-2-13]
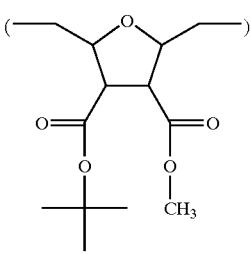
[21-2-14]
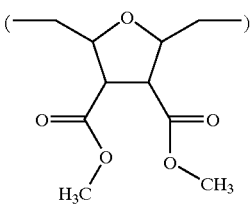
[21-2-15]
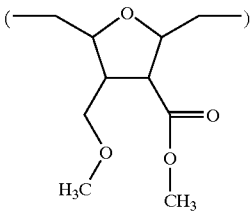
[21-2-16]
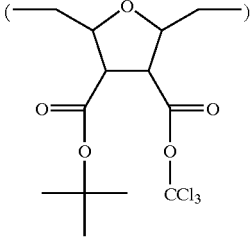
[21-3-1]
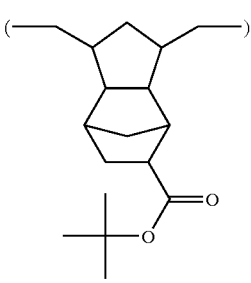

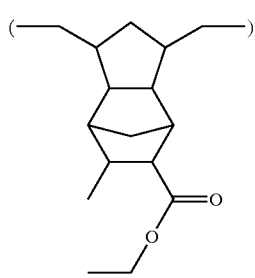
[21-3-2]
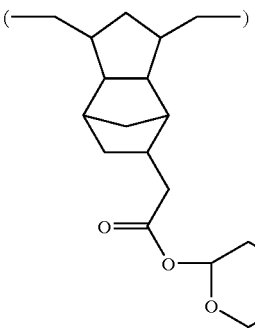
[21-3-7]
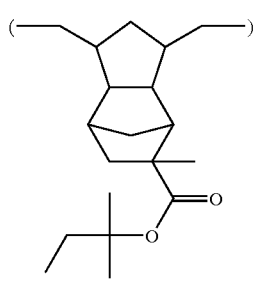
[21-3-3]
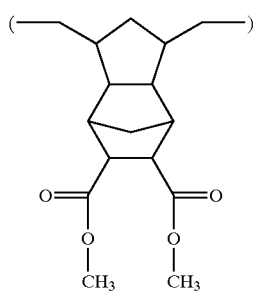
[21-3-4]
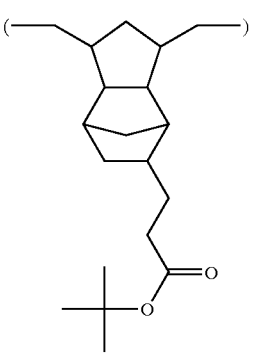
[21-3-8]
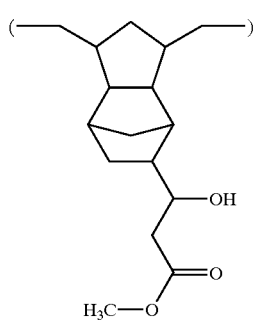
[21-3-5]
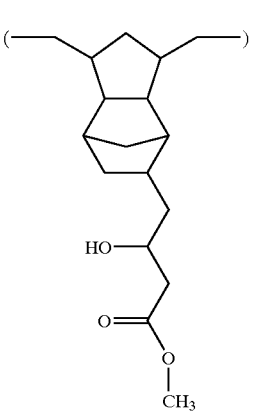
[21-3-9]
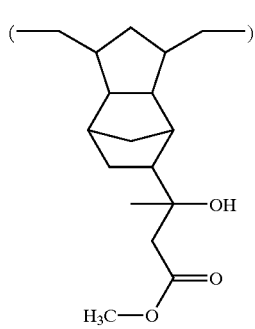
[21-3-6]
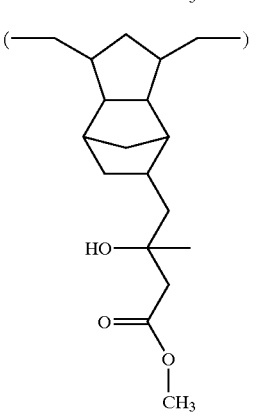
[21-3-10]

[21-3-11] 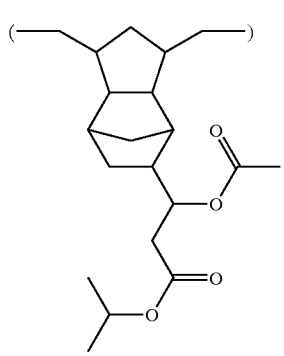
[21-3-12] 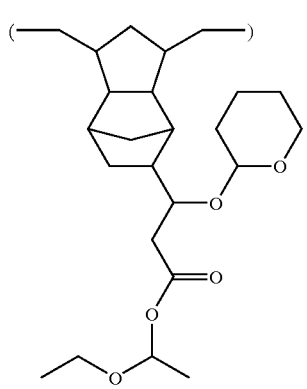
[21-3-13] 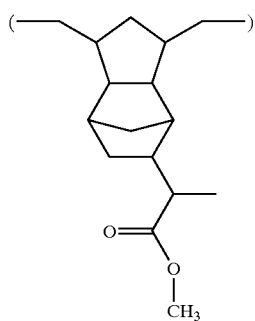
[21-3-14] 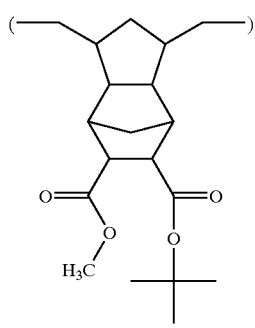
[21-3-15] 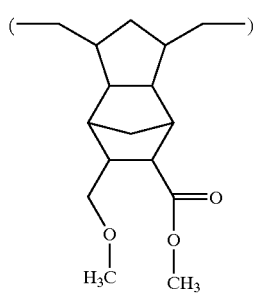
[21-3-16] 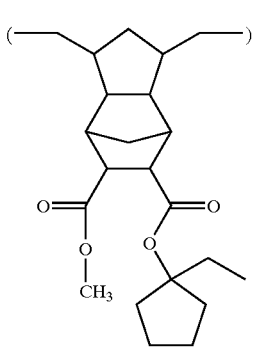
[21-4-1] 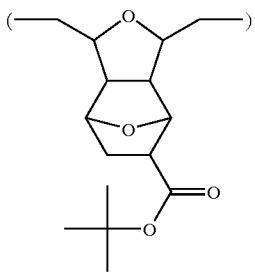
[21-4-2] 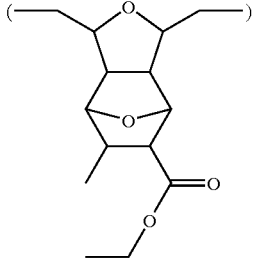
[21-4-3] 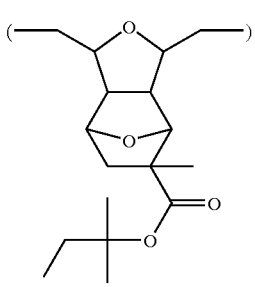
[21-4-4] 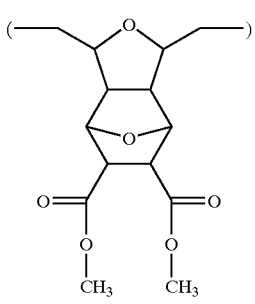

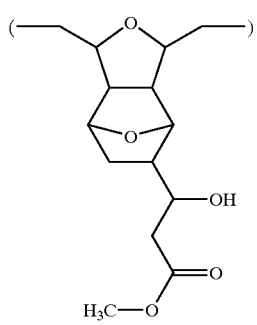
[21-4-5]
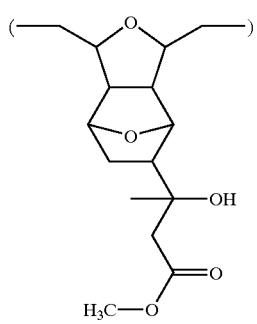
[21-4-6]
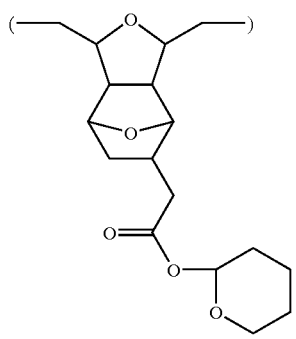
[21-4-7]
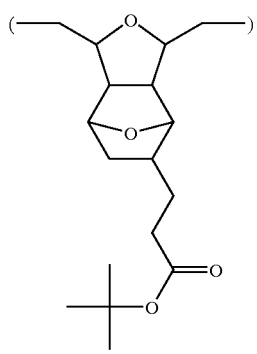
[21-4-8]
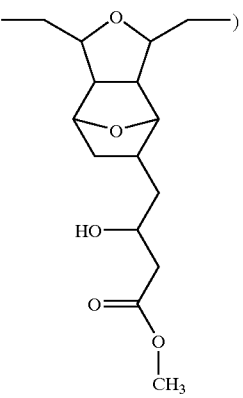
[21-4-9]
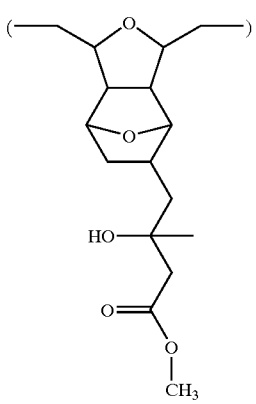
[21-4-10]
[21-4-11]
[21-4-12]

[21-4-13]

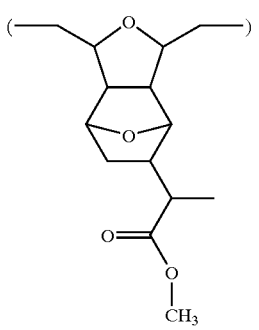

[21-4-14]

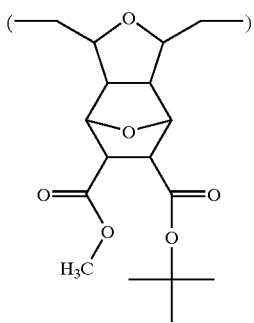

[21-4-15]

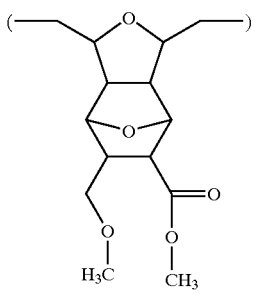

[21-4-16]

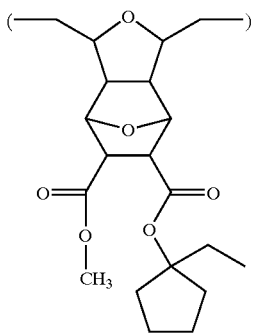

are listed.

The hydrogenated ring-opening metathesis copolymer of the present invention may further has a structural unit [F] of the following general formula [22] as a structural unit in addition to the structural units [A] and [B] and/or [B], preferably in addition to the structural unit [D], and further in addition to the structural unit [E] in some cases:

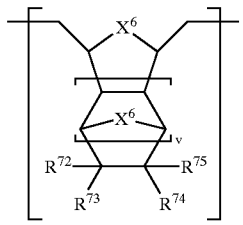

[22]

[wherein, $R^{72}$ to $R^{75}$ are selected each independently from a hydrogen atom, linear, branched or cyclic alkyl groups having 1 to 20 carbon atoms, halogens, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, hydroxy group, linear, branched or cyclic hydroxyalkyl group having 2 to 20 carbon atoms, cyano group, linear, branched or cyclic cyanoalkyl group having 2 to 20 carbon atoms, linear, branched or cyclic alkylcarbonyloxy groups having 2 to 20 carbon atoms, linear, branched or cyclic alkylcarbonyloxy-alkyl groups having 3 to 20 carbon atoms, arylcarbonyloxy groups having 6 to 20 carbon atoms, linear, branched or cyclic alkylsulfonyloxy groups having 1 to 20 carbon atoms, linear, branched or cyclic alkylsulfonyloxyalkyl groups having 2 to 20 carbon atoms, or arylsulfonyloxy groups having 6 to 20 carbon atoms, and $X^6$s may be the same or different and represent —O— or —$CR^{76}_2$— (wherein, $R^{76}$ represents a hydrogen atom or a linear or branched alkyl group having 1 to 10 carbon atoms.). v represents an integer of 0 or 1 to 3.].

The hydrogenated ring-opening metathesis copolymer of the present invention is obtained by polymerizing cyclic olefin monomers corresponding respectively to the structural unit [A] of the general formula [1], the structural unit [B] of the general formula [3] and/or the structural unit [C] of the general formula [4], and if necessary the structural unit [E] of the general formula [7], and further if necessary the structural unit [F] of the general formula [22] by using a ring-opening metathesis catalyst, and hydrogenating the resulted polymer in the presence of a hydrogenation catalyst.

The cyclic olefin monomer corresponding to the structural unit [A] of the general formula [1] is a cyclic olefin monomer having a structure of the general formula [9], the cyclic olefin monomer corresponding to the structural unit [B] of the general formula [3] is a cyclic olefin monomer having a structure of the general formula [10], the cyclic olefin monomer corresponding to the structural unit [C]of the general formula [4] cyclic olefin monomer having a structure of the general formula [11], the cyclic olefin monomer corresponding to the structural unit [E] of the general formula [7] is a cyclic olefin monomer having a structure of the general formula [12], and the cyclic olefin monomer corresponding to the structural unit [F] of the general formula [22] is a cyclic olefin monomer having a structure of the following general formula [23]:

[23]

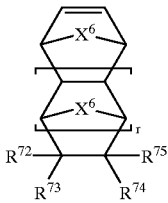

(wherein, $R^{72}$ to $R^{75}$, $X^5$ and r are as defined above.)

Specific examples of $R^{55}$ to $R^{75}$ in these formulae are substituents described previously as the respective corresponding substituents, and the same substituents including also preferable examples are listed.

Namely, the hydrogenated ring-opening metathesis copolymer of the present invention is obtained by polymerizing at least a cyclic olefin monomer of the general formula [9], a cyclic olefin monomer of the general formula [10] and/or a cyclic olefin monomer of the general formula [11], and if necessary a cyclic olefin monomer of the general formula [12], and further if necessary a cyclic olefin monomer of the general formula [23]; and a cyclic olefin monomer in which at least one of $X^1$ in the general formula [9], $X^2$ in the general formula [10] and $X^3$ in the general formula [11] represents —O—, by using a ring-opening metathesis catalyst, and hydrogenating the resulted polymer in the presence of a hydrogenation catalyst. Preferably, the charging molar ratio of a cyclic olefin monomer of the general formula [9] to a cyclic olefin monomer of the general formula [10] and a cyclic olefin monomer of the general formula [11] is from 0/100 to 99/1, preferably from 20/80 to 99/1, more preferably from 20/80 to 95/5, particularly preferably from 25/75 to 90/10, most preferably from 30/70 to 85/15. When a cyclic olefin monomer of the general formula [12] is used, it is used usually in an amount of 50 mol % or less, preferably 30 mol % or less, further preferably 20 mol % or less based on the total molar amount of olefin monomers used. When a cyclic olefin monomer of the general formula [23] is used, it is used usually in an amount of 50 mol % or less, preferably 30 mol % or less, further preferably 20 mol % or less based on the total molar amount of olefin monomers used.

It is preferable that at least one of $X^1$ in a cyclic olefin monomer of the general formula [9], $X^2$ in a cyclic olefin monomer of the general formula [10] and $X^3$ in a cyclic olefin monomer of the general formula [11] represents —O—, and the others represent —CH$_2$—, and the molar amount of a —O— unit based on the total unit molar amount of $X^1$, $X^2$ and $X^3$ is from 0.01 to 0.99, preferably from 0.02 to 0.95, more preferably from 0.05 to 0.80, most preferably from 0.10 to 0.70. Also in the case of use of cyclic olefin monomers of the general formula [12] and/or general formula [23], the molar amount of a —O— unit based on the total unit molar amount of $X^1$, $X^2$, $X^3$, $X^5$ and $X^6$ is from 0.01 to 0.99, preferably from 0.02 to 0.95, more preferably from 0.05 to 0.80, most preferably from 0.10 to 0.70.

The hydrogenated ring-opening metathesis copolymer of the present invention is obtained by polymerizing the above-mentioned olefin monomers by using a ring-opening metathesis catalyst, preferably a living ring-opening metathesis catalyst, more preferably in the presence of a chain transfer agent such as an olefin, diene and the like, in a solvent or without using a solvent, then, hydrogenating the resulted polymer using a hydrogenation catalyst in a solvent under pressure of hydrogen.

The polymerization catalyst used In the present invention may be any catalyst providing it causes ring-opening metathesis polymerization, and specific examples of the living ring-opening metathesis catalyst include tungsten-based alkylidene catalysts such as W(N-2,6-Pr$^i_2$C$_6$H$_3$)(CHBu$^t$)(OBu$^t$)$_2$, W(N-2,6-Pr$^i_2$C$_6$H$_3$)(CHBu$^t$)(OCMe$_2$CF$_3$)$_2$, W(N-2,6-Pr$^i_2$C$_6$H$_3$)(CHBu$^t$)(OCMe(CF$_3$)$_2$)$_2$, W(N-2,6-Pr$^i_2$C$_6$H$_3$)(CHCMe$_2$Ph)(OBu$^t$)$_2$, W(N-2,6-Pr$^i_2$C$_6$H$_3$)(CHCMe$_2$Ph)(OCMe$_2$CF$_3$)$_2$, W(N-2,6-Pr$^i_2$C$_6$H$_3$)(CHCMe$_2$Ph)(OCMe$_2$(CF$_3$)$_2$)$_2$ (in the formula, Pr$^i$ represents an iso-propyl group, Bu$^t$ represents a tert-butyl group, Me represents a methyl group, and Ph represents a phenyl group.) and the like, tungsten-based alkylidene catalysts such as W(N-2,6-Me$_2$C$_6$H$_3$)(CHCHCMePh)(OBu$^t$)$_2$(PMe$_3$), W(N-2,6-Me$_2$C$_6$H$_3$)(CHCHCMe$_2$)(OBu$^t$)$_2$(PMe$_3$), W(N-2,6-Me$_2$C$_6$H$_3$)(CHCHCPh$_2$)(OBu$^t$)$_2$(PMe$_3$), W(N-2,6-Me$_2$C$_6$H$_3$)(CHCHCMePh)(OCMe$_2$(CF$_3$))$_2$(PMe$_3$), W(N-2,6-Me$_2$C$_6$H$_3$)(CHCHCMe$_2$)(OCMe$_2$(CF$_3$))$_2$(PMe$_3$), W(N-2,6-Me$_2$C$_6$H$_3$)(CHCHCPh$_2$)(OCMe$_2$(CF$_3$))$_2$(PMe$_3$), W(N-2,6-Me$_2$C$_6$H$_3$)(CHCHCMe$_2$)(OCMe(CF$_3$)$_2$)$_2$(PMe$_3$), W(N-2,6-Me$_2$C$_6$H$_3$)(CHCHCPh$_2$)(OCMe(CF$_3$)$_2$)$_2$(PMe$_3$), W(N-2,6-Pr$^i_2$C$_6$H$_3$)(CHCHCMePh)(OCMe$_2$(CF$_3$))2(PMe$_3$), W(N-2,6-Pr$^i_2$C$_6$H3)(CHCHCMePh)(OCMe(CF$_3$)$_2$)$_2$(PMe$_3$), W(N-2,6-Pr$^i_2$C$_6$H$_3$)(CHCHCMePh)(OPh)$_2$(PMe$_3$) (in the formula, Pr$^i$ represents an iso-propyl group, Bu$^t$ represents a tert-butyl group, Me represents a methyl group, and Ph represents a phenyl group.) and the like, molybdenum-based alkylidene catalysts such as Mo(N-2,6-Pr$^i_2$C$_6$H$_3$)(CHBu$^t$)(OBu$^t$)$_2$, Mo(N-2,6-Pr$^i_2$C$_6$H$_3$)(CHBu$^t$)(OCMe$_2$CF$_3$)$_2$, Mo(N-2,6-Pr$^i_2$C$_6$H$_3$)(CHBu$^t$)(OCMe(CF$_3$)$_2$)$_2$, Mo(N-2,6-Pr$^i_2$C$_6$H$_3$)(CHCMe$_2$Ph)(OBu$^t$)$_2$, Mo(N-2,6-Pr$^i_2$C$_6$H$_3$)(CHCMe$_2$Ph)(OCMe$_2$CF$_3$)$_2$, Mo(N-2,6-Pr$^i_2$C$_6$H$_3$)(CHCMe$_2$Ph)(OCMe$_2$(CF$_3$)$_2$)$_2$ (in the formula, Pr$^i$ represents an iso-propyl group, Bu$^t$ represents a tert-butyl group, Me represents a methyl group, and Ph represents a phenyl group.) and the like, rhenium-based alkylidene catalysts such as Re(CBu$^t$)(CHBu$^t$)(O-2,6-Pr$^i_2$C$_6$H$_3$)$_2$, Re(CBu$^t$)(CHBu$^t$)(O-2-Bu$^t_2$C$_6$H$_4$)$_2$, Re(CBu$^t$)(CHBu$^t$)(OCMe$_2$CF$_3$)$_2$, Re(CBu$^t$)(CHBu$^t$)(OCMe(CF$_3$)$_2$)$_2$, Re(CBu$^t$)(CHBu$^t$)(O-2,6-Me$_2$C$_6$H$_3$)$_2$ (in the formula, Bu$^t$ represents a tert-butyl group.) and the like, tantalum-based alkylidene catalysts such as Ta[C(Me)C(Me)CHMe$_3$](O-2,6-Pr$^i_2$C$_6$H$_3$)$_3$Py, Ta[C(Ph)C(Ph)CHMe$_3$](O-2,6-Pr$^i_2$C$_6$H$_3$)$_3$Py (in the formula, Me represents a methyl group, Ph represents a phenyl group, and Py represents a pyridine group.) and the like, ruthenium-based alkylidene catalysts such as Ru(CHCHCPh$_2$)(PPh$_3$)$_2$Cl$_2$, Ru(CHCHCPh$_2$)(P(C$_6$H$_{11}$)$_3$)$_2$Cl$_2$ (in the formula, Ph represents a phenyl group.) and the like, and titanacyclobutane catalyst. The above-mentioned ring-opening metathesis catalyst may be used alone or in admixture of two or more.

In addition to the above-mentioned catalysts, there can also be used living ring-opening metathesis catalysts combining an organic transition metallic complex with a Lewis acid as a co-catalyst, for example, ring-opening metathesis catalysts composed of a transition metal halogen complex containing molybdenum, tungsten and the like and, an organoaluminum compound, organotin compound or organometallic compound containing lithium, sodium, magnesium, zinc, cadmium, boron and the like, as a co-catalyst.

As the specific examples of the organic transition metal halogen complex, there are listed catalysts obtained by combining tungsten-based halogen complexes such as W(N-2,6-Pr$^i_2$C$_6$H$_3$)(thf)(OBu$^t$)Cl$_2$, W(N-2,6-Pr$^i_2$C$_6$H$_3$)(thf)(OCMe$_2$CF$_3$)Cl$_2$, W(N-2,6-Pr$^i_2$C$_6$H$_3$)(thf)(OCMe(CF$_3$)$_2$)Cl$_2$, W(N-2,6-Me$_2$C$_6$H$_3$)(thf)(OBu$^t$)Cl$_2$, W(N-2,6-Me$_2$C$_6$H$_3$)(thf)(OCMe$_2$CF$_3$)Cl$_2$, W(N-2,6-Me$_2$C$_6$H$_3$)(thf)(OCMe$_2$(CF$_3$)$_2$)Cl$_2$ (in the formula, Pr$^i$ represents an iso-propyl group, Bu$^t$ represents a tert-butyl group, Me represents a methyl group, Ph represents a phenyl group, thf represents tetrahydrofuran.) and the like, with organometallic compounds described below, and catalysts obtained by combining molybdenum-based halogen complexes such as Mo(N-2,6-Pr$^i_2$C$_6$H$_3$)(thf)(OBu$^t$)Cl$_2$, Mo(N-2,6-Pr$^i_2$C$_6$H$_3$)(thf) (OCMe$_2$CF$_3$)Cl$_2$, Mo(N-2,6-Me$_2$C$_6$H$_3$)(thf)(OCMe (CF$_3$)$_2$)Cl$_2$, Mo(N-2,6-N$_2$C$_6$H$_3$)(thf)(OBu$^t$)Cl$_2$, Mo(N-2,6-Me$_2$C$_6$H$_3$)(thf)(OCMe$_2$CF$_3$)Cl$_2$, Mo(N-2,6-Me$_2$C$_6$H$_3$)(thf) (OCMe(CF$_3$)$_2$)Cl$_2$ (in the formula, Pr$^i$ represents an isopropyl group, Bu$^t$ represents a tert-butyl group, Me represents a methyl group, Ph represents a phenyl group, thf represents tetrahydrofuran.) and the like, with organometallic compounds described below.

Specific examples of the organometallic compound as a co-catalyst include organoaluminum compounds such as trimethylaluminum, triethylaluminum, triisobutylaluminum, trihexylaluminum, trioctylaluminum, triphenylaluminum, tribenzylaluminum, diethylaluminum monochloride, di-n-butylaluminum, diethylaluminum monobromide, diethylaluminum monoiodide, diethylaluminum monohydride, ethylaluminum sesquichloride, ethylaluminum dichloride and the like, organotin compounds such as tetramethyltin, diethyldimethyltin, tetraethyltin, dibutyldiethyltin, tetrabutyltin, tetraoctyltin, trioctyltin fluoride, trioctyltin chloride, trioctyltin bromide, trioctyltin iodide, dibutyltin difluoride, dibutyltin dichloride, dibutyltin dibromide, dibutyltin diiodide, butyltin trifluoride, butyltin trichloride, butyltin tribromide, butyltin triiodide and the like, organolithium compounds such as n-butyllithium and the like, organosodium compounds such as n-pentylsodium and the like, organomagnesium compounds such as methylmagnesium iodide, ethylmagnesium bromide, methylmagnesium bromide, n-propylmagnesium bromide, t-butylmagnesium chloride, allyl-magnesium chloride and the like, organozinc compounds such as diethylzinc and the like, organocadmium compounds such as diethylcadmium and the like, organoboron compounds such as trimethylboron, triethylboron, tri-n-butylboron and the like, and other organometallic compounds.

Regarding the molar ration of a cyclic olefin-based monomer to a ring-opening metathesis catalyst in the living ring-opening metathesis polymerization of the present invention, the molar ratio of a cyclic olefin-based monomer to a transition metal alkylidene complex is from 2 to 10000, preferably from 10 to 5000, in the case of a transition metal alkylidene catalyst containing tungsten, molybdenum, rhenium, tantalum, ruthenium and the like, or a titanacyclobutane catalyst. In the case of a ring-opening metathesis catalyst composed of an organic transition metal halogen complex and an organometallic compound, the molar ratio of a cyclic olefin-based monomer to an organic transition metal halogen complex is from 2 to 10000, preferably from 10 to 5000, and the molar ratio of an organometallic compound as a co-catalyst to an organic transition metal halogen complex is from 0.1 to 10, preferably from 1 to 5.

When polymerization is conducted by using a ring-opening metathesis catalyst in the present invention, it is preferable to effect polymerization in the presence of a chain transfer agent such as an olefin, diene and the like, for enhancing catalyst efficiency. As the olefin used as a chain transfer agent, there are listed, for example, α-olefins such as ethylene, propylene, butene, pentene, hexene, octene and the like, and silicon-containing olefins such as vinyltrimethylsilane, allyltrimethylsilane, allyltriethylsilane, allyltriisopropylsilane and the like, and as the diene, there are listed non-conjugated dienes such as 1,4-pentadiene, 1,5-hexadiene, 1,6-heptadiene and the like. Further, these olefins or dienes may be used alone or in combination of two or more.

Regarding the amount used of an olefin or diene allowed to co-exist in the present invention, the amount of an olefin or diene is from 0.001 to 1000-fold mol, preferably from 0.01 to 100-fold mol based on cyclic olefin-based monomers. Further, the amount of an olefin or diene is from 0.1 to 1000 equivalent, preferably from 1 to 500 equivalent based on 1 equivalent of an alkylidene in a transition metal alkylidene complex.

The ring-opening metathesis polymerization in the present invention may be effected using a solvent or without using a solvent, and as the particularly used catalyst, ethers such as tetrahydrofuran, diethyl ether, dibutyl ether, dimethoxyethane, dioxane and the like, aromatic hydrocarbons such as benzene, toluene, xylene, ethylbenzene and the like, aliphatic hydrocarbons such as pentane, hexane, heptane and the like, alicyclic hydrocarbons such as cyclopentane, cyclohexane, methylcyclohexane, dimethylcyclohexane, decalin and the like, and halogenated hydrocarbons such as methylene dichloride, dichloroethane, dichloroethylene, tetrachloroethane, chlorobenzene, trichlorobenzene and the like, are listed, and these may be used in admixture of two or more.

The concentration of ring-opening metathesis polymerization in the present invention is not uniform and varies depending on the reactivity of a cyclic olefin-based monomer, the solubility into a polymerization solvent and the like, and usually, the concentration of a cyclic olefin-based monomer in a solvent is from 0.001 to 500 mol/L, preferably from 0.01 to 100 mol/L, further preferably from 0.05 to 50 mol/L. Also the reaction temperature varies depending on the kind and amount of a cyclic olefin-based monomer and ring-opening metathesis catalyst, and the like, and usually from −30 to 150° C., preferably from 0 to 120° C., further preferably from 15 to 100° C. The reaction time is usually from 1 minute to 10 hours, preferably from 5 minutes to 8 hours, further preferably from 10 minutes to 6 hours.

After polymerization reaction, the reaction can be terminated with a de-activating agent such as aldehydes such as butylaldehyde and the like, ketones such as acetones and the like, alcohols such as methanol and the like, to obtain a ring-opening metathesis polymer solution.

In the present invention, a polymer having a desired molecular weight can be obtained by controlling the molar ratio of a monomer to a catalyst since the ring-opening metathesis polymerization for obtaining the polymer is conducted according to a living polymerization reaction. Alternatively, a polymer having a desired molecular weight can be obtained also by controlling the molar ratio of a monomer, chain transfer agent and catalyst while keeping the living polymerization reaction by conducting a living ring-opening metathesis polymerization in the presence of an olefin or diene as a chain transfer agent. The polymer obtained by this living polymerization has a number-average molecular weight Mn in terms of polystyrene of from 500 to 200,000, preferably from 1,000 to 100,000, particularly from 3,000 to 50,000. The ratio of the weight-average molecular weight Mw to the number-average molecular weight Mn (Mw/Mn) is controlled within a narrow molecular weight distribution of from 1.0 to 2.0 though it slightly differs depending on the natures of a monomer and chain transfer agent, this molecular weight distribution does not vary even after hydrogenation of this ring-opening metathesis copolymer in the presence of a hydrogenation catalyst.

This range is preferably from 1.0 to 1.8, more preferably from 1.0 to 1.6. The molecular weight in this range and the narrow molecular weight distribution are extremely important for forming a uniform and smooth coating film in a process of dissolving a resist material in a solvent and applying the solution onto a silicon wafer by a spin coater. Therefore, use of living polymerization for determining the molecular weight and molecular weight distribution as a resist material is extremely important for manifesting functions of a resist material having increased solubility in a polar solvent, improved adhesion and adhesion to the surface of a silicon wafer, and enhanced applicability to the surface thereof.

A ring-opening metathesis polymer having an olefinically unsaturated bond in the main chain part is obtained by polymerizing a cyclic olefin monomer of the present invention using a ring-opening metathesis catalyst, as described above. In the present invention, it is necessary to hydrogenate an olefin in the main chain part of a ring-opening metathesis polymer to increase the UV transmittance to the maximum extent in this range particularly against a region of ArF excimer laser having a wavelength of 193 nm, for lowering the region of the ultraviolet (UV) maximum absorption wavelength. In this hydrogenation reaction, a known hydrogenation catalyst can be used.

Specific examples of the hydrogenation catalyst include supporter type metal catalysts prepared by supporting a metal such as palladium, platinum, nickel, rhodium, ruthenium and the like on a carrier such as carbon silica, alumina, titania, magnesia, diatomaceous earth, synthetic zeolite and the like as heterogeneous catalysts, and nickel naphthenate/triethylaluminum, nickel acetylacetonate/triisobutylaluminum, cobalt octenoate/n-butyllithium, titanocene dichloride/diethylaluminum chloride, rhodium acetate, dichlorobis(triphenylphosphine) palladium, chlorotris(triphenylphosphine) rhodium, dihydridetetrakis(triphenylphosphine) ruthenium and the like as homogeneous catalysts, and further, hydrogenation can also be conducted using a hydrogenation catalyst composed of an amine compound and an organometallic complex of the following general formula [24]:

$$MH_wQ_xT_yU_z \quad [24]$$

[wherein, M represents ruthenium, rhodium, osmium, iridium, palladium, platinum or nickel, H represents a hydrogen atom, Q represents a halogen atom, T represents CO, NO, toluene, acetonitrile or tetrahydrofuran, U represents an organophosphorus compound of $PR'^1R'^2R'^3$ (P represents phosphorus, $R'^1$, $R'^2$ and $R'^3$ each independently represent the same or different linear, branched or cyclic alkyl, alkenyl, aryl, alkoxy or allyloxy.), w represents an integer of 0 or 1, x represents an integer of 1 to 3, y represents an integer of 0 or 1, and z represents an integer of 2 to 4.] in the presence of hydrogen as a homogeneous catalyst.

Q in the general formula [24] represents halogen atom, and chlorine, fluorine, bromine and iodine atoms are specifically exemplified. Further, T represents CO, NO, toluene, acetonitrile or tetrahydrofuran, and U represents an organophosphorus compound and specific examples thereof include trimethylphosphine, triethylphosphine, triisopropylphosphine, tri-n-propylphosphine, tri-t-butylphosphine, triisobutylphosphine, tri-n-butylphosphine, tricyclohexyl-phosphine, triphenylphosphine, methyldiphenylphosphine, dimethylphenylphoshpine, tri-o-tolylphosphine, tri-m-tolylphosphine, tri-p-tolylphosphine, diethylphenylphosphine, dichloro(ethyl)phosphine, dichloro(phenyl)phosphine, chlorodiphenylphosphine, trimethylphosphite, triisopropylphosphite and triphenylphosphite.

Specific examples of the organometallic complex of the general formula [24] include dichlorobis(triphenylphosphine) nickel, dichlorobis(triphenylphosphine) palladium, dichlorobis(triphenylphosphine) platinum, chlorotris(triphenylphosphine) rhodium, dichlorotris(triphenylphosphine) osmium, dichlorohydridebis(triphenylphosphine) iridium, dichlorotris(triphenylphosphine) ruthenium, dichlorotetrakis(triphenylphosphine) ruthenium, trichloronitrosylbis(triphenylphosphine) ruthenium, dichlorobis(acetonitrile)bis(triphenylphosphine) ruthenium, dichlorobis(tetrahydrofuran)bis(triphenylphosphine) ruthenium, chlorohydride(toluene)tris(triphenylphosphine) ruthenium, chlorohydridecarbonyltris(triphenylphosphine) ruthenium, chlorohydridecarbonyltris(diethylphenylphosphine) ruthenium, chlorohydridenitrosyltris(triphenylphosphine) ruthenium, dichlorotris(trimethylphosphine) ruthenium, dichlorotris(triethylphosphine) ruthenium, dichlorotris(tricyclohexylphosphine) ruthenium, dichlorotris(triphenylphosphine) ruthenium, dichlorotris(trimethyldiphenylphosphine) ruthenium, dichlorotris(tridimethylphenylphosphine) ruthenium, dichlorotris(tri-o-tolylphosphine) ruthenium, dichlorotris(dichloroethylphosphine) ruthenium, dichlorotris(dichlorophenylphosphine) ruthenium, dichlorotris(trimethylphosphite) ruthenium, dichlorotris(triphenylphoshpite) ruthenium and the like.

Specific examples of the amine compound include primary amine compounds such as methylamine, ethylamine, aniline, ethylenediamine, 1,3-diaminocyclobutane and the like, secondary amine compounds such as dimethylamine, methylisopropylamine, N-methylaniline and the like, and tertiary amine compounds such as trimethylamine, triethylamine, triphenylamine, N,N-dimethylaniline, pyridine, γ-picoline and the like, and a tertiary amine compound is preferably used, and improvement in hydrogenating rate is remarkable particularly in use of triethylamine.

These organometallic complexes and amine compounds can be respectively used in combination of two or more at any ratio.

In the case of use of a known hydrogenation catalyst for hydrogenating a ring-opening metathesis polymer in the present invention, the amount of a known hydrogenation catalyst is from 5 to 50000 ppm, preferably from 100 to 1000 ppm based on a ring-opening metathesis polymer. In the case of use of a hydrogenation catalyst composed of an organometallic complex and an amine compound, the amount of an organometallic complex is from 5 to 50000 ppm, preferably from 10 to 10000 ppm, particularly preferably from 50 to 1000 ppm based on a ring-opening metathesis polymer. Further, the amount of an amine compound is from 0.1 to 1000 equivalent, preferably from 0.5 to 500 equivalent, particularly preferably from 1 to 100 equivalent based on an organometallic complex used.

A hydrogenation catalyst composed of an organometallic complex and an amine compound can be treated previously by contacting an organometallic complex with an amine compound, before use, however, they may be added directly to a reaction system, without previous contact treatment of an organometallic complex and an amine compound.

The solvent used in hydrogenating of a ring-opening metathesis polymer may be any solvent providing it is usually used in a hydrogenation reaction, and a solvent which dissolves a ring-opening metathesis polymer and hydrogenated material thereof and which is not hydrogenated itself is preferable. Examples thereof include ethers such as tetrahydrofuran, diethyl ether, dibutyl ether, dimethoxyethane and the like, aromatic hydrocarbons such as benzene, toluene, xylene, ethylbenzene and the like, aliphatic hydrocarbons such as pentane, hexane, heptane and the like, alicyclic hydrocarbons such as cyclopentane, cyclohexane, methylcyclohexane, dimethylcyclohexane, decalin and the like, halogenated hydrocarbons such as methylene dichloride, dichloroethane, dichloroethylene, tetrachloroethane, chlorobenzene, trichlorobenzene and the like, and these may be used in admixture of two or more.

The concentration of a ring-opening metathesis polymer of the present invention in a hydrogenation reaction is not uniform and varies depending on the kinds of a ring-opening metathesis polymer, hydrogenation catalyst and solvent, and usually, the concentration of a ring-opening metathesis polymer in a solvent is from 0.01 g to 10 kg/L, preferably from 0.1 g to 5 kg/L, further preferably from 0.5 g to 1 kg/L.

The hydrogenation reaction of a ring-opening metathesis polymer is conducted under a hydrogen pressure of usually from a normal pressure to 30 MPa, preferably from 0.5 to 20 MPa, particularly preferably from 2 to 15 MPa, and the reaction temperature thereof is usually from 0 to 300° C., preferably from room temperature to 250° C., particularly preferably from 50 to 200° C. The reaction time thereof is usually from 1 minute to 50 hours, preferably from 10 minutes to 20 hours, further preferably from 30 minutes to 10 hours.

In production of a hydrogenated ring-opening metathesis polymer in the present invention, a ring-opening metathesis polymer can be isolated from a ring-opening metathesis polymer solution before re-dissolution into a solvent, however, a method can also be adopted in which a hydrogenation reaction is conducted by adding a hydrogenation catalyst composed of the above-mentioned organometallic complex and amine compound without isolating the ring-opening methathesis polymer.

After the completion of a ring-opening metathesis polymerization or hydrogenation reaction, a ring-opening metathesis catalyst or a hydrogenation catalyst remaining in a polymer can be removed by a known method. For example, filtration, an adsorption method using an adsorbing agent, a method in which an organic acid such as lactic acid and the like, a poor solvent and water are added to a solution containing a good solvent and this system is removed by extraction at normal temperature or under heat, further, a method in which a solution containing a good solvent or a polymer slurry is subjected to a contact treatment with a basic compound and an acidic compound, then, removed by washing, and other methods are listed.

A method of recovering a hydrogenated polymer from a solution of a hydrogenated ring-opening metathesis polymer is not particularly restricted, and known methods can be adopted. For example, a filtration method in which a reaction solution is discharged into a poor solvent under stirring to coagulate a hydrogenated polymer, a centrifugal separation method, methods of recovering by a decantation method and the like, a steam stripping method in which steam is blown into a reaction solution to precipitate a hydrogenated polymer, methods of directly removing a solvent from a reaction solution by heating and the like, and other methods are listed.

When a hydrogenating method in the present invention is used, hydrogenating rates of 90% or more can be easily attained, and hydrogenating rates of 95% or more, particularly of 99% or more are possible, and thus obtained cyclic olefin-based hydrogenated ring-opening metathesis polymer is not easily oxidized, and an variable hydrogenated ring-opening metathesis polymer is obtained.

The above-mentioned methods can produce a hydrogenated ring-opening metathesis polymer which contains if necessary a structural unit [A] of the general formula [1], contains at least a structural unit [B] of the general formula [3] and/or a structural unit [C] of the general formula [4], and constituted of if necessary a structural unit [E] of the general formula [7], further if necessary a structural unit [F] of the general formula [22], and in which at least one of $X^1$ in the structural unit [A] of the general formula [1], $X^2$ in the structural unit [B] of the general formula [3] and $X^3$ in the structural unit [C] of the general formula [4] represents —O—, the constituting molar ratio of [A]/([B] and [C]) is 0/100 to 99/1, preferably 20/80 to 99/1, and the ratio of the weight-average molecular weight Mw to the number-average molecular weight Mn (Mw/Mn) is 1.0 to 2.0.

In the present invention, a hydrogenated ring-opening metathesis polymer which contains a structural unit [A] of the general formula [1] and, a structural unit [B] of the general formula [3] and/or a structural unit [C] of the general formula [4], a structural unit [D] of the general formula [5], and if necessary a structural unit [E] of the general formula [7], further if necessary a structural unit [F] of the general formula [7], and in which at least one of $X^1$ in the structural unit [A] of the general formula [1], $X^2$ in the structural unit [B] of the general formula [3] and $X^3$ in the structural unit [C] of the general formula [4] represents —O—, the constituting molar ratio of [A]/([B] and [C]) is 20/80 to 99/1, and the ratio of the weight-average molecular weight Mw to the number-average molecular weight Mn (Mw/Mn) is 1.0 to 2.0 can be produced by decomposing, in a hydrogenated ring-opening metathesis polymer obtained as described above, at least part of a tertiary ester group of a cyclic alkyl in the general formula [2] and/or an ester group in the general formula [8] to convert it into a carboxylic acid.

As the method of decomposing at least part of a tertiary ester group of a cyclic alkyl in the general formula [2] and/or an ester group in the general formula [8] to convert it into a carboxylic acid, a method using hydrolysis and/or a method using acidolysis can be usually used, and as the method using hydrolysis, any of acidic hydrolysis conducted in the presence of an acidic catalyst such as sulfuric acid, hydrochloric acid, nitric acid, toluenesulfonic acid, trifluoroacetic acid, acetic acid and the like, alkaline hydrolysis conducted in the presence of an alkaline catalyst such as sodium hydroxide, potassium hydroxide, barium hydroxide and the like, and neutral hydrolysis using sodium acetate, lithium iodide and the like instead of the acidic or alkaline catalyst can be used. The method using hydrolysis essentially requires the presence of water in the system, and the amount of water used is not less than the molar amount equivalent to that of an ester group to be converted into a carboxylic acid, and preferably 5-fold mol or more, further preferably 10-fold mol or more, most preferably 20-fold mol or more. In the method using acidolysis, acids such as sulfuric acid, hydrochloric acid, nitric acid, toluenesulfonic acid, trifluoroacetic acid, acetic acid and the like can be used. In the method using acidolysis, water may be present in the system though the presence of water is not essential. The amount of an acid catalyst, alkaline catalyst and neutral hydrolysis catalyst used in the method using hydrolysis and an acid used in the method using acidolysis is usually 50 mol or less, preferably from 0.00001 to 30 mol, further preferably from 0.001 to 10 mol based on 1 mol of an ester group to be converted into a carboxylic acid.

The hydrolysis reaction and acidolysis reaction in the method of the present invention may use a water solvent or an organic solvent, and particularly, examples of the organic solvent used include alcohols such as methanol, ethanol and the like, ketones such as acetone and the like, ethers such as tetrahydrofuran, diethyl ether, dibutyl ether, dimethoxyethane, dioxane and the like, aromatic hydrocarbons such as benzene, toluene, xylene, ethylbenzene and the like, aliphatic hydrocarbons such as pentane, hexane, heptane, cyclohexane and the like, carboxylic acids such as acetic acid and the like, nitro compounds such as nitromethane and the like, pyridines such as pyridine, lutidine and the like, formamides such as dimethylformamide and the like, and they may be mixed with water or alcohols, or only the organic solvent may be used. Further, two or more among them may be mixed and used. The reaction temperature is usually from 0 to 300° C., preferably from room temperature to 250° C., more preferably from room temperature to 200° C. The reaction time is usually from 1 minute to 100 hours, preferably from 5 minutes to 30 hours, more preferably from 10 minutes to 20 hours.

Embodiments of the hydrolysis reaction and acidolysis reaction in the method of the present invention are not particularly restricted, and any embodiment is permissible providing the hydrolysis reaction and acidolysis reaction can be carried out effectively, and any embodiments under an inert gas atmosphere such as nitrogen and the like, under an air atmosphere, or at reduced pressure, normal pressure, increased pressure, or by batchwise, semi-batchwise or continuous mode may be admitted.

Further, after the completion of the hydrolysis reaction or acidolysis reaction, neutralization treatment may be effected appropriately with an alkali or acid. The method of recovering a polymer from a solution or slurry of a hydrogenated ring-opening metathesis polymer, after the hydrolysis reaction or acidolysis reaction, is not particularly restricted, and known methods can be used. For example, in the case of a solution, methods in which a reaction solution is discharged into a poor solvent under stirring to precipitate a polymer hydrogenated material forming a slurry, and the polymer is recovered by a filtration method, centrifugal separation method, decantation method and the like, a steam stripping method in which steam is blown into a reaction solution to precipitate a polymer, methods of directly removing a solvent from a reaction solution by heating and the like are listed, and in the case of a slurry, methods of recovering a polymer from a slurry itself by a filtration method, centrifugal separation method, decantation method and the like, and other recovering method are listed.

The above-mentioned methods can produce a hydrogenated ring-opening metathesis polymer which contains if necessary a structural unit [A] of the general formula [1], contains a structural unit [B] of the general formula [3] and/or a structural unit [C] of the general formula [4], a structural unit [D] of the general formula [5], and if necessary a structural unit [E] of the general formula [7], further if necessary a structural unit [F] of the general formula [22], and in which at least one of $X^1$ in the structural unit [A] of the general formula [1], $X^2$ in the structural unit [B] of the general formula [3] and $X^3$ in the structural unit [C] of the general formula [4] represents —O—, the constituting molar ratio of [A]/([B] and [C]) is 0/100 to 99/1, preferably 20/80 to 99/1, and the ratio of the weight-average molecular weight Mw to the number-average molecular weight Mn (Mw/Mn) is 1.0 to 2.0.

Further, in the present invention, a hydrogenated ring-opening metathesis polymer which contains if necessary a structural unit [A] of the general formula [1] and, contains a structural unit [B] of the general formula [3] and/or a structural unit [C] of the general formula [4], if necessary a structural unit [D] of the general formula [5], further if necessary a structural unit [E] of the general formula [7], furthermore if necessary a structural unit [F] of the general formula [22], and in which at least one of $X^1$ in the structural unit [A] of the general formula [1], $X^2$ in the structural unit [B] of the general formula [3] and $X^3$ in the structural unit [C] of the general formula [4] represents —O—, the constituting molar ratio of [A]/([B] and [C]) is 0/100 to 99/1, preferably 20/80 to 99/1, and the ratio of the weight-average molecular weight Mw to the number-average molecular weight Mn (Mw/Mn) is 1.0 to 2.0 can be produced by converting a carboxylic acid functional group of a hydrogenated ring-opening metathesis polymer having a carboxylic acid functional group obtained as described above, into an ester.

As the method of converting a carboxylic acid functional group into an ester, conventional methods can be applied. For example, esterification by a dehydrocondensation reaction with alcohols, esterification by using an ortho-alkylating agent, esterification by addition of olefins in the presence of an acid, esterification by a condensation reaction with a halide using an organic basic compound, alkoxyalkyl esterification by addition of alkyl vinyl ethers, and the like are listed. The method further includes method of converting a carboxylic acid into an acid halide by using thionyl chloride and then esterifying the acid halide by contacting with alcohol, method of esterifying a metal salt of the carboxylic acid, and the like.

As alcohols used in the esterification by a dehydrocondensation reaction with alcohols, any alcohols usually used in esterification can be used, and aliphatic alcohols such as, for example, methanol, ethanol, 1-propanol, 2-propanol, 1-butanol, 2-butanol, tert-butanol, 1-pentanol, tert-amylalcohol, 3-methyl-3-pentanol, 3-ethyl-3-pentanol, cyclopentanol, cyclopentanemethanol, 1-methylcyclopentanol, 1-ethylcyclopentanol, cyclohexanol, cyclohexylmethanol, dicyclohexylmethanol, tricyclohexylmethanol, 1-methylcyclohexanol, norborneol, 1-adamantanol, 2-adamantanol, 2-methyl-2-adamantanol, 1-adamantanemethanol and the like are preferable. The amount of these alcohols is usually 100 mol or less, preferably from 1 to 50 mol, further preferably from 2 to 30 mol based on 1 mol of a carboxylic acid to be converted into an ester. The esterification by a dehydrocondensation reaction with alcohols is usually conducted in the presence of an acid, and examples of such an acid include hydrogen halides such as a hydrogen chloride gas and the like, mineral acids such as sulfuric acid, phosphoric acid, hydrochloric acid, hydrobromic acid and the like, solid acids such as heteropolyacid, Nafion$^R$ and the like, organic acids such as p-toluenesulfonic acid, trifluoroacetic acid, propionic acid, malonic acid, oxalic acid, chlorosulfonic acid•pyridine salt, trifluoroacetic acid•pyridine salt, sulfuric acid•pyridine salt, p-toluenesulfonic acid•pyridine salt and the like, Lewis acids such as boron-trifluoride etherate and the like. The amount of these acids is usually 10 mol or less, preferably from 0.00001 to 2 mol, further preferably from 0.001 to 0.5 based on 1 mole of a carboxylic acid to be converted into an ester. Further, there can also be used methods using an acidic ion exchange resin, for example, a method of effecting solvent-reflux using a Soxhlet extraction apparatus containing a charged drying agent such as, for example, anhydrous magnesium sulfate, molecular sieve and the like, for example, a method of allowing a dehydrating agent such as DCC and the like to co-exist, a method using an extremely surplus amount of alcohol, and other methods.

As the alkylating agent used in the esterification by an ortho-alkylating agent, any alkylating agents usually used in esterification of a carboxylic acid can be used, and for example, diazoalkanes such as diazomethane and the like, or, trialkyl orthocarboxylates such as, for example, triethyl orthoformate, trimethyl orthoacetate and the like, are preferable. The amount of these alkylating agents is usually 50 mol or less, preferably from 1 to 30 mol, further preferably from 2 to 20 mol based on 1 mol of a carboxylic acid to be converted into an ester.

As the olefins used in the esterification by addition of olefins in the presence of an acid, any olefins usually used in esterification can be used, and for example, aliphatic alkenes such as, for example, 2-methylpropene, 2-methyl-1-butene, 2-ethyl-1-butene, 2-methyl-2-butene, 3-methyl-2-pentene, 1-methyl-1-cyclopentene, 1-methyl-1-cyclohexene, methylenecyclopentane, methylenecyclohexane, ethylidenecyclohexane and the like are preferable. The amount of these olefins is usually 100 mol or less, preferably from 1 to 50 mol, further preferably from 2 to 30 mol based on 1 mol of a carboxylic acid to be converted into an ester. The esterification by addition of olefins is conducted in the presence of an acid, and examples of such an acid include hydrogen halides such as a hydrogen chloride gas and the like, mineral acids such as sulfuric acid, phosphoric acid, hydrochloric acid, hydrobromic acid and the like, solid acids such as heteropolyacid, Nafion$^R$ and the like, organic acids such as p-toluenesulfonic acid, trifluoroacetic acid, propionic acid, malonic acid, oxalic acid, chlorosulfonic acid-pyridine salt, trifluoroacetic acid-pyridine salt, sulfuric acid-pyridine salt, p-toluenesulfonic acid-pyridine salt and the like, Lewis acids such as borontrifluoride etherate and the like. The amount of these acids is usually 10 mol or less, preferably from 0.00001 to 2 mol, further preferably from 0.001 to 0.5 based on 1 mole of a carboxylic acid to be converted into an ester.

As the alkyl vinyl ethers used in the alkoxyalkylesterification by addition of alkyl vinyl ethers, alkoxy-substituted, non-substituted or cyclic alkyl vinyl ethers such as, for example, methyl vinyl ether, ethyl vinyl ether, n-propyl vinyl ether, isopropyl vinyl ether, n-butyl vinyl ether, sec-butyl vinyl ether, tert-butyl vinyl ether, isooctyl vinyl ether, decyl vinyl ether, dodecyl vinyl ether, cyclohexyl vinyl ether, 2-ethylhexyl vinyl ether, tert-pentyl vinyl ether, octadecyl vinyl ether, cesyl vinyl ether, 2-methoxyethyl vinyl ether, vinyl-2-(2-ethoxyethoxy) ethyl ether, ethylene glycol butyl vinyl ether, tert-amyl vinyl ether, or 2,3-dihydrofuran, 3,4-dihydro-2H-pyrane, 1,4-dioxene and the like are preferable. Further, among them ethyl vinyl ether, n-propyl vinyl ether, isopropyl vinyl ether, n-butyl vinyl ether, 2,3-dihydrofuran, 3,4-dihydro-2H-pyrane are more preferable. The amount of these alkyl vinyl ethers is usually 50 mol or less, preferably from 1 to 30 mol, further preferably from 2 to 20 mol based on 1 mol of a carboxylic acid to be converted into an ester.

The alkoxyalkylesterification by addition of alkyl vinyl ethers is conducted usually in the presence of an acid, and examples of such an acid include hydrogen halides such as a hydrogen chloride gas and the like, mineral acids such as sulfuric acid, phosphoric acid, hydrochloric acid, hydrobromic acid and the like, solid acids such as heteropolyacid, Nafion$^R$ and the like, organic acids such as p-toluenesulfonic acid, trifluoroacetic acid, propionic acid, malonic acid, oxalic acid, chlorosulfonic acid•pyridine salt, trifluoroacetic acid•pyridine salt, sulfuric acid•pyridine salt, p-toluenesulfonic acid•pyridine salt and the like, and among them, a hydrogen chloride gas, hydrochloric acid, trifluoroacetic acid, trifluoroacetic acid•pyridine salt, p-toluenesulfonic acid•pyridine salt and sulfuric acid•pyridine salt are preferably used. These acids can be used alone or in combination of two or more, and simultaneously or sequentially. The amount of these acid catalysts is usually 10 mol or less, preferably from 0.00001 to 2 mol, further preferably from 0.001 to 0.5 based on 1 mole of a carboxylic acid to be converted into an ester.

In the method of converting a carboxylic acid functional group into an ester in the method of the present invention, a solvent is usually used. These solvents differ depending on the method used and the kind of the intended ester, and the like, and any of a water solvent and organic solvents may be used, and particularly, examples of the organic solvent used include alcohols such as methanol, ethanol and the like, ketones such as acetone and the like, ethers such as tetrahydrofuran, diethyl ether, dibutyl ether, dimethoxyethane, dioxane and the like, aromatic hydrocarbons such as benzene, toluene, xylene, ethylbenzene and the like, aliphatic hydrocarbons such as pentane, hexane, heptane, cyclohexane, decalin and the like, halogenated hydrocarbons such as methylene chloride, dichloroethane, tetrachloroethane, chloroform, chlorobenzene, orthodichlorobenzene and the like, carboxylic acids such as acetic acid and the like, nitro compounds such as nitromethane and the like, pyridines such as pyridine, lutidine and the like, formamides such as dimethylformamide and the like, and they may be mixed with water or alcohols, or only the organic solvent may be used. Further, two or more among them may be mixed and used. The reaction temperature is usually from 0 to 200° C., preferably from 10 to 150° C., more preferably from 0 to 200° C. The reaction time is usually from 1 minute to 100 hours, preferably from 5 minutes to 30 hours, more preferably from 10 minutes to 20 hours.

Embodiments of converting a carboxylic acid functional group into an ester in the method of the present invention are not particularly restricted, and any embodiment is permissible providing converting of a carboxylic acid functional group into an ester can be carried out effectively, and any embodiments under an inert gas atmosphere such as nitrogen and the like, under an air atmosphere, or at reduced pressure, normal pressure, increased pressure, or by batch-wise, semibatch-wise or continuous mode may be admitted.

Further, after conversion of a carboxylic acid functional group into an ester, neutralization treatment may be effected appropriately with an alkali or acid. The method of recovering a polymer from a solution or slurry of a hydrogenated ring-opening metathesis polymer, after conversion of a carboxylic acid functional group into an ester, is not particularly restricted, and known methods can be used. For example, in the case of a solution, methods in which a reaction solution is discharged into a poor solvent under stirring to precipitate a polymer hydrogenated material forming a slurry, and the polymer is recovered by a filtration method, centrifugal separation method, decantation method and the like, a steam stripping method in which steam is blown into a reaction solution to precipitate a polymer, methods of directly removing a solvent from a reaction solution by heating and the like are listed, and in the case of a slurry, methods of recovering a polymer from a slurry itself by a filtration method, centrifugal separation method, decantation method and the like, and other recovering method are listed.

The above-mentioned methods can produce a hydrogenated ring-opening metathesis polymer which contains if necessary a structural unit [A] of the general formula [1], contains a structural unit [B] of the general formula [3] and/or a structural unit [C] of the general formula [4], if necessary a structural unit [D] of the general formula [5], further if necessary a structural unit [E] of the general formula [7], furthermore if necessary a structural unit [F] of the general formula [22], and in which at least one of $X^1$ in the structural unit (A) of the general formula [1], $X^2$ in the structural unit [B] of the general formula [3] and $X^3$ in the structural unit [C] of the general formula [4] represents —O—, the constituting molar ratio of [A]/([B] and [C]) is 0/100 to 99/1, preferably 20/80 to 99/1, and the ratio of the weight-average molecular weight Mw to the number-average molecular weight Mn (Mw/Mn) is 1.0 to 2.0.

The hydrogenated ring-opening metathesis polymer of the present invention is useful as a base polymer for a photoresist. For example, it is used together with an acid generator and a solvent providing a positive resist composition. Here, the acid generator is a substance which, when exposed to an activating radiation ray, generates Brønsted acid or Lewis acid. Further, into a resist composition, a dissolution inhibitor, surfactant, preservation stabilizer, sensitizer, striation preventing agent and the like can be added. This resist composition can be, for example, applied to the surface of a substrate such as a silicon wafer and the like by a conventional method such as spin coating and the like before removal of a solvent by drying, to form a resist film, and exposure for pattern formation is effected by irradiating a resist film with far ultraviolet ray, KrF excimer laser, ArF excimer laser, electron beam, and if thermal treatment (bake after exposure) is further conducted, further high sensitization can be carried out. Then, the exposed part is washed off by a developer such as an alkali aqueous solution and the like, to obtain a relief pattern. A relief pattern formed by using a hydrogenated ring-opening metathesis polymer of the present invention is extremely excellent in both of resolution and contrast. Further, a substrate can be etched by using a pattern formed as described above as a mask.

In the present invention, the molar ratio of a structural unit [A] of the general formula [1] to a structural unit [B] of the general formula [2] and/or a structural unit [C] of the general formula [4] ([A]/([B] and [C])) is 20/80 to 99/1. Here, the structural unit [A] contains a tertiary ester group of a cyclic alkyl which is a group decomposed by an acid generated from a sensitizing agent in exposure, and necessary for making a resist pattern by development with an alkali aqueous solution, after exposure, and the structural units [B] and [C] are necessary for manifesting adhesion with a treating substrate such as a silicon substrate. If this molar ratio [A]/([B] and [C]) is less than 20/80, development is insufficient, and if over 99/1, adhesion with a treating substrate is not manifested. The structural unit [D] of the general formula [6] contains a carboxyl group, and can improved adhesion with a treating substrate such as a silicon substrate and can improve solubility into a solvent. Further, if the molar ratio of the structural units [A], [B] and [C] to the structural unit [D] ([A]+[B]+[C])/[D] is from 100/0 to 20/80, wet tension is improved in development with an alkali aqueous solution after exposure, and development irregularity is resolved. This range including these structural units is suitable for preparing a resist composition, and is extremely important for a resist material which is dissolved together with a sensitizing agent having high polarity into a polar solvent such as, for example, 2-heptanone and the like and applied to a treating substrate such as a silicon substrate. Namely, a uniform and smooth coating film can be formed by enhancing the solubility in a polar solvent or the dissolving speed, in preparing a resist composition using a hydrogenated ring-opening metathesis polymer. Further, inclusion of the structural unit [E] in addition to the structural units [A] and [B] and/or [C] indicates inclusion of an ester group having different reactivity from that of an ester group contained in the structural unit [A], and is useful since, consequently, decomposing property in exposure can be freely controlled. In this case, the preferable molar ratio of the structural units ([A]+[B]+[C])/[E] is from 100/0 to 40/60.

Further, particularly a hydrogenated ring-opening metathesis polymer in which at least one of $X^1$ in the structural unit [A] of the general formula [1], $X^3$ in the structural unit [B] of the general formula [3] and $X^3$ in the structural unit [C] of the general formula [4] represents —O— and the others represent —$CH_2$— has effects of improving adhesion to a treating substrate such as a silicon substrate, improving wet tension in development with an alkali aqueous solution, and further improving solubility into a polar organic solvent of ketones, alcohols and the like used in a process of applying a resist agent onto a silicon wafer. Further, affinity to water is also improved, and developing property with a releasing agent (or developer) such as an alkali aqueous solution and the like after exposure is also improved.

The following examples illustrate the present invention in detail below, but do not restrict the scope of the invention.

Values of the physical properties of polymers obtained in examples were measured according to the following methods.

Average molecular weight; The resulted cyclic olefin-based ring-opening metathesis polymer and a hydrogenated material of this polymer were dissolved in tetrahydrofuran, and the molecular weight was calibrated by GPC, using 830-RI and 875-UV manufactured by Nippon Bunko K.K. as a detector and Shodex k-805, 804, 803, 802.5 as a column, at room temperature and a flow rate of 1.0 ml/min. and utilizing polystyrene standard.

Hydrogenating rate; A powder of a cyclic olefin-based hydrogenated ring-opening metathesis polymer was dissolved in deuterated chloroform, and reduction degree of the peak assigned to a carbon-carbon double bond in the main chain at δ=4.0 to 6.5 ppm caused by a hydrogenation reaction was calculated by using 270 MHz-$^1$H NMR.

The proportion of carboxylic acid contained in the polymer; It was measured by neutralization titration using Bromothymol Blue as an indicator.

UV absorption spectrum; A solution was applied onto a quartz glass plate by using a spin coater at a rotation of 3000 rpm to give a film thickness of 1.0 μm, and the UV absorption spectrum was measured by Shimadzu UV-3100.

Adhesion strength to a silicon wafer substrate; A solution was likewise applied onto a substrate by a spin coater, and the resulting polymer film was baked for 10 minutes at 120° C., and scratched to form cross cut according to the test method of JIS D0202, peeling was effected with a adhesive cellophane tape, and peeled states were observed visually.

Criteria: ⊚: peeling of less than 5%, ◯: peeling of 5 to 20%, Δ: peeling of 20 to 50%, ×: peeling of 50% or more

EXAMPLE 1

In a 300 ml Schlenk flask, 3,6-epoxy-1,2,3,6-tetrahydrophthalide (2.43 g, 16 mmol) and 8-(1'-ethylcyclopentoxy)carbonyltetracyclo[4.4.0.12, 5.17, 10]-3-dodecene (7.21 g, 24 mmol) were dissolved, as cyclic olefin monomers, in tetrahydrofuran (hereinafter, referred to as THF), under a nitrogen atmosphere. To this was added W(N-2,6-$Me_2C_6H_3$)(CHCHC$Me_2$)(OC(CF$_3$)$_2$Me)$_2$(PMe$_3$)

(462 mg, 0.57 mmol) as a ring-opening metathesis polymerization catalyst, and the mixture was reacted for 1 hour at room temperature. Then, butylaldehyde (205 mg, 2.85 mmol) was added and the mixture was stirred for 30 minutes to terminate the reaction.

This ring-opening metathesis polymer solution was added into methanol to precipitate a ring-opening metathesis polymer, which was filtrated, washed with methanol, and dried in vacuo, to give 9.46 g of a ring-opening metathesis polymer powder.

Then, in a 200 ml autoclave, 9.0 g of this ring-opening metathesis polymer powder was dissolved in THF (100 ml), and to this was added a previously prepared solution of dichlorotetrakis(triphenylphosphine) ruthenium (27 mg, 0.022 mol) and triethylamine (11.3 mg, 0.108 mmol) in THF (20 ml) as a hydrogenation catalyst, and a hydrogenation reaction was conducted for 5 hours at a hydrogen pressure of 8.1 MPa and a temperature of 165° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 8.0 g of a hydrogenated ring-opening metathesis polymer in the form of a white powder. The hydrogenating rate calculated from $^1$H-NMR of the resulted hydrogenated ring-opening metathesis polymer did not manifest a peak assigned to a proton of an olefin in the main chain, and the hydrogenating rate was 100%, and the number-average molecular weight Mn in terms of polystyrene standard measured by GPC was 37,600 and Mw/Mn was 1.10. The composition ratio of the structural units [A]/[B] in the resulted polymer was 60/40. The 1H-NMR spectrum (270 MHz, solvent: deuterated chloroform) of the hydrogenated ring-opening metathesis polymer obtained in Example 1 is shown in FIG. 1.

EXAMPLE 2

Ring-opening metathesis polymerization was conducted in the same manner as in Example 1 except that the cyclic olefin monomers were changed to 6,9-methylene-2-oxaspiro[4,5]7-decen-1-one (1.31 g, 8 mmol), 3,6-epoxy-1,2,3,6-tetrahydrophthalide (1.83 g, 12 mmol) and 8-(1'-ethylcyclopentoxy)carbonyltetracyclo[4.4.0.12, 5.17, 10]-3-dodecene (6.01 g, 20 mmol) in Example 1, to give 9.10 g of a ring-opening metathesis polymer.

Further, 9.0 g of the resulted ring-opening metathesis polymer was subjected to a hydrogenation reaction for 5 hours at a hydrogen pressure of 8.1 MPa and a temperature of 165° C. in the same manner as in Example 1, to provide 8.4 g of a hydrogenated ring-opening metathesis polymer in the form of a white powder. The hydrogenating rate calculated from $^1$H-NMR of the resulted hydrogenated ring-opening metathesis polymer did not manifest a peak assigned to a proton of an olefin in the main chain, and the hydrogenating rate was 100%, and the number-average molecular weight Mn in terms of polystyrene standard measured by GPC was 35,600 and Mw/Mn was 1.20. The composition ratio of the structural units [A]/[B]/[C] in the resulted polymer was 50/30/20.

EXAMPLE 3

Ring-opening metathesis polymerization was conducted in the same manner as in Example 1 except that the ring-opening metathesis polymerization catalyst was changed to Mo(N-2,6-iPr$_2$C$_6$H$_3$)(CHCMe$_3$)(OC(CF$_3$)$_2$Me)$_2$ (198 mg, 0.286 mmol), to give 9.25 g of a ring-opening metathesis polymer.

Then, in a 200 ml autoclave, 9.0 g of this ring-opening metathesis polymer powder was dissolved in THF (100 ml), and to this was added a previously prepared solution of chlorohydridecarbonyltris (triphenylphosphine) ruthenium (27 mg, 0.022 mol) and triethylamine (11.3 mg, 0.108 mmol) in THF (20 ml) as a hydrogenation catalyst, and a hydrogenation reaction was conducted for 5 hours at a hydrogen pressure of 8.1 MPa and a temperature of 165° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 8.1 g of a hydrogenated ring-opening metathesis polymer in the form of a white powder. The hydrogenating rate calculated from $^1$H-NMR of the resulted hydrogenated ring-opening metathesis polymer did not manifest a peak assigned to a proton of an olefin in the main chain, and the hydrogenating rate was 100%, and the number-average molecular weight Mn in terms of polystyrene standard measured by GPC was 75,200 and Mw/Mn was 1.15. The composition ratio of the structural units [A]/[B] in the resulted polymer was 60/40.

EXAMPLE 4

Ring-opening metathesis polymerization was conducted in the same manner as in Example 2 except that the ring-opening metathesis polymerization catalyst was changed to Ru(P(C$_6$H$_{11}$)$_3$)$_2$(CHPh)Cl$_2$ (470 mg, 0.57 mmol), to give 9.0 g of a ring-opening metathesis polymer.

Further, 9.0 g of the resulted ring-opening metathesis polymer was subjected to a hydrogenation reaction for 5 hours at a hydrogen pressure of 8.1 MPa and a temperature of 165° C. in the same manner as in Example 2, to provide 8.6 g of a hydrogenated ring-opening metathesis polymer in the form of a white powder. The hydrogenating rate calculated from $^1$H-NMR of the resulted hydrogenated ring-opening metathesis polymer did not manifest a peak assigned to a proton of an olefin in the main chain, and the hydrogenating rate was 100%, and the number-average molecular weight Mn in terms of polystyrene standard measured by GPC was 33,100 and Mw/Mn was 1.37. The composition ratio of the structural units [A]/[B]/[C] in the resulted polymer was 50/30/20.

EXAMPLE 5

In a 1000 ml autoclave equipped with a magnetic stirrer, 3,6-epoxy-1,2,3,6-tetrahydrophthalide (17.0 g, 111.7 mmol) and 8-(1'-ethylcyclopentoxy)carbonyltetracyclo[4.4.0.12, 5.17, 10]-3-dodecene (33.57 g, 111.7 mmol) were dissolved, as cyclic olefin monomers, in tetrahydrofuran (550 ml), under a nitrogen atmosphere. To this was added 1,5-hexadiene (1.5 ml, 12.3 mmol) as a chain transfer agent and Mo(N-2,6-iPr$_2$C$_6$H$_3$)(CHCMe$_2$)(OC(CF$_3$)$_2$Me)$_2$ (786 mg, 1,12 mmol) as a ring-opening metathesis polymerization catalyst, and they were reacted for 2 hours at room temperature. Then, butylaldehyde (404 mg, 5.60 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 42.5 g of a ring-opening metathesis polymer powder.

Then, in a 1000 ml autoclave, 40.0 g of this ring-opening metathesis polymer powder was dissolved in THF (400 ml), and to this was added a previously prepared solution of chlorohydridecarbonyltris(triphenylphosphine) ruthenium (20 mg, 0.02 mol) in THF (20 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 38.5 g of a hydrogenated ring-opening metathesis polymer in the form of a white powder. The hydrogenating rate calculated from $^1$H-NMR of the resulted hydrogenated ring-opening metathesis polymer did not manifest a peak assigned to a proton of an olefin in the main chain, and the hydrogenating rate was 100%, and the number-average molecular weight Mn in terms of polystyrene standard measured by GPC was 8260 and Mw/Mn was 1.32. The composition ratio of the structural units [A]/[B] in the resulted polymer was 50/50.

EXAMPLE 6

In a 1000 ml autoclave equipped with a magnetic stirrer, 3,6-epoxy-1,2,3,6-tetrahydrodimethylphthalide (11.41 g, 75.0 mmol) and 8-(2'-ethyl-2'-norbornyloxy)carbonyltetracyclo[4.4.0.12, 5.17, 10]-3-dodecene (36.73 g, 112.5 mmol) were dissolved, as cyclic olefin monomers, in tetrahydrofuran (500 ml), under a nitrogen atmosphere. To this was added 1,6-heptadiene (3.17 ml, 23.41 mmol) as a chain transfer agent and W(N-2,6-iPr$_2$C$_6$H$_3$)(CHCMe$_2$)(OC(CF$_3$)$_2$Me)$_2$ (740 mg, 0.935 mmol) as a ring-opening metathesis polymerization catalyst, and they were reacted for 3 hours at room temperature. Then, butylaldehyde (360 mg, 5.00 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 48.9 g of a ring-opening metathesis polymer powder.

Then, into a 500 ml autoclave, 40.0 g of this ring-opening metathesis polymer powder, 5% palladium carbon (5.0 g, 2.35 mmol as palladium) as a hydrogenation catalyst, and THF (300 ml) as a solvent were added, and a hydrogenation reaction was conducted for 24 hours at a hydrogen pressure of 8.0 MPa and a temperature of 120° C., then, the temperature was returned to room temperature, and a hydrogen gas was discharged. After removal of palladium carbon used as a catalyst by filtration, this hydrogenated ring-opening metathesis polymer solution was added into methanol to precipitate a hydrogenated ring-opening metathesis polymer which was separated by filtration and subjected to vacuum drying to provide 39.1 g of a hydrogenated ring-opening metathesis polymer in the form of a white powder. The hydrogenating rate calculated from $^1$H-NMR of the resulted hydrogenated ring-opening metathesis polymer was 99%, and the number-average molecular weight Mn in terms of polystyrene standard measured by GPC was 4690 and Mw/Mn was 1.38. The composition ratio of the structural units [A]/[B] in the resulted polymer was 60/40.

EXAMPLE 7

In a 1000 ml autoclave equipped with a magnetic stirrer, 3,6-epoxy-1,2,3,6-tetrahydromonomethylphthalide (19.94 g, 120.0 mmol) and 8-(2'-ethyl-2'-adamantyloxy)carbonyltetracyclo[4.4.0.12, 5.17, 10]-3-dodecene (28.20 g, 80.0 mmol) were dissolved, as cyclic olefin monomers, in 600 ml of toluene, under a nitrogen atmosphere. To this was added 1-octene (10.3 ml, 65.0 mmol) as a chain transfer agent and Re(CBu$^r$)(CHBu$^r$)(OC(CF$_3$)$_2$Me)$_2$ (687.6 mg, 1.00 mmol) as a ring-opening metathesis polymerization catalyst, and they were reacted for 6 hours at 50° C. Then, butylaldehyde (360 mg, 5.00 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 46.3 g of a ring-opening metathesis polymer powder.

Then, into a 1000 ml autoclave, 40.0 g of this ring-opening metathesis polymer powder, dihydridetetrakis(triphenylphosphine) ruthenium (12.0 mg, 0.013 mmol) and triethylamine (4.05 mg, 0.04 mmol) as hydrogenation catalysts, and toluene (600 ml) as a solvent were added, and a hydrogenation reaction was conducted for 24 hours at a hydrogen pressure of 8.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 38.8 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 2880 and Mw/Mn was 1.42. The composition ratio of the structural units [A]/[B] in the resulted polymer was 40/60.

EXAMPLE 8

20.0 g of the hydrogenated ring-opening metathesis polymer obtained in Example 5 was added to a solution of 5.0 ml of trifluoroacetic acid in 1000 ml of toluene, in a 2000 ml eggplant form flask, and the mixture was stirred for 3 hours at 70° C., the solvent was removed, then, the resulted mixture was further dissolved in THF and added into methanol to form a precipitate which was filtrated and dried in vacuo to obtain 17.8 g of a hydrogenated ring-opening metathesis polymer partially ester-decomposed in the form of a white powder. The composition ratio of the structural units [A]/[B]/[D] in the resulted polymer was 30/50/20, and the number-average molecular weight Mn measured by GPC was 8150, and Mw/Mn was 1.33.

EXAMPLE 9

15.0 g of the hydrogenated ring-opening metathesis polymer obtained in Example 6 was added to a solution of 5.0 ml of trifluoroacetic acid in 1000 ml of benzene, in a 2000 ml eggplant form flask, and the mixture was stirred for 2 hours at 70° C., the solvent was removed, then, the resulted mixture was further dissolved in THF and added into methanol to form a precipitate which was filtrated and dried in vacuo to obtain 13.1 g of a hydrogenated ring-opening metathesis polymer partially ester-decomposed in the form of a white powder. The composition ratio of the structural units [A]/[B]/[D] in the resulted polymer was 40/40/20, and the number-average molecular weight Mn measured by GPC was 4490, and Mw/Mn was 1.35.

EXAMPLE 10

15.0 g of the hydrogenated ring-opening metathesis polymer obtained in Example 7 was added to a solution of 10.0 ml of concentrated hydrochloric acid in 1000 ml of THF, in a 2000 ml eggplant form flask, and the mixture was stirred for 6 hours at 60° C., the resulted mixture was added into methanol to form a precipitate which was filtrated and dried in vacuo to obtain 13.0 g of a hydrogenated ring-opening metathesis polymer partially ester-decomposed in the form of a white powder. The composition ratio of the structural units [A]/[B]/[D] in the resulted polymer was 25/60/15, and the number-average molecular weight Mn measured by GPC was 2810, and Mw/Mn was 1.39.

EXAMPLE 11

In a 500 ml autoclave equipped with a magnetic stirrer, 3,6-epoxy-1,2,3,6-tetrahydrophthalide (9.89 g, 65.0 mmol), 8-(1'-ethylcyclopentoxy)carbonyltetracyclo[4.4.0.1 2, 5.17, 10]-3-dodecene (11.72 g, 39.0 mmol) and 8-tert-butoxycarbonyltetracyclo[4.4.0.12, 5.17, 10]-3-decene (6.77 g, 26.0 mmol) were dissolved, as cyclic olefin monomers, in 300 ml of tetrahydrofuran, under a nitrogen atmosphere. To this was added 1,5-hexadiene (0.75 ml, 6.5 mmol) as a chain transfer agent and $Mo(N-2,6-iPr_2C_6H_3)(CHCMe_2Ph)(OC(CF_3)_2Me)_2$ (536 mg, 0.70 mmol) as a ring-opening metathesis polymerization catalyst, and they were reacted for 2 hours at room temperature. Then, butylaldehyde (250 mg, 3.47 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 26.6 g of a ring-opening metathesis polymer powder.

Then, in a 500 ml autoclave, 20.0 g of this ring-opening metathesis polymer powder was dissolved in THF (300 ml), and to this was added a previously prepared solution of triethylamine (11.74 mg, 0.116 mmol) and dichlorotris(triphenylphosphine)osmium (30.0 mg, 0.029 mmol) in THF (20 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 18.8 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 9110 and Mw/Mn was 1.43. The composition ratio of the structural units [A]/[B]/[E] in the resulted polymer was 30/50/20.

EXAMPLE 12

In a 500 ml autoclave equipped with a magnetic stirrer, 3,6-epoxy-1,2,3,6-tetrahydrophthalide (9.13 g, 60.0 mmol), 8-(1'-ethylcyclopentoxy)carbonyltetracyclo[4.4.0.12, 5.17, 10]-3-dodecene (14.42 g, 48.0 mmol) and 8-methoxycarbonyltetracyclo[4.4.0.12, 5.17, 10]-3-decene (2.62 g, 12.0 mmol) were dissolved, as cyclic olefin monomers, in 350 ml of toluene, under a nitrogen atmosphere. To this was added 1,5-hexadiene (0.70 ml, 6.0 mmol) as a chain transfer agent and $W(N-2,6-Me_2C_6H_3)(CHCHCMe_2)(OC(CF_3)_2Me)_2$ (440 mg, 0.60 mmol) as a ring-opening metathesis polymerization catalyst, and they were reacted for 5 hours at room temperature. Then, butylaldehyde (216 mg, 3.0 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 24.7 g of a ring-opening metathesis polymer powder.

Then, in a 500 ml autoclave, 20.0 g of this ring-opening metathesis polymer powder was dissolved in toluene (350 ml), and to this was added a solution of dichlorobis(triphenylphosphine) palladium (66.0 mg, 0.094 mmol) in toluene (30 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 17.9 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 8810 and Mw/Mn was 1.24. The composition ratio of the structural units [A]/[B]/[E] in the resulted polymer was 40/50/10.

EXAMPLE 13

9.0 g of the hydrogenated ring-opening metathesis polymer obtained in Example 12 was added to 400 ml of a 5% potassium hydroxide methanol aqueous solution, in a 1000 ml flask, and the mixture was stirred for 3 hours at 80° C., then, the mixture was added into 1000 ml of a 2% hydrochloric acid aqueous solution for neutralization to form a precipitate which was filtrated, washed with water and dried in vacuo to obtain 8.4 g of a hydrogenated ring-opening metathesis polymer partially hydrolyzed in the form of a white powder. The composition ratio of the structural units [A]/[B]/[D] in the resulted polymer was 40/50/10, and the number-average molecular weight Mn measured by GPC was 8730, and Mw/Mn was 1.25.

EXAMPLE 14

In a 500 ml autoclave equipped with a magnetic stirrer, 3,6-epoxy-1,2,3,6-tetrahydrophthalide (9.13 g, 60.0 mmol), 8-(1'-ethylcyclopentoxy)carbonyltetracyclo[4.4.0.12, 5.17, 10]-3-dodecene (9.01 g, 30.0 mmol) and 8-(tetrahydropyran-2-yl)oxycarbonyltetracyclo-[4.4.0.1$^{2.5}$.1$^{7.10}$]-3-decene (8.65 g, 30.0 mmol) were dissolved, as cyclic olefin monomers, in 320 ml of THF, under a nitrogen atmosphere. To this was added 1,5-hexadiene (0.70 ml, 6.0 mmol) as a chain transfer agent and $W(N-2,6Me_2C_6H_3)(CHCHCMe_2)(OBu^t)_2(PMe_3)$ (356 mg, 0.60 mmol) as a ring-opening metathesis polymerization catalyst, and they were reacted for 5 hours at room temperature. Then, butylaldehyde (216 mg, 3.0 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 24.3 g of a ring-opening metathesis polymer powder.

Then, in a 500 ml autoclave, 20.0 g of this ring-opening metathesis polymer powder was dissolved in THF (300 ml), and to this was added a solution of chlorotris (triphenylphosphine) rhodium (91.0 mg, 0.10 mmol) as a hydrogenation catalyst in THF (30 ml), and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 17.1 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 9620 and Mw/Mn was 1.19. The composition ratio of the structural units [A]/[B]/[E] in the resulted polymer was 25/50/25.

EXAMPLE 15

8.0 g of the hydrogenated ring-opening metathesis polymer obtained in Example 14 was added to a solution of 3.0 ml of trifluoroacetic acid in 500 ml of toluene, in a 1000 ml eggplant form flask, and the mixture was stirred for 3 hours at 30° C., the solvent was distilled off, and the resulted mixture was further dissolved in THF and added into methanol to form a precipitate which was filtrated, and dried in vacuo to obtain 6.8 g of a white powder. As a result of NMR analysis, the product was a hydrogenated ring-opening metathesis polymer in which only a tetrahydropyranyl group had been ester-decomposed. The composition ratio of the structural units [A]/[B]/[D] in the resulted polymer was 25/50/25, and the number-average molecular weight Mn measured by GPC was 9060, and Mw/Mn was 1.21.

EXAMPLE 16

In a 500 ml three-necked eggplant form flask equipped with a 100 ml dropping funnel, stirred and three-way cock, 8.0 g of the hydrogenated ring-opening metathesis polymer partially ester-decomposed obtained in Example 8 was added under a nitrogen atmosphere flow to a solution of 80 mg of p-toluenesulfonic acid pyridine salt in 200 ml of toluene, to this was added dropwise a solution of 5,6-dihydropyran (10 g) in 70 ml of toluene over about 1 hour while stirring at 25° C., and after completion of addition, the mixture was stirred for 2 hours at 25° C. After removal of the solvent, the resulted mixture was further dissolved in THF and added into methanol to give a precipitate which was filtrated and subjected to drying under reduced pressure to obtain 6.6 g of a hydrogenated ring-opening metathesis polymer partially esterified in the form of a while powder. The composition ratio of the structural units [A]/[B]/[D]/[E] in the resulted polymer was 30/50/5/15, and the number-average molecular weight Mn measured by GPC was 8200, and Mw/Mn was 1.33.

EXAMPLE 17

In a 500 ml autoclave equipped with a magnetic stirrer, 4-oxatricyclo[5.2.1.0$^{2.6}$]dec-8-en-3-one (4.51 g, 30.0 mmol), 8-(1'-ethylcyclopentoxy)carbonyltetracyclo[4.4.0.12, 5.17, 10]-3-dodecene (12.02 g, 40.0 mmol) and 5-(1'-ethylcyclopentoxy)carbonyl-6-methoxycarbonyl-7-oxabicyclo[2.2.1]hept-2-ene (8.83 g, 30.0 mmol) were dissolved, as cyclic olefin monomers, in 350 ml of THF, under a nitrogen atmosphere. To this was added 1-hexene (0.42 ml, 3.5 mmol) as a chain transfer agent and W(N-2, 6-iPr$_2$C$_6$H$_3$)(CHCMe$_3$)(OBu$^t$)$_2$ (288 mg, 0.50 mmol) as a ring-opening metathesis polymerization catalyst, and they were reacted for 5 hours at room temperature. Then, butylaldehyde (180 mg, 2.5 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 23.3 g of a ring-opening metathesis polymer powder.

Then, in a 1000 ml autoclave, 20.0 g of this ring-opening metathesis polymer powder was dissolved in THF (500 ml), and to this was added a previously prepared solution of triethylamine (4.86 mg, 0.048 mmol) and dichlorobis (tetrahydrofuran)bis(triphenylphosphine) ruthenium (4.0 mg, 0.0048 mmol) in THF (100 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 18.1 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 12600 and Mw/Mn was 1.39. The composition ratio of the structural units [A]/[A]'/[E] in the resulted polymer was 40/30/30.

EXAMPLE 18

In a 500 ml autoclave equipped with a magnetic stirrer, 5-oxapentacyclo-7.4.0.0$^{3.7}$.1$^{2.8}$.1$^{10.13}$]-pentadec-11-en-4-one (10.81 g, 50.0 mmol) and 5-(1'-ethylcyclopentoxy) carbonyl-7-oxabicyclo[2.2.1]hept-2-ene (11.82 g, 50.0 mmol) were dissolved, as cyclic olefin monomers, in 250 ml of THF, under a nitrogen atmosphere. To this was added 1-heptene (0.64 ml, 6.5 mmol) as a chain transfer agent and W(N-2,6-Me$_2$C$_6$H$_3$)(CHCHCMePh)(OBu$^t$)$_2$(PMe$_3$) (328 mg, 0.50 mmol) as a ring-opening metathesis polymerization catalyst, and they were reacted for 5 hours at room temperature. Then, butylaldehyde (258 mg, 3.0 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 20.8 g of a ring-opening metathesis polymer powder.

Then, in a 500 ml autoclave, 15.0 g of this ring-opening metathesis polymer powder was dissolved in THF (300 ml), and to this was added a previously prepared solution of triethylamine (4.9 mg, 0.02 mmol) and chlorohydridecarbonyltris(triphenylphosphine) ruthenium (9.5 mg, 0.01 mmol) in THF (30 ml) as a hydrogenation catalyst, and a hydrogenation reaction was conducted for 42 hours at a hydrogen pressure of 10.0 MPa and a temperature of 80° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 12.3 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 8450 and Mw/Mn was 1.29. The composition ratio of the structural units [A]/[B] in the resulted polymer was 50/50.

EXAMPLE 19

In a 500 ml autoclave equipped with a magnetic stirrer, 3,6-epoxy-1,2,3,6-tetrahydrophthalide (11.41 g, 75.0 mmol), 8-(1'-ethylcyclopentoxy)carbonyltetracyclo[4.4.0.1$^{2,5.17}$, 10]-3-dodecene (7.51 g, 25.0 mmol) and 8-(2'-ethyl-2'-norbornyloxy)carbonyltetracyclo[4.4.0.1$^{2}$, 5.17, 10]-3-decene (8.16 g, 25.0 mmol) were dissolved, as cyclic olefin monomers, in 300 ml of THF, under a nitrogen atmosphere. To this was added 1,5-hexadiene (1.04 ml, 9.0 mmol) as a chain transfer agent and W(N-2,6-iPr$_2$C$_6$H$_3$)(CHCMe$_3$)(OBu$^t$)$_2$(PMe$_3$) (652 mg, 1.00 mmol) as a ring-opening metathesis polymerization catalyst, and they were reacted for 5 hours at room temperature. Then, butylaldehyde (432 mg, 6.0 mmol) was added and the mixture was stirred for 30 minutes to terminate the reaction.

This ring-opening metathesis polymer solution was added into methanol to precipitate a ring-opening metathesis polymer which was filtrated, washed with methanol, and dried in vacuo, to give 25.1 g of a ring-opening metathesis polymer powder.

Then, in a 1000 ml autoclave, 10.0 g of this ring-opening metathesis polymer powder was dissolved in toluene (350 ml), and to this was added a previously prepared solution of triethylamine (15.2 mg, 0.15 mmol) and dichlorotris(trimethylphosphite) ruthenium (44.8 mg, 0.10 mmol) in THF (200 ml) as a hydrogenation catalyst, and a hydrogenation reaction was conducted for 20 hours at a hydrogen pressure of 10.0 MPa and a temperature of 70° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 8.8 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 8330 and Mw/Mn was 1.44. The composition ratio of the structural units [A]/[A']/[B] in the resulted polymer was 20/20/60.

EXAMPLE 20

In a 500 ml Schlenk flask, 3,6-epoxy-1,2,3,6-tetrahydrophthalide (2.43 g, 16 mmol) and 8-(1'-ethylcyclopentoxy)carbonyl-8-methyltetracyclo[4.4.0.1$^{2}$, 5.17, 10]-3-dodecene (7.55 g, 24 mmol) and were dissolved, as cyclic olefin monomers, in 200 ml of tetrahydrofuran, under a nitrogen atmosphere. To this was added W(N-2,6-iPr$_2$C$_6$H$_3$)(CHCHCMe$_2$)(OC(CF$_3$)$_2$Me)$_2$(PMe$_3$) (606 mg, 0.70 mmol) as a ring-opening metathesis polymerization catalyst, and they were reacted at room temperature for 30 minutes. Then, butylaldehyde (202 mg, 2.80 mmol) was added and the mixture was stirred for 1 hour to terminate the reaction.

This ring-opening metathesis polymer solution was added into methanol to precipitate a ring-opening metathesis polymer which was filtrated, washed with methanol, and dried in vacuo, to give 9.13 g of a ring-opening metathesis polymer powder.

Then, in a 500 ml autoclave, 9.0 g of this ring-opening metathesis polymer powder was dissolved in toluene (250 ml), and to this was added a previously prepared solution of triethylamine (11.3 mg, 0.108 mmol) and dichlorotetrakis(triphenylphosphine) ruthenium (27 mg, 0.022 mmol) in THF (50 ml) as a hydrogenation catalyst, and a hydrogenation reaction was conducted for 16 hours at a hydrogen pressure of 9.0 MPa and a temperature of 120° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 7.4 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 28,600 and Mw/Mn was 1.07. The composition ratio of the structural units [A]/[B] in the resulted polymer was 60/40.

EXAMPLE 21

In a 500 ml Schlenk flask, 3,6-epoxy-1,2,3,6-tetrahydrophthalide (4.56 g, 30.0 mmol) and 8-[(1'-ethylcyclopentoxy)carbonylmethyleneltetracyclo[4.4.0.1$^{2}$, 5.17, 10]-3-dodecene (6.29 g, 20.0 mmol) were dissolved, as cyclic olefin monomers, in 200 ml of tetrahydrofuran, under a nitrogen atmosphere. To this was added W(N-2,6-iPr$_2$C$_6$H$_3$)(CHCHCMe$_2$)(OC(CF$_3$)$_2$Me)$_2$(PMe$_3$) (606 mg, 0.70 mmol) as a ring-opening metathesis polymerization catalyst, and they were reacted at room temperature for 30 minutes. Then, butylaldehyde (202 mg, 2.80 mmol) was added and the mixture was stirred for 1 hour to terminate the reaction.

This ring-opening metathesis polymer solution was added into methanol to precipitate a ring-opening metathesis polymer which was filtrated, washed with methanol, and dried in vacuo, to give 9.98 g of a ring-opening metathesis polymer powder.

Then, in a 500 ml autoclave, 9.0 g of this ring-opening metathesis polymer powder was dissolved in toluene (250 ml), and to this was added a previously prepared solution of triethylamine (10.1 mg, 0.10 mmol) and dichlorotetrakis(triphenylphosphine) ruthenium (61 mg, 0.05 mmol) in THF (250 ml) as a hydrogenation catalyst, and a hydrogenation reaction was conducted for 16 hours at a hydrogen pressure of 9.0 MPa and a temperature of 90° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 8.0 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 34,100 and Mw/Mn was 1.09. The composition ratio of the structural units [A]/[B] in the resulted polymer was 40/60.

EXAMPLE 22

In a 500 ml Schlenk flask, 3,6-epoxy-1,2,3,6-tetrahydrophthalide (1.08 g, 6.0 mmol) and 8,9-di[(1'-ethylcyclopentoxy)carbonyl]tetracyclo[4.4.0.12, 5.17, 10]-3-dodecene (6.17 g, 14.0 mmol) were dissolved, as cyclic olefin monomers, in 200 ml of tetrahydrofuran, under a nitrogen atmosphere. To this was added Mo(N-2,6-iPr$_2$C$_6$H$_3$)(CHCHCMe$_2$)(OC(CF$_3$)$_2$Me)$_2$ (206 mg, 0.35 mmol) as a ring-opening metathesis polymerization catalyst, and they were reacted at room temperature for 30 minutes. Then, butylaldehyde (108 mg, 1.50 mmol) was added and the mixture was stirred for 1 hour to terminate the reaction.

This ring-opening metathesis polymer solution was added into methanol to precipitate a ring-opening metathesis polymer which was filtrated, washed with methanol, and dried in vacuo, to give 6.66 g of a ring-opening metathesis polymer powder.

Then, in a 500 ml autoclave, 6.0 g of this ring-opening metathesis polymer powder was dissolved in THF (250 ml), and to this was added a previously prepared solution of triethylamine (10.1 mg, 0.10 mmol) and dichlorotetrakis (triphenylphosphine) ruthenium (36.6 mg, 0.03 mmol) in THF (250 ml) as a hydrogenation catalyst, and a hydrogenation reaction was conducted for 16 hours at a hydrogen pressure of 9.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 5.4 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 26,900 and Mw/Mn was 1.06. The composition ratio of the structural units [A]/[B] in the resulted polymer was 30/70.

EXAMPLE 23

In a 1000 ml autoclave equipped with a magnetic stirrer, 3,6-epoxy-1,2,3,6-tetrahydrophthalide (18.26 g, 120.0 mmol) and 8-tert-butoxycarbonyltetracyclo[4.4.0.1$^{2,5}$.1$^{7,10}$]-3-dodecene (31.24 g, 120.0 mmol) were dissolved, as cyclic olefin monomers, in tetrahydrofuran (550 ml), under a nitrogen atmosphere. To this was added 1,5-hexadiene (1.6 ml, 14.0 mmol) as a chain transfer agent and Mo(N-2,6-iPr$_2$C$_6$H$_3$)(CHCMe$_3$)(OC(CF$_3$)$_2$Me)$_2$ (950 mg, 1.20 mmol) as a ring-opening metathesis polymerization catalyst, and they were reacted at room temperature for 2 hours. Then, butylaldehyde (433 mg, 6.0 mmol) was added and the mixture was stirred for 30 hours to terminate the reaction.

This ring-opening metathesis polymer solution was added into methanol to precipitate a ring-opening metathesis polymer which was filtrated, washed with methanol, and dried in vacuo, to give 44.4 g of a ring-opening metathesis polymer powder.

Then, in a 1000 ml autoclave, 40.0 g of this ring-opening metathesis polymer powder was dissolved in THF (400 ml), and to this was added a previously prepared solution of chlorohydridecarbonyltris(triphenylphosphine) ruthenium (20 mg, 0.02 mmol) in THF (40 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 37.9 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 8090 and Mw/Mn was 1.36. The composition ratio of the structural units [B]/[E] in the resulted polymer was 50/50.

EXAMPLE 24

20.0 g of the hydrogenated ring-opening metathesis polymer obtained in Example 23 was added to a solution of 5.0 ml of trifluoroacetic acid in 1000 ml of toluene, in a 2000 ml eggplant form flask, and the mixture was stirred for 3 hours at 70° C., the solvent was distilled off, and the resulted mixture was further dissolved in THF and added into methanol to form a precipitate which was filtrated, and dried in vacuo to obtain 18.4 g of a hydrogenated ring-opening metathesis polymer partially ester-decomposed in the form of a white powder. The composition ratio of the structural units [B]/[D]/[E] in the resulted polymer was 50/13/37, and the number-average molecular weight Mn measured by GPC was 8040, and Mw/Mn was 1.36.

EXAMPLE 25

In a 1000 ml autoclave equipped with a magnetic stirrer, 3,6-epoxy-1,2,3,6-tetrahydrodimethylphthalide (21.62 g, 120.0 mmol) and 6,6-dimethyl-5-oxapentacyclo-[7.4.0.0$^{3,7}$.1$^{2,8}$.1$^{10,3}$]-pentadec-11-en-4-one (29.32 g, 120.0 mmol) were dissolved, as cyclic olefin monomers, in tetrahydrofuran (550 ml), under a nitrogen atmosphere. To this was added 1,5-hexadiene (1.6 ml, 14.0 mmol) as a chain transfer agent and Mo(N-2,6-iPr$_2$C$_6$H$_3$)(CHCMe$_3$)(OC(CF$_3$)$_2$Me)$_2$ (950 mg, 1.20 mmol) as a ring-opening metathesis polymerization catalyst, and they were reacted at room temperature for 2 hours. Then, butylaldehyde (433 mg, 6.0 mmol) was added and the mixture was stirred for 30 hours to terminate the reaction.

This ring-opening metathesis polymer solution was added into methanol to precipitate a ring-opening metathesis polymer which was filtrated, washed with methanol, and dried in vacuo, to give 47.7 g of a ring-opening metathesis polymer powder.

Then, in a 1000 ml autoclave, 40.0 g of this ring-opening metathesis polymer powder was dissolved in THF (400 ml), and to this was added a previously prepared solution of chlorohydridecarbonyltris(triphenylphosphine) ruthenium (20 mg, 0.02 mmol) in THF (40 ml) as a hydrogenation catalyst, and a hydrogenation reaction was conducted for 20 hours at a hydrogen pressure of 6.0 MPa and a temperature of 100° C., then, the temperature was returned to room temperature, and a hydrogen gas was discharged. This hydrogenated ring-opening metathesis polymer solution was added into methanol to precipitate a hydrogenated ring-opening metathesis polymer which was separated by filtration and subjected to vacuum drying to provide 36.4 g of a hydrogenated ring-opening metathesis polymer in the form of a white powder. The hydrogenating rate calculated from $^1$H-NMR of the resulted hydrogenated ring-opening metathesis polymer was 100%, and the number-average molecular weight Mn in terms of polystyrene standard measured by GPC was 7940 and Mw/Mn was 1.31. The composition ratio of the structural units [B]/[B'] in the resulted polymer was 50/50.

Next, effects when the hydrogenated ring-opening metathesis polymers of the present invention (Polymers 1 to 24) were used as a resist material are shown by Reference Examples.

(Polymer 1)

(Polymer 2)

(Polymer 3)

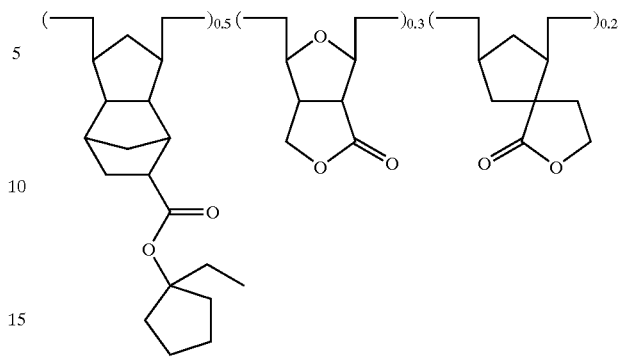

(Polymer 4)

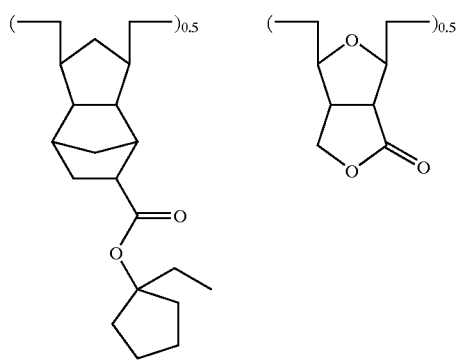

(Polymer 5)

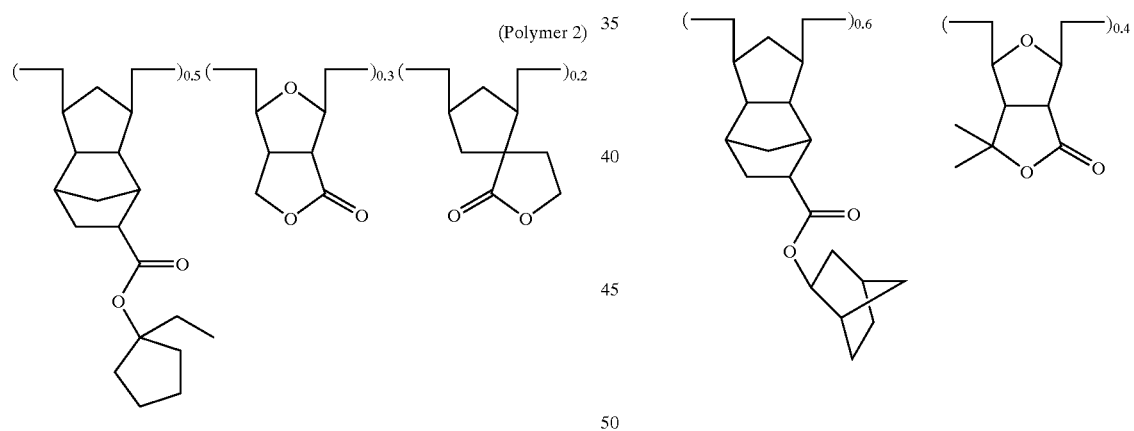

(Polymer 6)

(Polymer 7)

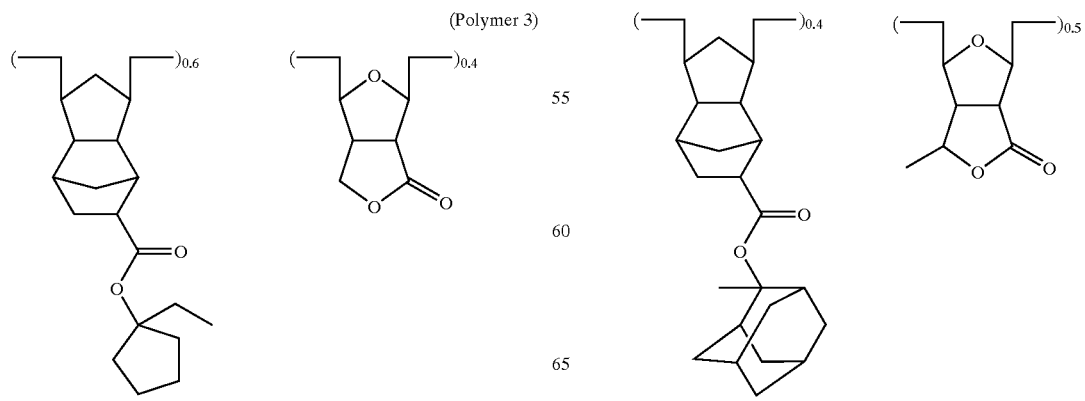

(Polymer 8)
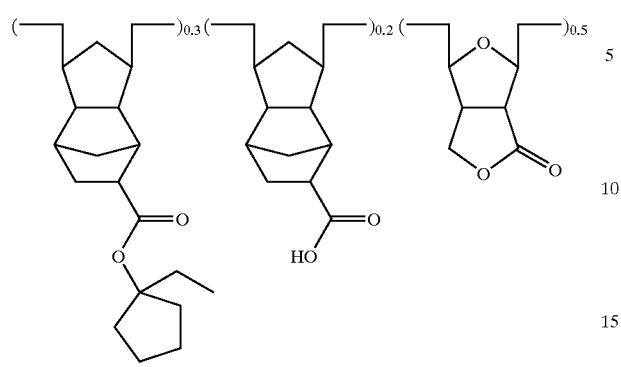
(Polymer 9)
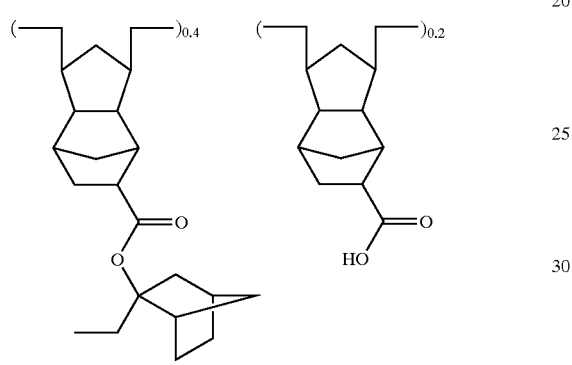
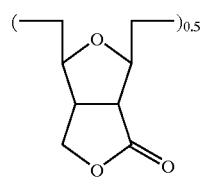
(Polymer 10)
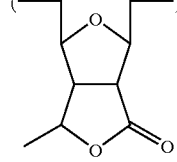
(Polymer 11)
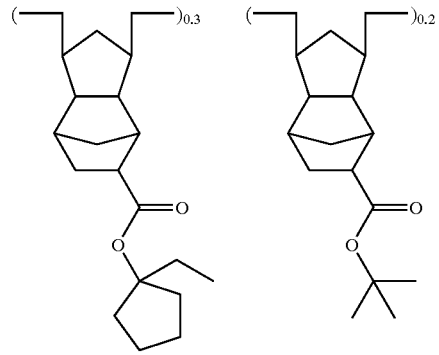
(Polymer 12)
(Polymer 13)
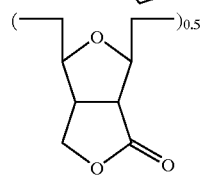

(Polymer 14)
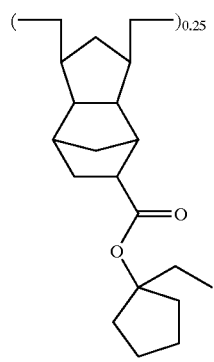 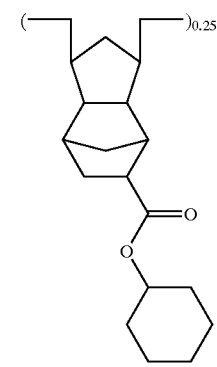
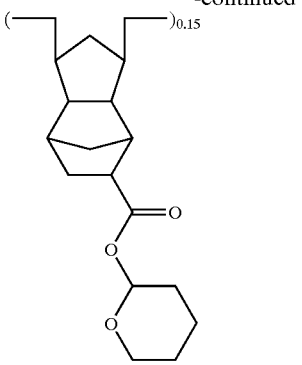
(Polymer 17)
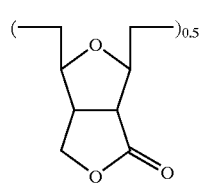
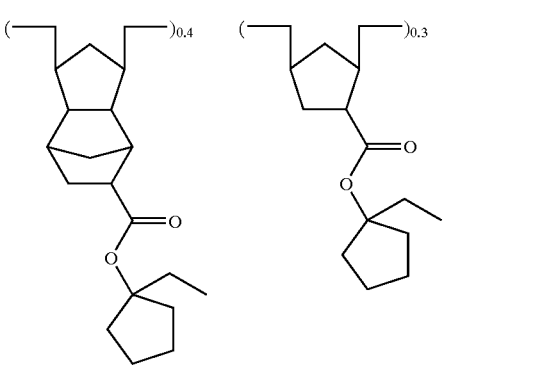
(Polymer 15)
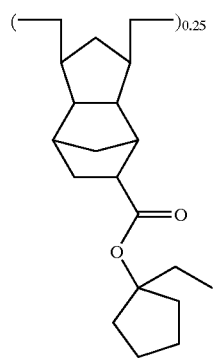 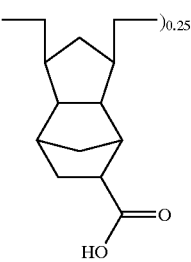
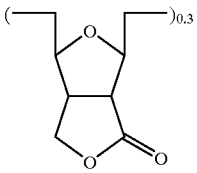
(Polymer 18)
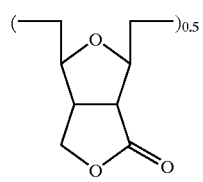
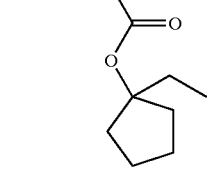
(Polymer 16)
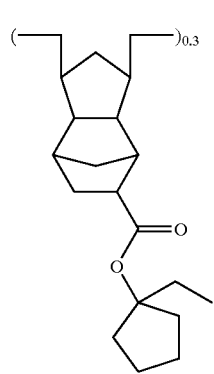 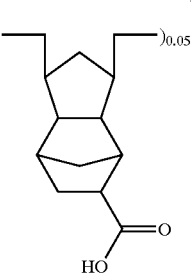
(Polymer 19)
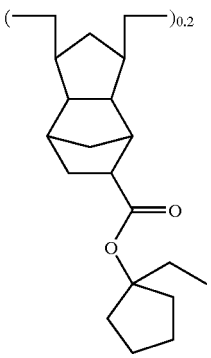 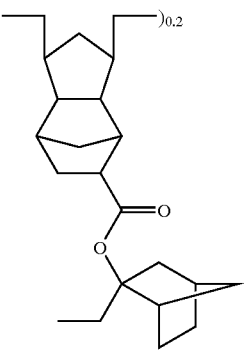

-continued

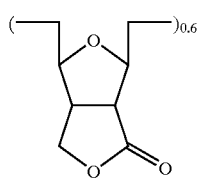

(Polymer 20)

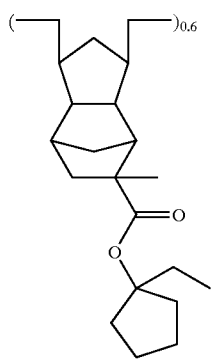

(Polymer 21)

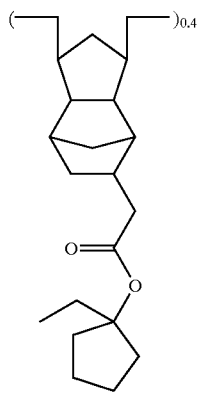

(Polymer 22)

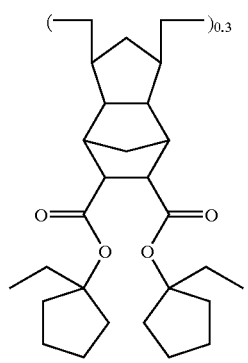

-continued (Polymer 23)

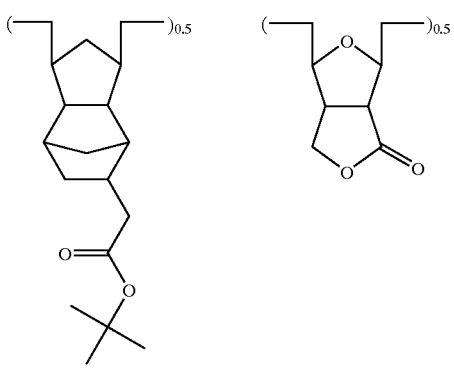

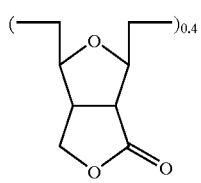

(Polymer 24)

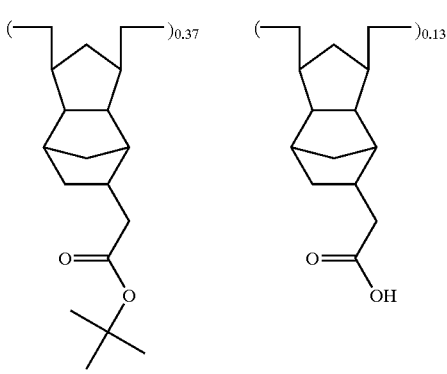

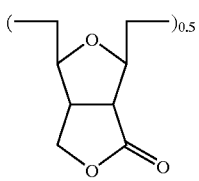

(Polymer 25)

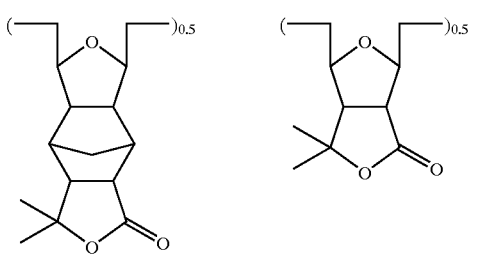

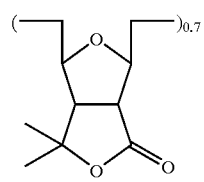

Reference Example I

The resolutions of resist materials of the present invention in exposure to KrF excimer laser were evaluated.

Reference Examples I-1 to 12

Evaluation of Resolution of Resist

Polymers of the above-described formulae (Polymer 1, 2) were used as a base resin, and acid generators of the following formulae (PAG 1, 2), solution suppressing agents of the following formulae (DRR 1 to 4), basic compound, compounds having a group of ≡C—COOH in the molecule of the following formulae (ACC 1, 2) and solvent were mixed in ratios shown in Table 1. Then, these were filtrated through a Teflon filter (pore diameter: 0.2 μm) to give resist materials.

(PAG 1)

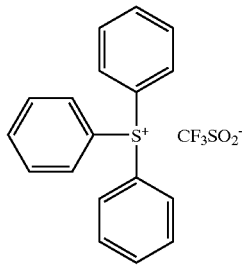

(DRR 4)

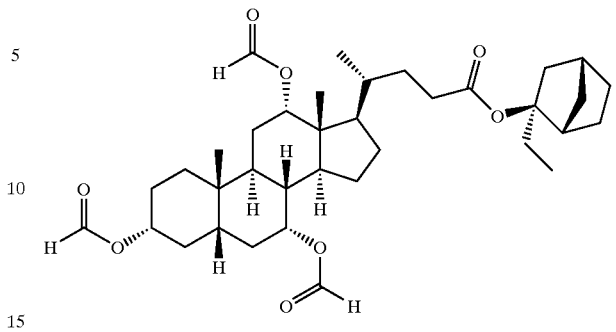

(PAG 2)

(ACC 1)

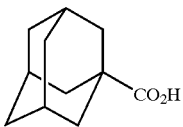

(ACC 2)

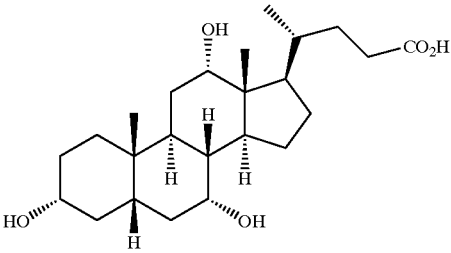

(DRR 1)

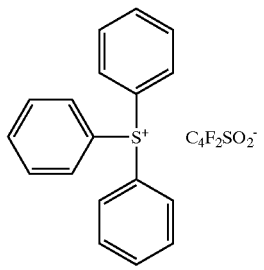

(DRR 2)

(DRR 3)

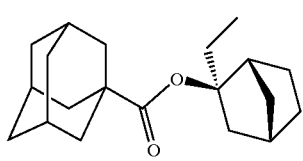

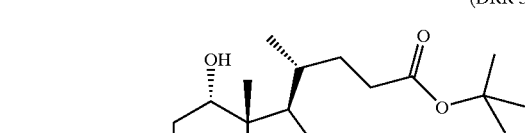

The resist solution was applied by rotation mode on a silicon wafer on which a reflection reducing film (DUV 30 manufactured by Nissan Kagaku K.K., 55 nm) had been applied, and thermal treatment at 130° C. for 90 seconds was performed to form a resist film having a thickness of 485 nm. This was exposed by using a KrF excimer laser stepper (manufactured by Nikon Corp., NA=0.5), and thermal treatment at 110° C. for 90 seconds was performed, then, paddle development was effected for 60 seconds using an aqueous 2.38% tetramethylammonium hydroxide solution, to form a line and space pattern of 1:1. The developed wafer was cut and the cut section was observed by SEM (scanning electron microscope), and the minimum line width ($\mu$m) of line and space separated at the exposure amount (optimum exposure amount=Eop, mJ/cm$^2$) which resolves line and space of 0.30 $\mu$m at 1:1 was utilized as the resolution of a resist to be evaluated. Pattern forms in this process were classified into any of rectangle, rounded head, T-top, ordinary taper, and reverse taper.

Compositions and evaluation results of resists are shown in Table 1. In Table 1, solvents and basic compounds are as described below. And, all solvents used contained FC-430 (manufactured by Sumitomo 3-M K.K.) in an amount of 0.05% by weight.

TABLE 1

| Reference Example | Resin (part) | Acid Generator (part) | Solvent Suppressing Agent (part) | Basic Compound (part) | Solvent (part) | Optimum exposure amount (mJ/cm$^2$) | Resolution ($\mu$m) | Form |
|---|---|---|---|---|---|---|---|---|
| I-1 | Polymer 1 (80) | PAG 1(1) | | TBA (0.078) | CyHO (640) | 17.0 | 0.24 | Rectangle |
| I-2 | Polymer 2 (80) | PAG 1(1) | | TBA (0.078) | CyHO (640) | 18.5 | 0.24 | Rectangle |
| I-3 | Polymer 1 (80) | PAG 2(1) | | TBA (0.078) | CyHO (640) | 17.5 | 0.24 | Rectangle |
| I-4 | Polymer 1 (80) | PAG 2(1) | | TEA (0.063) | CyHO (640) | 18.0 | 0.22 | Rectangle |
| I-5 | Polymer 1 (80) | PAG 2(1) | | TMMEA (0.118) | CyHO (640) | 18.0 | 0.22 | Rectangle |
| I-6 | Polymer 1 (80) | PAG 2(1) | | TMEMEA (0.173) | CyHO (640) | 18.5 | 0.22 | Rectangle |
| I-7 | Polymer 1 (70) | PAG 2(1) | DRR1 (10) | TEA (0.063) | CyHO (640) | 15.5 | 0.24 | Rectangle |
| I-8 | Polymer 1 (70) | PAG 2(1) | DRR2 (10) | TEA (0.063) | CyHO (640) | 16.0 | 0.24 | Rectangle |
| I-9 | Polymer 1 (70) | PAG 2(1) | DRR3 (10) | TEA (0.063) | CyHO (640) | 18.5 | 0.24 | Rectangle |
| I-10 | Polymer 1 (70) | PAG 2(1) | DRR4 (10) | TEA (0.063) | CyHO (640) | 17.0 | 0.22 | Rectangle |
| I-11 | Polymer 1 (80) | PAG 2(1) | ACC1 (4) | TEA (0.063) | CyHO (640) | 16.5 | 0.24 | Rectangle |
| I-12 | Polymer 1 (80) | PAG 2(1) | ACC2 (4) | TEA (0.063) | CyHO (640) | 17.0 | 0.24 | Rectangle |

CyHO: cyclohexanone
TBA: tributylamine
TEA: triethanolamine
TMMEA: trismethoxymethoxyethylamine
TMEMEA: trismethoxyethoxymethoxyethylamine From the results in Table 1, it was confirmed that resist materials of the present invention show high sensitivity and high resolution in exposure to KrF excimer laser.

Reference Example II

The resolutions of resist materials of the present invention in exposure to ArF excimer laser were evaluated.

[Reference Examples II-1 to 22

Evaluation of Resolution of Resist

Resist materials having compositions shown in Table 2 were prepared in the same manner as described above.

The resist solution was applied by rotation mode on a silicon wafer on which a reflection reducing film (ARC 25 manufactured by Nissan Kagaku K.K., 77 nm) had been applied, and thermal treatment at 130° C. for 90 seconds was performed to form a resist film having a thickness of 375 nm. This was exposed by using a ArF excimer laser stepper (manufactured by Nikon Corp., NA=0.55), and thermal treatment at 110° C. for 90 seconds was performed, then, paddle development was effected for 60 seconds using an aqueous 2.38% tetramethylammonium hydroxide solution, to form a line and space pattern of 1:1. The developed wafer was cut and the cut section was observed by SEM (scanning electron microscope), and the minimum line width ($\mu$m) of line and space separated at the exposure amount (optimum exposure amount=Eop, mJ/cm$^2$) which resolves line and space of 0.30 $\mu$m at 1:1 was utilized as the resolution of a resist to be evaluated. Pattern forms in this process were classified into any of rectangle, rounded head, T-top, ordinary taper, and reverse taper.

Compositions and evaluation results of resists are shown in Table 2. In Table 2, solvents and basic compounds are as described below. And, all solvents used contained FC-430 (manufactured by Sumitomo 3-M K.K.) in an amount of 0.01% by weight.

TABLE 2

| Reference Example | Resin (part) | Acid Generator (part) | Basic Compound (part) | Solvent (part) | Optimum exposure amount (mJ/cm$^2$) | Resolution ($\mu$m) | Form |
|---|---|---|---|---|---|---|---|
| II-1 | Polymer 1 (80) | PAG 2(1) | TMMEA (0.236) | CyHO (640) | 19.0 | 0.19 | Rectangle |
| II-2 | Polymer 2 (80) | PAG 2(1) | TMMEA (0.236) | CyHO (640) | 20.0 | 0.18 | Rectangle |
| II-3 | Polymer 3 (80) | PAG 2(1) | TMMEA (0.236) | CyHO (640) | 24.0 | 0.21 | Rectangle |
| II-4 | Polymer 4 (80) | PAG 2(1) | TMMEA (0.236) | CyHO (640) | 18.0 | 0.18 | Rectangle |

TABLE 2-continued

| Reference Example | Resin (part) | Acid Generator (part) | Basic Compound (part) | Solvent (part) | Optimum exposure amount (mJ/cm$^2$) | Resolution ($\mu$m) | Form |
|---|---|---|---|---|---|---|---|
| II-5 | Polymer 5 (80) | PAG 2(1) | TMMEA (0.236) | CyHO (640) | 17.0 | 0.18 | Rectangle |
| II-6 | Polymer 6 (80) | PAG 2(1) | TMMEA (0.236) | CyHO (640) | 15.0 | 0.17 | Rectangle |
| II-7 | Polymer 7 (80) | PAG 2(1) | TMMEA (0.236) | CyHO (640) | 19.0 | 0.18 | Slightly T-top |
| II-8 | Polymer 8 (80) | PAG 2(1) | TMMEA (0.236) | CyHO (640) | 16.0 | 0.17 | Rectangle |
| II-9 | Polymer 9 (80) | PAG 2(1) | TMMEA (0.236) | CyHO (640) | 15.0 | 0.17 | Rectangle |
| II-10 | Polymer 10 (80) | PAG 2(1) | TMMEA (0.236) | CyHO (640) | 18.0 | 0.17 | Rectangle |
| II-11 | Polymer 11 (80) | PAG 2(1) | TMMEA (0.236) | CyHO (640) | 20.0 | 0.19 | Rectangle |
| II-12 | Polymer 12 (80) | PAG 2(1) | TMMEA (0.236) | CyHO (640) | 18.0 | 0.18 | Rectangle |
| II-13 | Polymer 13 (80) | PAG 2(1) | TMMEA (0.236) | CyHO (640) | 16.0 | 0.17 | Rectangle |
| II-14 | Polymer 14 (80) | PAG 2(1) | TMMEA (0.236) | CyHO (640) | 14.0 | 0.18 | Slightly Rounded head |
| II-15 | Polymer 15 (80) | PAG 2(1) | TMMEA (0.236) | CyHO (640) | 13.0 | 0.18 | Slightly Rounded head |
| II-16 | Polymer 16 (80) | PAG 2(1) | TMMEA (0.236) | CyHO (640) | 14.0 | 0.18 | Rectangle |
| II-17 | Polymer 17 (80) | PAG 2(1) | TMMEA (0.236) | CyHO (640) | 17.0 | 0.19 | Rectangle |
| II-18 | Polymer 18 (80) | PAG 2(1) | TMMEA (0.236) | CyHO (640) | 19.0 | 0.18 | Rectangle |
| II-19 | Polymer 19 (80) | PAG 2(1) | TMMEA (0.236) | CyHO (640) | 17.0 | 0.18 | Rectangle |
| II-20 | Polymer 20 (80) | PAG 2(1) | TMMEA (0.236) | CyHO (640) | 18.0 | 0.20 | Rectangle |
| II-21 | Polymer 21 (80) | PAG 2(1) | TMMEA (0.236) | CyHO (640) | 18.0 | 0.20 | Rectangle |
| II-22 | Polymer 22 (80) | PAG 2(1) | TMMEA (0.236) | CyHO (640) | 17.0 | 0.19 | Rectangle |
| II-23 | Polymer 23 (80) | PAG 2(1) | TMMEA (0.236) | CyHO (640) | 24.0 | 0.21 | Slightly T-top |
| II-24 | Polymer 24 (80) | PAG 2(1) | TMMEA (0.236) | CyHO (640) | 23.0 | 0.21 | Slightly T-top |

CyHO: cyclohexanone
TMMEA: trismethoxymethoxyethylamine

From the results in Table 2, it was confirmed that resist materials of the present invention show high sensitivity and high resolution in exposure to ArF excimer laser.

As described above, the hydrogenated ring-opening metathesis polymer and the method of producing the same of the present invention are extremely valuable from the industrial standpoint since they are suitable for a photoresist for fine processing of a semiconductor using ultraviolet ray and far ultraviolet ray, excellent in heat resistance, thermal decomposition resistance, light transmittance and the like.

What is claimed is:

1. A hydrogenated ring-opening metathesis polymer which contains at least one of structural unit [B] and structural unit [C] and which optionally contains structural unit [A] with structural unit [A] having the following general formula [1]:

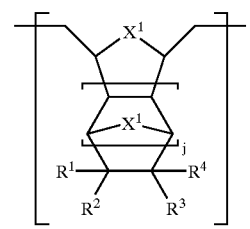

[1]

wherein, at least one of $R^1$ to $R^4$ represents a functional group having a tertiary ester group of a cyclic alkyl of the following general formula [2]:

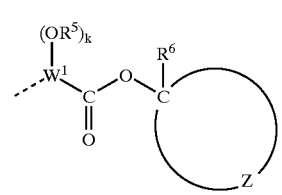

[2]

wherein, the chain line represents a connecting means, $R^5$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $R^6$ represents a linear, branched or cyclic alkyl group having 1 to 10 carbon atoms, $W^1$ represents a single bond ore (k+2)-valent hydrocarbon group having 1 to 10 carbon atoms, Z represents a divalent hydrocarbon group having 2 to 15 carbon atoms, and forms a single ring or a cross-linked ring together with carbon atoms to be bonded, k represents 0 or 1, and the remaining groups of $R^1$ to $R^4$ are selected each independently from a hydrogen atom, linear, branched or cyclic alkyl groups having 1 to 20 carbon atoms, halogen atoms, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 8 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, and $X^1$s are the same or different and represent —O— or —$CR^7{}_2$— wherein $R^7$ represents a hydrogen atom or a linear or branched alkyl group having 1 to 10 carbon atoms, j represents an integer of 0 or 1 to 3, structural unit [B] having the following general formula [3]:

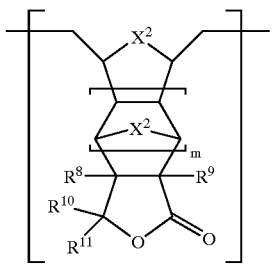

[3]

wherein $R^8$ to $R^{11}$ each independently represent a hydrogen atom or a linear, branched or cyclic alkyl group having 1 to 10 carbon atoms, and $X^2$s are the same or different and represent —O— or —$CR^{12}{}_2$— wherein $R^{12}$ represents a hydrogen atom or a linear or branched alkyl group having 1 to 10 carbon atoms. m represents an integer of 0 or 1 to 3, and structural unit [C] having the following general formula [4]:

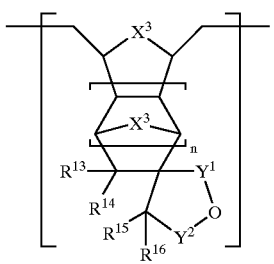

[4]

wherein $R^{13}$ to $R^{16}$ each independently represent a hydrogen atom or a linear, branched or cyclic alkyl group having 1 to 10 carbon atoms, and $X^3$s are the same or different and represent —O— or —$CR^{17}{}_2$— wherein $R^{17}$ represents a hydrogen atom or a linear or branched alkyl group having 1 to 10 carbon atoms, one of $Y^1$ and $Y^2$ represents —(C=O)— and the other of $Y^1$ and $Y^2$ represents —$CR^{18}{}_2$— wherein $R^{18}$ represents a hydrogen atom or a linear or branched alkyl group having 1 to 10 carbon atoms, n represents an integer of 0 or 1 to 3, wherein at least one of $X^1$ in the structural unit [A] of the general formula [1], $X^2$ in the structural unit [B] of the general formula [3] end $X^3$ in the structural unit [C] of the general formula [4] represents —O—, and wherein the molar ratio of [A]/([B] and [C]) is 0/100 to 99/1.

2. The hydrogenated ring-opening metathesis polymer according to claim 1 wherein the molar ratio of the structural unit [A] of the general formula [1] to the structural unit [B] of the general formula [3] and the structural unit [C] of the general formula [4] ([A]/([B] and [C]) is 25/75 to 90/10.

3. The hydrogenated ring-opening metathesis polymer according to claim 1 wherein the molar ratio of the structural unit [A] of the general formula [1] to the structural unit [B] of the general formula [3] and the structural unit [C] of the general formula [4] ([A]/([B] and [C]) is 30/70 to 85/15.

4. The hydrogenated ring-opening metathesis polymer according to claim 1 wherein at least one of $X^1$ in the structural unit [A] of the general formula [1], $X^2$ in the structural unit [B] of the general formula [3] and $X^3$ in the structural unit [C] of the general formula [4] represents —O—, and the others represent —$CH_2$—.

5. The hydrogenated ring-opening metathesis polymer according to claim 1 wherein a functional group having a tertiary ester group of a cyclic alkyl of the general formula [2] selected as at least one of $R^1$ to $R^4$ in the general formula [1] is a 1-alkylcyclopentyl ester, 1-alkylnorbornyl ester or 2-alkyl-2-adamantyl ester.

6. The hydrogenated ring-opening metathesis polymer according to claim 1 wherein $W^1$ in the general formula [2] represents a single bond.

7. The hydrogenated ring-opening metathesis polymer according to claim 1 wherein the material further contains a structural unit [D] of the following general formula [5];

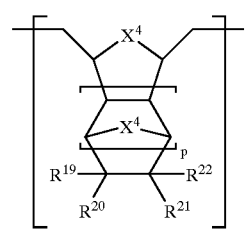

[5]

wherein at least one of $R^{19}$ to $R^{22}$ represents a functional group having a carboxyl group of the following general formula [8]:

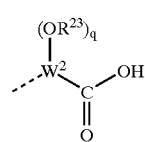

[6]

wherein the chain line represents a connecting means, $R^{23}$ represents a hydrogen atom, a linear, branched or cyclic alkyl group having 1 to 10 carbon atoms, a linear, branched or cyclic alkoxyalkyl group having 2 to 10 carbon atoms, or a linear, branched or cyclic acyl group having 1 to 10 carbon atoms, $W^2$ represents a single bond or a (q+2)-valent hydrocarbon group having 1 to 10 carbon atoms, q represents 0 or 1, and the remaining groups of $R^{19}$ to $R^{23}$ are selected each independently from a hydrogen atom, linear, branched or cyclic alkyl groups having 1 to 20 carbon atoms, halogen atoms, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 6 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, and $X^1$s are the same or different and represent —O— or —$CR^{24}_2$— wherein $R^{24}$ represents a hydrogen atom or a linear or branched alkyl group having 1 to 10 carbon atoms, and p represents an integer of 0 or 1 to 3.

8. The hydrogenated ring-opening metathesis polymer according to claim 7 wherein the molar ratio of the structural unit [A] of the general formula [1], the structural unit [B] of the general formula [3] and the structural unit [C] of the general formula [4] to the structural unit [D] of the general formula 5] ([A]+[B]+[C]/[D]) is from 100/0 to 20/80.

9. The hydrogenated ring-opening metathesis polymer according to claim 7 wherein $X^4$ in the general formula [5] represents —O— or —$CH_2$—.

10. The hydrogenated ring-opening metathesis polymer according to claim 7 wherein $W^2$ in the general formula [6] represents a single bond.

11. The hydrogenated ring-opening metathesis polymer according to claim 1 wherein the polymer further contains a structural unit [E] of the following general formula [7]:

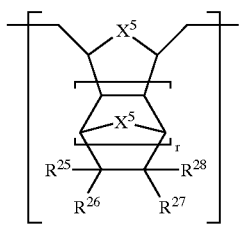

[7]

wherein at least one of $R^{25}$ to $R^{28}$ represents a functional group having a carboxylate group of the following general formula [8]:

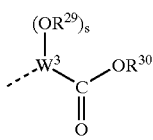

[8]

wherein the chain line represents a connecting means, $R^{28}$ represents a hydrogen atom, a linear, brandied or cyclic alkyl group having 1 to 10 carbon atoms, a linear, branched or cyclic alkoxyalkyl group having 2 to 10 carbon atoms, or a linear, branched or cyclic acyl group having 1 to 10 carbon atom, $R^{30}$ represents a linear or branched alkyl group having 1 to 10 carbon atoms, a linear, branched or cyclic alkoxyalkyl group having 2 to 10 carbon atoms, or a linear, branched or cyclic halogenated alkyl group having 1 to 20 carbon atoms. $W^3$ represents a single bond or a (S+2)-valent hydrocarbon group having 1 to 10 carbon atoms, s represents 0 or 1 and the remaining groups of $R^{25}$ to $R^{28}$ are selected each independently from a hydrogen atom, linear, branched or cyclic alkyl groups having 1 to 20 carbon atoms, halogen atoms, linear, branched or cyclic halogenated alkyl groups having 1 to 20 carbon atoms, linear, branched or cyclic alkoxy groups having 1 to 20 carbon atoms, linear, branched or cyclic alkoxyalkyl groups having 2 to 20 carbon atoms, linear, branched or cyclic alkylcarbonyloxy groups having 2 to 20 carbon atoms, arylcarbonyloxy groups having 6 to 20 carbon atoms, linear, branched or cyclic alkylsulfonyloxy groups having 1 to 20 carbon atoms, arylsulfonyloxy groups having 6 to 20 carbon atoms, linear, branched or cyclic alkoxycarbonyl groups having 2 to 20 carbon atoms, or linear, branched or cyclic alkoxycarbonylalkyl groups having 3 to 20 carbon atoms, and $X^5$s are the same or different and represent —O— or —$CR^{31}_2$— wherein $R^{31}$ represents a hydrogen atom or a linear or branched alkyl group having 1 to 10 carbon atoms, and r represents an integer of 0 or 1 to 3.

12. The hydrogenated ring-opening metathesis polymer according to claim 11 wherein the molar ratio of the structural unit [A] of the general formula [1] the structural unit [B] of the general formula [3] and the structural unit [C] of the general formula [4] to the structural unit [E] of the general formula [7] ([A]+[B]+[C]/[E]) is from 100/0 to 40/60.

13. The hydrogenated ring-opening metathesis polymer according to claim 11 wherein $X^5$ in the general formula [7] represents —O— or —$CH_2$—.

14. The hydrogenated ring-opening metathesis polymer according to claim 11 wherein $W^3$ in the general formula [7] represents a single bond.

15. The hydrogenated ring-opening metathesis polymer according to claim 11 wherein the number-average molecular weight in terms of polystyrene measured by GPC is from 500 to 200,000.

16. A method of producing a hydrogenated ring-opening metathesis polymer of claim 1, comprising polymerizing at least one cyclic olefin monomer of general formula [10] and/or general formula [11] end optionally a cyclic olefin, monomer of general formula [9] with a ring-opening metathesis catalyst, and hydrogenating the resulting polymer in the presence of a hydrogenation catalyst wherein general formula [9] is:

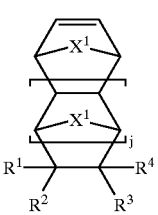

[9]

wherein $R^1$ to $R^4$, $X^1$ and j are as defined in general formula [1], general formula [10] is:

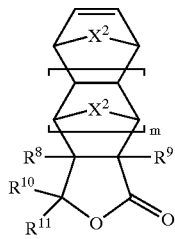

wherein, $R^8$ to $R^{11}$, $X^2$ and m are as defined in the general formula [3] and general formula [11] is:

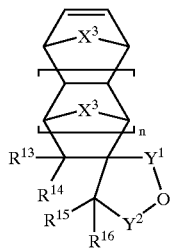

wherein, $R^{13}$ to $R^{16}$, $X^3$, $Y^1$, $Y^2$ and n are as defined in the general formula [4], and wherein at least one or $X^1$ in the general formula [9], $X^2$ in the general formula [10] and $X^3$ in the general formula [11] represents —O—.

17. The production method according to claim 16 wherein the charging molar ratio of a cyclic olefin monomer of the general formula [9] to a cyclic olefin monomer of the general formula [10] and a cyclic olefin monomer of the general formula [11] is from 0/100 to 99/1.

18. The production method according to claim 16 wherein the charging molar ratio of a cyclic olefin monomer of the general formula [9] to a cyclic olefin monomer of the general formula [10] and a cyclic olefin monomer of the general formula [11] is from 25/75 to 90/10.

19. The production method according to claim 16, wherein at least one $X^1$ in a cyclic olefin monomer of the general formula [9], $X^2$ in a cyclic olefin monomer of the general formula [10] and $X^3$ in a cyclic olefin monomer of the general formula [11] represents —O—, and the others represent —$CH_2$—.

20. The production method according to claim 16 wherein a functional group having a tertiary ester group of a cyclic alkyl of the general formula [2] selected as at least one of $R^1$ to $R^4$ in the general formula [9] is a 1-alkylcyclopentyl ester, 1-alkylnorbornyl ester or 2-alkyl-2-adamantyl ester.

21. The production method according to claim 16 wherein at least part of a tertiary ester group of a cyclic alkyl in the general formula [2] is decomposed, after hydrogenation, into a carboxyl group.

22. The production method according to claim 16 wherein the method further polymerizes a cyclic olefin monomer of the following general formula [12]:

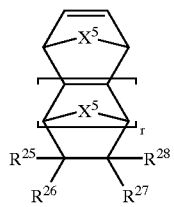

wherein, $R^{25}$ to $R^{28}$, $X^5$ and r are as defined in the general formula [7].

23. The production method according to claim 22 wherein at least part of an ester group is decomposed, after hydrogenation, into a carboxyl group.

24. The production method according to claim 16 wherein the ring-opening metathesis catalyst is a living ring-opening metathesis catalyst.

25. The production method according to claim 16 wherein polymerization is conducted with a living ring-opening metathesis catalyst in the presence of an olefin or diene.

* * * * *